(12) United States Patent
Shimabukuro et al.

(10) Patent No.: US 10,546,870 B2
(45) Date of Patent: Jan. 28, 2020

(54) THREE-DIMENSIONAL MEMORY DEVICE CONTAINING OFFSET COLUMN STAIRS AND METHOD OF MAKING THE SAME

(71) Applicant: SANDISK TECHNOLOGIES LLC, Plano, TX (US)

(72) Inventors: Seiji Shimabukuro, Yokkaichi (JP); Kensuke Yamaguchi, Yokkaichi (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/956,139

(22) Filed: Apr. 18, 2018

(65) Prior Publication Data

US 2019/0221574 A1 Jul. 18, 2019

Related U.S. Application Data

(60) Provisional application No. 62/618,967, filed on Jan. 18, 2018.

(51) Int. Cl.
*H01L 27/11578* (2017.01)
*H01L 29/792* (2006.01)
(Continued)

(52) U.S. Cl.
CPC ........ *H01L 27/11578* (2013.01); *G11C 16/04* (2013.01); *H01L 27/1052* (2013.01);
(Continued)

(58) Field of Classification Search
None
See application file for complete search history.

(56) References Cited

U.S. PATENT DOCUMENTS 5,915,167 A   6/1999 Leedy
7,952,136 B2  5/2011 Kito et al.
(Continued)

FOREIGN PATENT DOCUMENTS

EP      3021360 A      5/2016
JP      2012-119478 A1 6/2012
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Telly D Green
(74) *Attorney, Agent, or Firm* — The Marbury Law Group, PLLC

(57) ABSTRACT

A three-dimensional NAND memory string includes an alternating stack of insulating layers and word line layers extending in a word line direction, a memory array region in the alternating stack containing memory stack structures, a group of more than two column stairs located in the alternating stack and extending in the word line direction from one side of the memory array region, and bit lines electrically contacting the vertical semiconductor channels and extending in a bit line direction which is perpendicular to the word line direction. Each column stair of the group of N column stairs has a respective step in a first vertical plane which extends in the bit line direction, and the respective steps in the first vertical plane decrease and then increase from one end column stair to another end column stair.

14 Claims, 57 Drawing Sheets

(51) Int. Cl.
  *H01L 27/11551* (2017.01)
  *G11C 16/04* (2006.01)
  *H01L 27/1157* (2017.01)
  *H01L 27/11543* (2017.01)
  *H01L 27/105* (2006.01)

(52) U.S. Cl.
  CPC .... *H01L 27/1157* (2013.01); *H01L 27/11543* (2013.01); *H01L 27/11551* (2013.01); *H01L 29/7926* (2013.01)

(56) References Cited

U.S. PATENT DOCUMENTS

| | | | |
|---|---|---|---|
| 8,187,932 B2 | 5/2012 | Nguyen et al. | |
| 8,284,601 B2 | 10/2012 | Son et al. | |
| 8,394,716 B2 | 3/2013 | Hwang et al. | |
| 8,520,425 B2 | 8/2013 | Xiao et al. | |
| 8,884,357 B2 | 11/2014 | Wang et al. | |
| 8,946,023 B2 | 2/2015 | Makala et al. | |
| 9,230,987 B2 | 1/2016 | Pachamuthu et al. | |
| 9,343,507 B2 | 5/2016 | Takaki et al. | |
| 9,356,034 B1 | 5/2016 | Yada et al. | |
| 9,449,924 B2 | 9/2016 | Takaki | |
| 9,502,429 B2 | 11/2016 | Hironaga | |
| 9,515,023 B2 | 12/2016 | Tobitsuka et al. | |
| 9,583,539 B2 | 2/2017 | Takaki | |
| 9,646,989 B1* | 5/2017 | Yoshimizu | H01L 27/11578 |
| 9,806,093 B2* | 10/2017 | Toyama | H01L 27/11524 |
| 9,818,693 B2* | 11/2017 | Toyama | H01L 27/11524 |
| 9,818,759 B2* | 11/2017 | Kai | H01L 27/11524 |
| 9,905,573 B1 | 2/2018 | Mada et al. | |
| 9,917,093 B2* | 3/2018 | Chu | H01L 27/11565 |
| 9,984,963 B2* | 5/2018 | Peri | H01L 23/5226 |
| 10,038,006 B2* | 7/2018 | Furihata | H01L 27/11524 |
| 10,050,054 B2* | 8/2018 | Zhang | H01L 27/11582 |
| 10,103,161 B2* | 10/2018 | Ito | H01L 27/11582 |
| 10,115,459 B1* | 10/2018 | Yamada | G11C 13/0002 |
| 10,128,261 B2* | 11/2018 | Makala | H01L 27/11578 |
| 10,141,331 B1* | 11/2018 | Susuki | H01L 27/11582 |
| 2008/0101664 A1 | 5/2008 | Perez | |
| 2008/0149913 A1 | 6/2008 | Tanaka et al. | |
| 2009/0182449 A1 | 7/2009 | Frei et al. | |
| 2009/0230449 A1 | 9/2009 | Sakaguchi et al. | |
| 2010/0090188 A1 | 4/2010 | Futatsuyama | |
| 2010/0207186 A1 | 8/2010 | Higashi et al. | |
| 2010/0219560 A1 | 9/2010 | Campbell | |
| 2010/0254191 A1 | 10/2010 | Son et al. | |
| 2012/0132983 A1 | 5/2012 | Fukuzumi | |
| 2012/0195128 A1 | 8/2012 | Fujiwara et al. | |
| 2012/0256247 A1 | 10/2012 | Alsmeier | |
| 2013/0130468 A1 | 5/2013 | Higashitani et al. | |
| 2013/0270714 A1 | 10/2013 | Lee et al. | |
| 2013/0279257 A1 | 10/2013 | Costa et al. | |
| 2014/0027838 A1 | 1/2014 | Kido et al. | |
| 2014/0054787 A1 | 2/2014 | Eun et al. | |
| 2014/0264898 A1 | 9/2014 | Hu et al. | |
| 2014/0284675 A1 | 9/2014 | Watanabe | |
| 2014/0300597 A1 | 10/2014 | Holcomb | |
| 2015/0061068 A1 | 3/2015 | Akutsu et al. | |
| 2015/0170748 A1 | 6/2015 | Costa et al. | |
| 2015/0179577 A1 | 6/2015 | Tobitsuka et al. | |
| 2015/0179659 A1 | 6/2015 | Takaki et al. | |
| 2015/0179662 A1* | 6/2015 | Makala | H01L 27/11578 257/314 |
| 2015/0325587 A1* | 11/2015 | Chen | H01L 27/11582 257/314 |
| 2016/0111361 A1 | 4/2016 | Oh et al. | |
| 2016/0147973 A1 | 5/2016 | Holcomb | |
| 2016/0148835 A1 | 5/2016 | Shimabukuro et al. | |
| 2016/0204117 A1 | 7/2016 | Liu et al. | |
| 2016/0300885 A1 | 10/2016 | Konevecki et al. | |
| 2016/0322376 A1 | 11/2016 | Lee | |
| 2016/0351497 A1* | 12/2016 | Peri | H01L 23/5226 |
| 2017/0077139 A1 | 3/2017 | Iguchi | |
| 2017/0125437 A1* | 5/2017 | Pachamuthu | H01L 27/11582 |
| 2017/0125438 A1* | 5/2017 | Pachamuthu | H01L 27/11582 |
| 2017/0148809 A1* | 5/2017 | Nishikawa | H01L 23/528 |
| 2017/0179026 A1* | 6/2017 | Toyama | H01L 27/11524 |
| 2017/0179151 A1* | 6/2017 | Kai | H01L 27/11524 |
| 2017/0179152 A1* | 6/2017 | Toyama | H01L 27/11524 |
| 2017/0179153 A1* | 6/2017 | Ogawa | H01L 27/11524 |
| 2017/0179154 A1* | 6/2017 | Furihata | H01L 27/11524 |
| 2017/0207236 A1* | 7/2017 | Kitamura | H01L 27/11582 |
| 2017/0236746 A1* | 8/2017 | Yu | H01L 27/1157 257/314 |
| 2017/0236896 A1* | 8/2017 | Lu | H01L 29/0649 257/314 |
| 2017/0243650 A1 | 8/2017 | Ogawa et al. | |
| 2017/0243879 A1* | 8/2017 | Yu | H01L 21/0214 |
| 2017/0287925 A9* | 10/2017 | Makala | H01L 27/11578 |
| 2017/0352669 A1* | 12/2017 | Sharangpani | H01L 27/1157 |
| 2017/0352678 A1* | 12/2017 | Lu | H01L 21/4846 |
| 2017/0358593 A1* | 12/2017 | Yu | H01L 23/5226 |
| 2017/0358594 A1* | 12/2017 | Lu | H01L 27/11582 |
| 2017/0373078 A1* | 12/2017 | Chu | H01L 27/11565 |
| 2017/0373087 A1* | 12/2017 | Ito | H01L 27/11582 |
| 2018/0019256 A1* | 1/2018 | Amano | H01L 27/11582 |
| 2018/0033646 A1* | 2/2018 | Sharangpani | H01L 27/1157 |
| 2018/0090373 A1* | 3/2018 | Sharangpani | H01L 21/76865 |
| 2018/0097009 A1* | 4/2018 | Zhang | H01L 27/11582 |
| 2018/0102281 A1 | 4/2018 | Yang | |
| 2018/0342531 A1* | 11/2018 | Susuki | H01L 27/11582 |
| 2019/0006383 A1* | 1/2019 | Matsuno | H01L 27/11582 |

FOREIGN PATENT DOCUMENTS

| | | |
|---|---|---|
| KR | 20100109745 A | 10/2010 |
| KR | 20110021444 A | 3/2011 |

OTHER PUBLICATIONS

Invitation to Pay Additional Fees and Search Report from the European Patent Office received in connection with International Application No. PCT/US2014/071397; dated Mar. 26, 2015.
International Search Report for PCT/US2014/071397, dated Mar. 18, 2015 (5 pages).
Written Opinion of the International Searching Authority for PCT/US2014/071397, dated Mar. 18, 2015 (11 pages).
International Preliminary Report on Patentability for International Application No. PCT/US2014/071397, 12 pages, dated Jun. 21, 2016.
Non-Final Office Action for corresponding U.S. Appl. No. 14/643,211, filed Mar. 10, 2015, dated Apr. 4, 2016, containing 22 pages.
International Search Report and Written Opinion of the International Searching Authority for International Patent Application No. PCT/US2017/063075, dated Mar. 8, 2018, 18 pages.
U.S. Appl. No. 15/251,374, filed Aug. 30, 2016, SanDisk Technologies LLC.
U.S. Appl. No. 15/367,791, filed Dec. 2, 2016, SanDisk Technologies LLC.
U.S. Appl. No. 15/451,773, filed Mar. 7, 2017, SanDisk Technologies LLC.
U.S. Appl. No. 15/632,703, filed Jun. 26, 2017, SanDisk Technologies LLC.
U.S. Appl. No. 15/805,599, filed Nov. 7, 2017, SanDisk Technologies LLC.
U.S. Appl. No. 15/950,356, filed Apr. 11, 2018, SanDisk Technologies LLC.

* cited by examiner

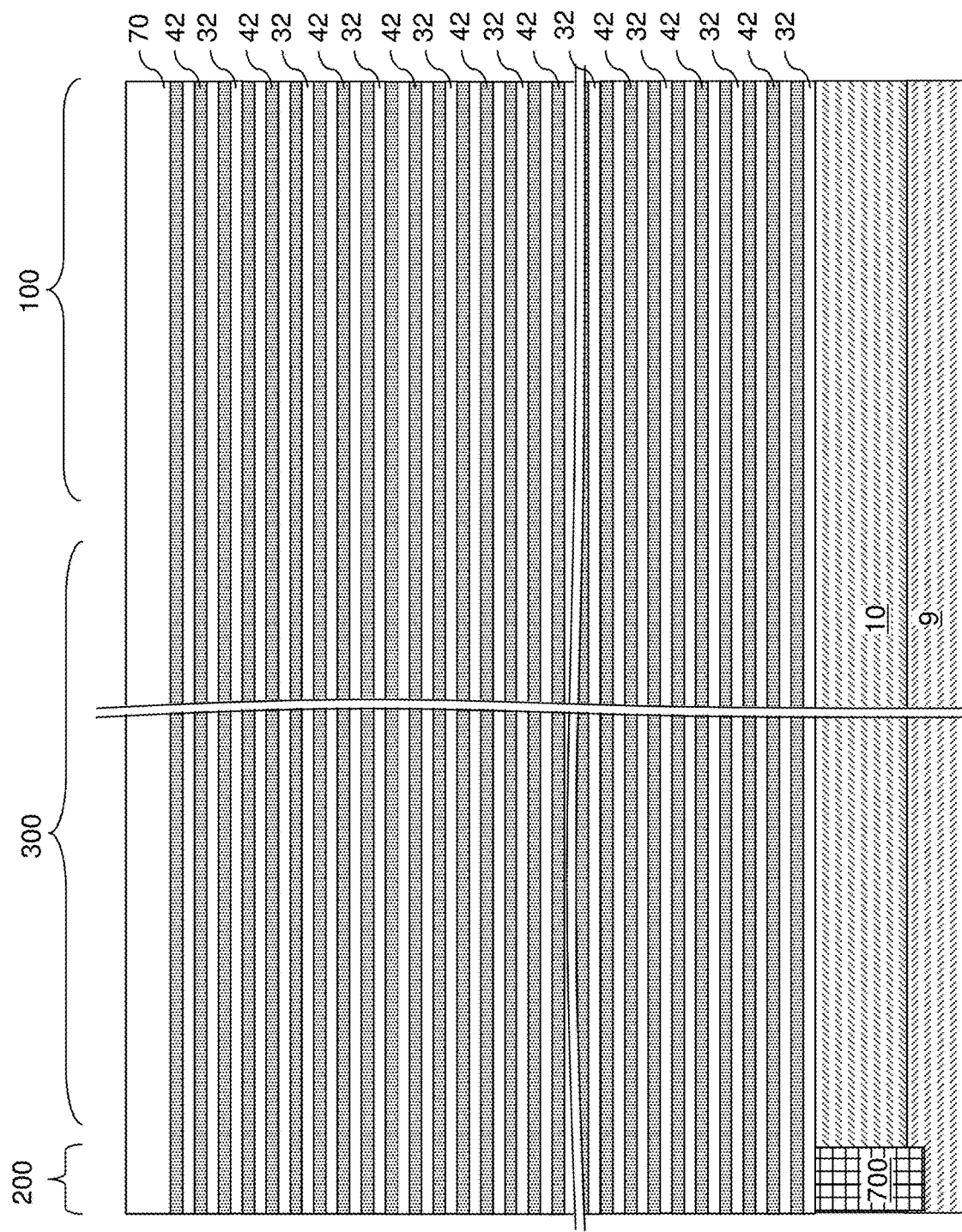

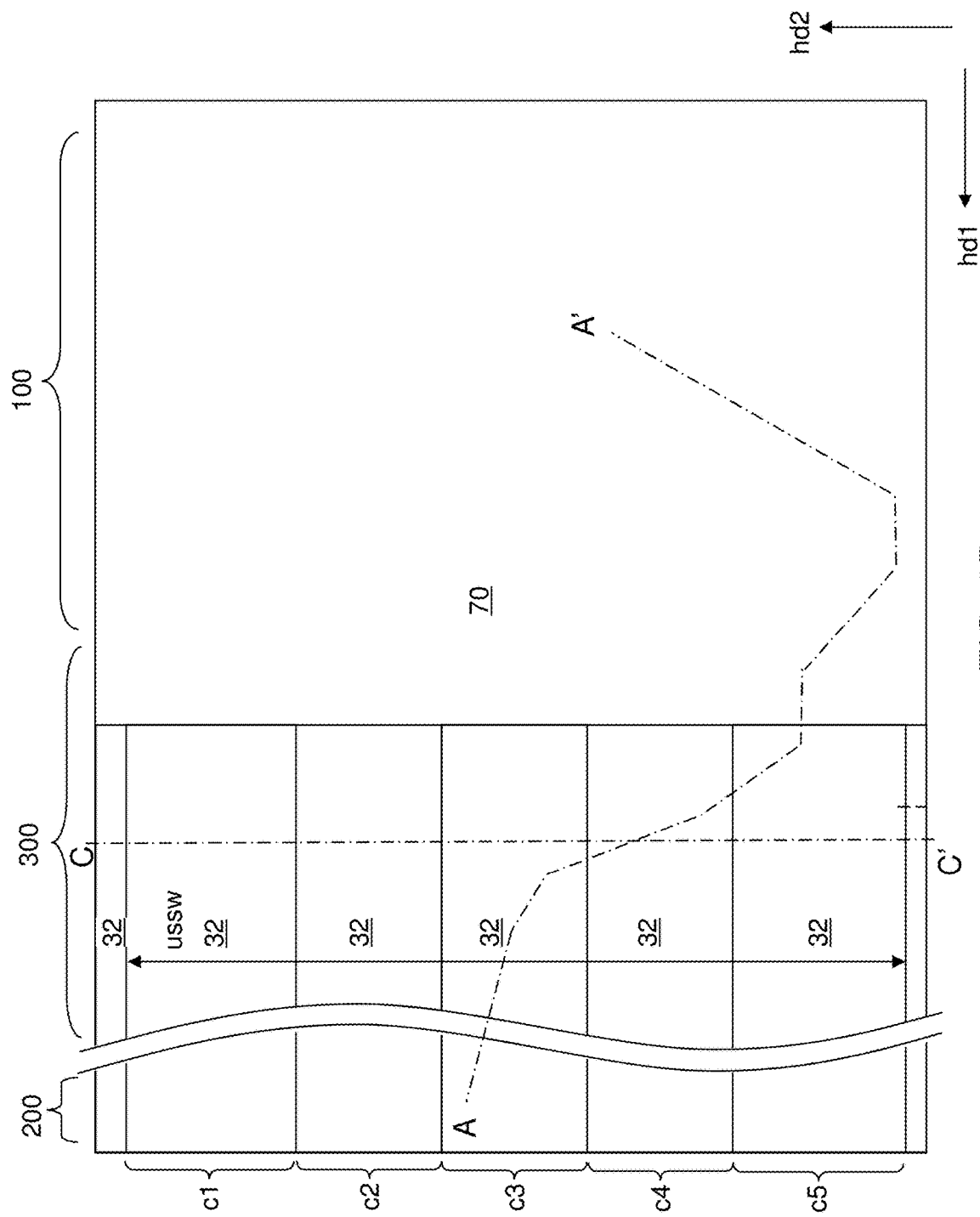

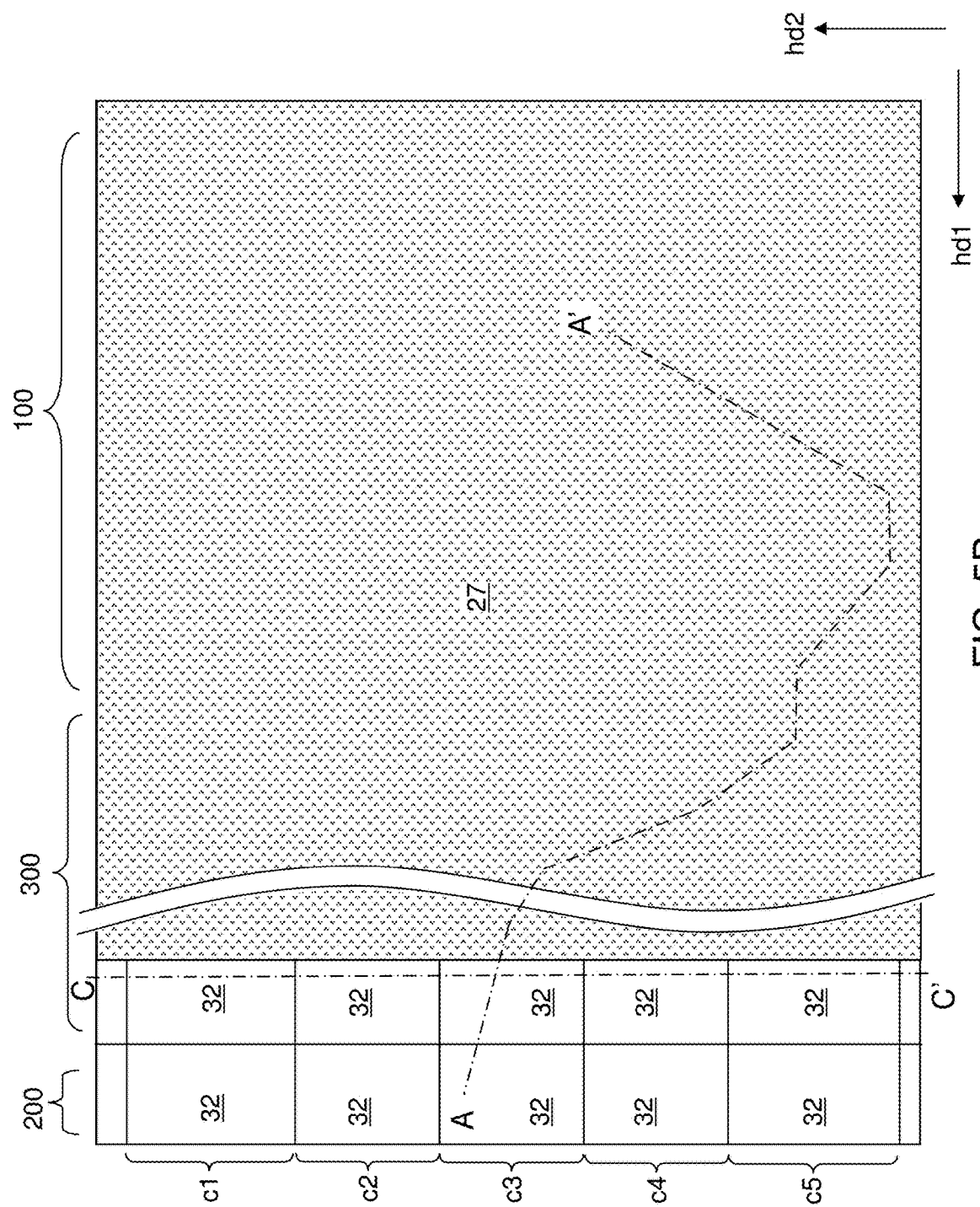

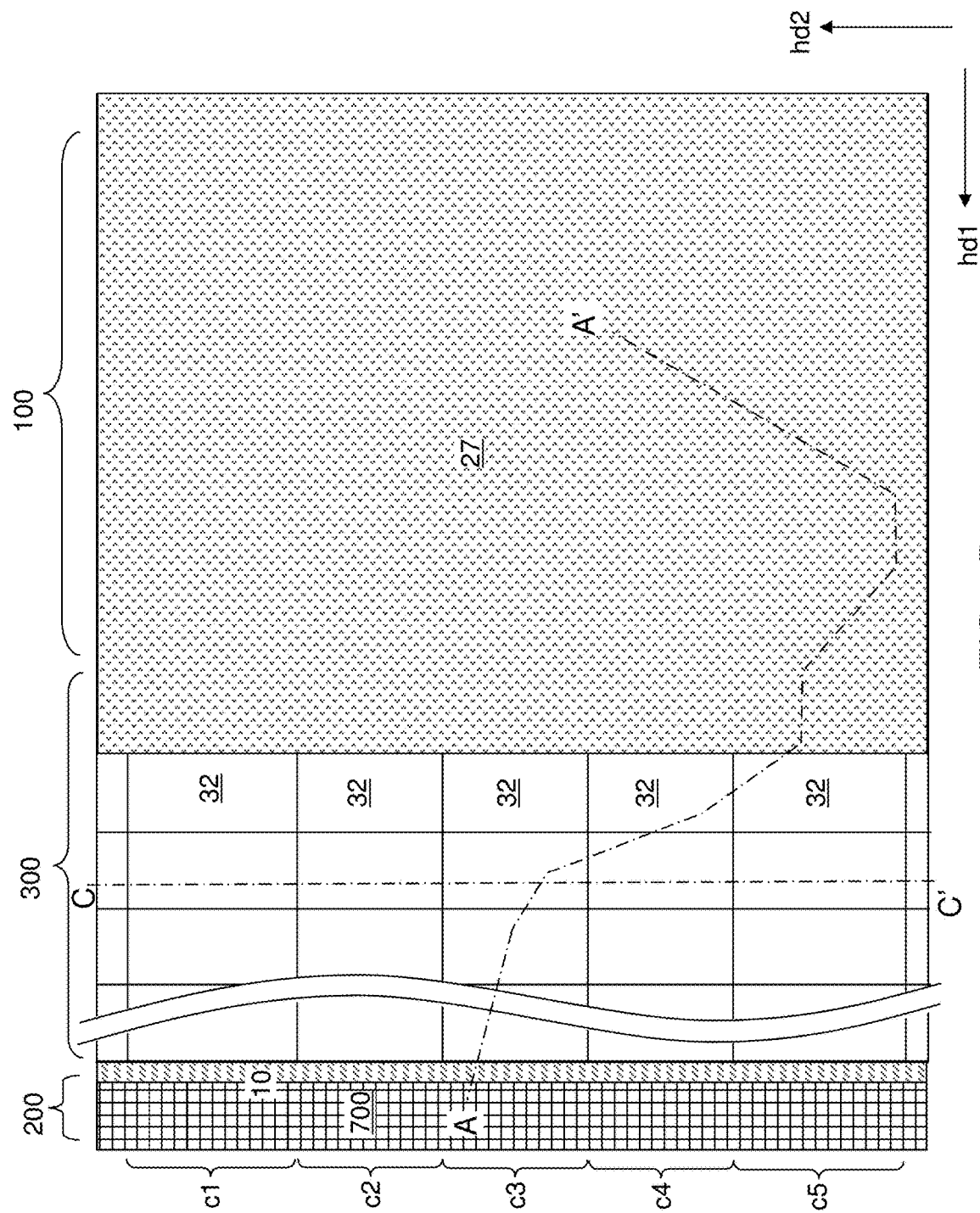

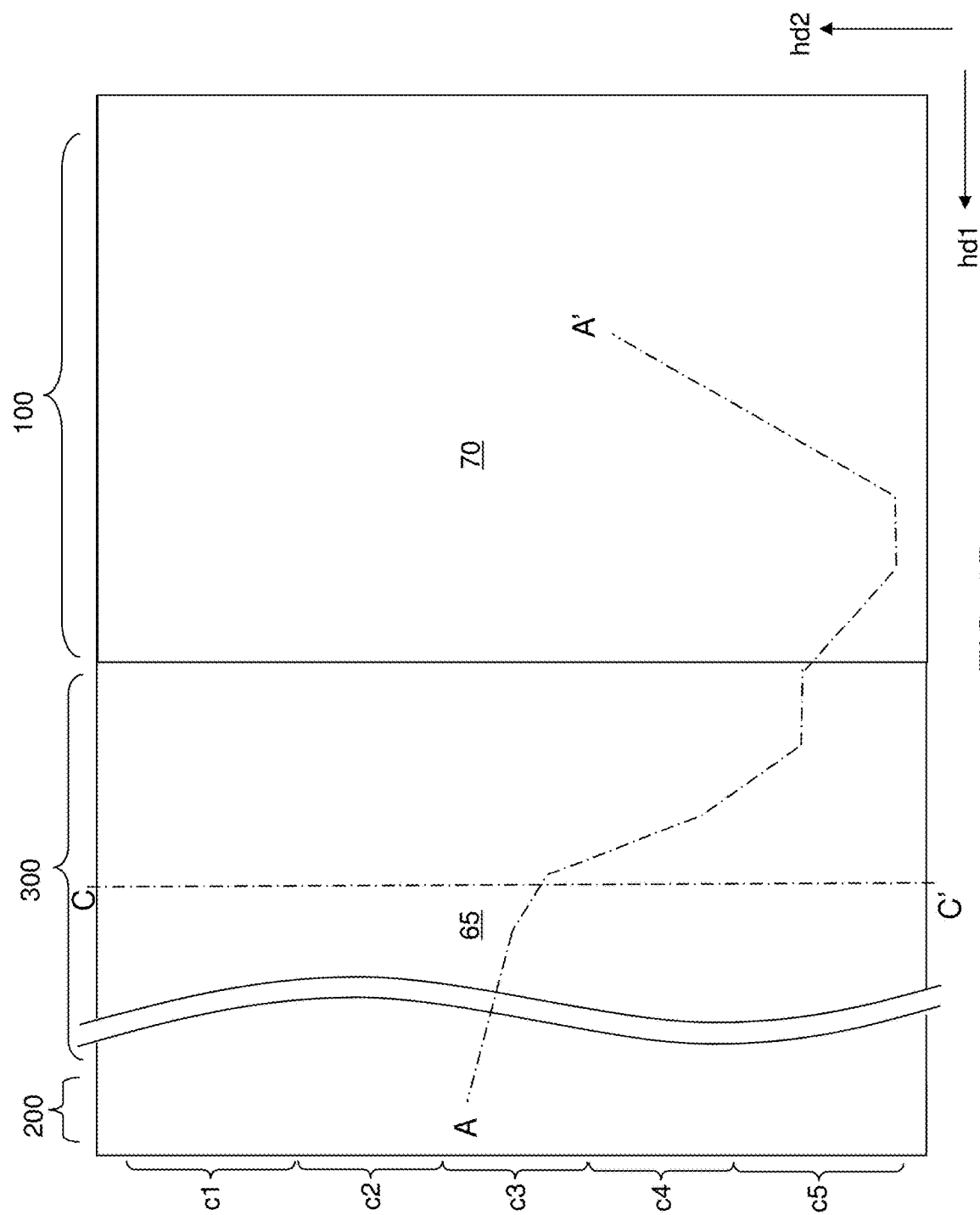

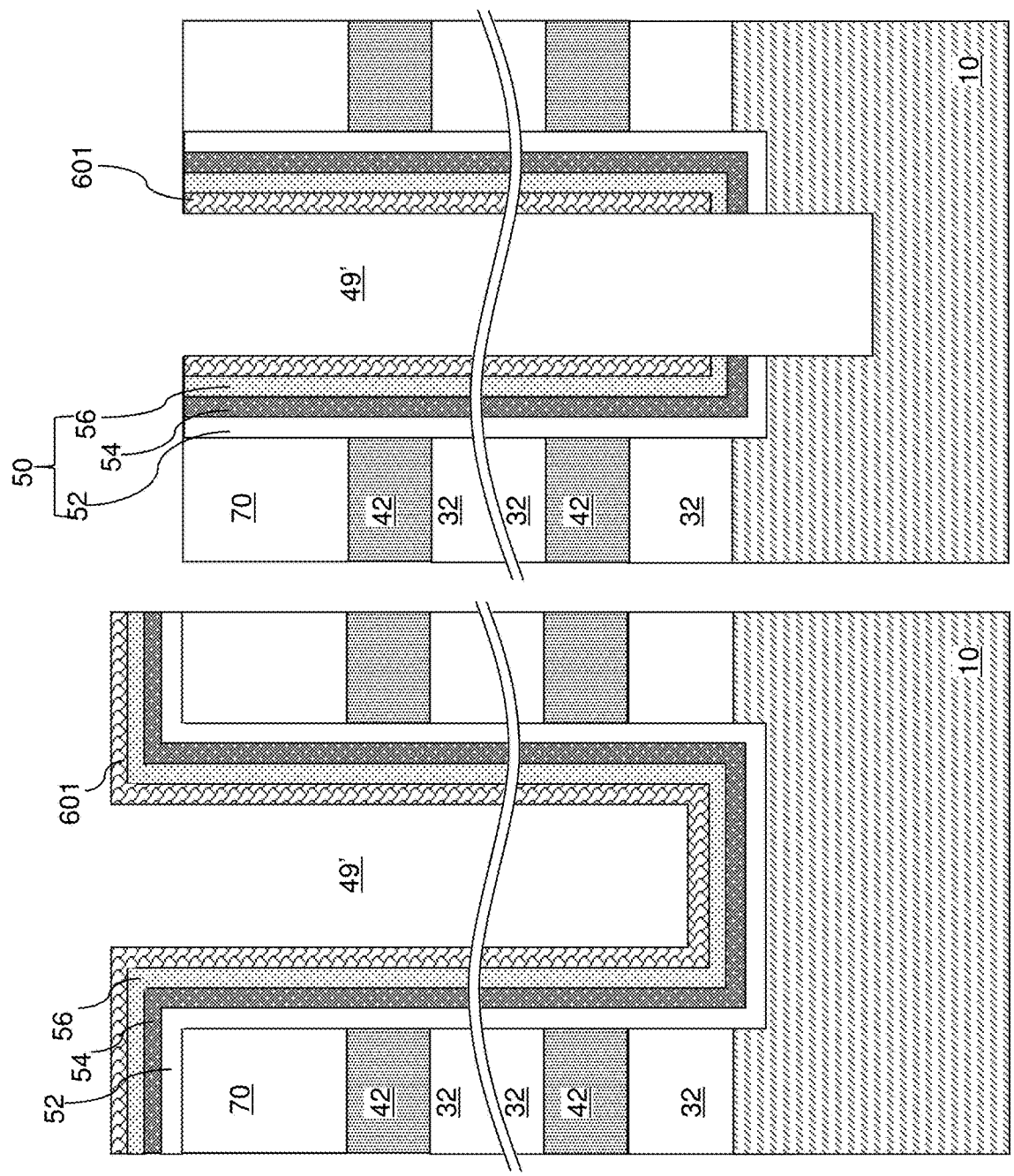

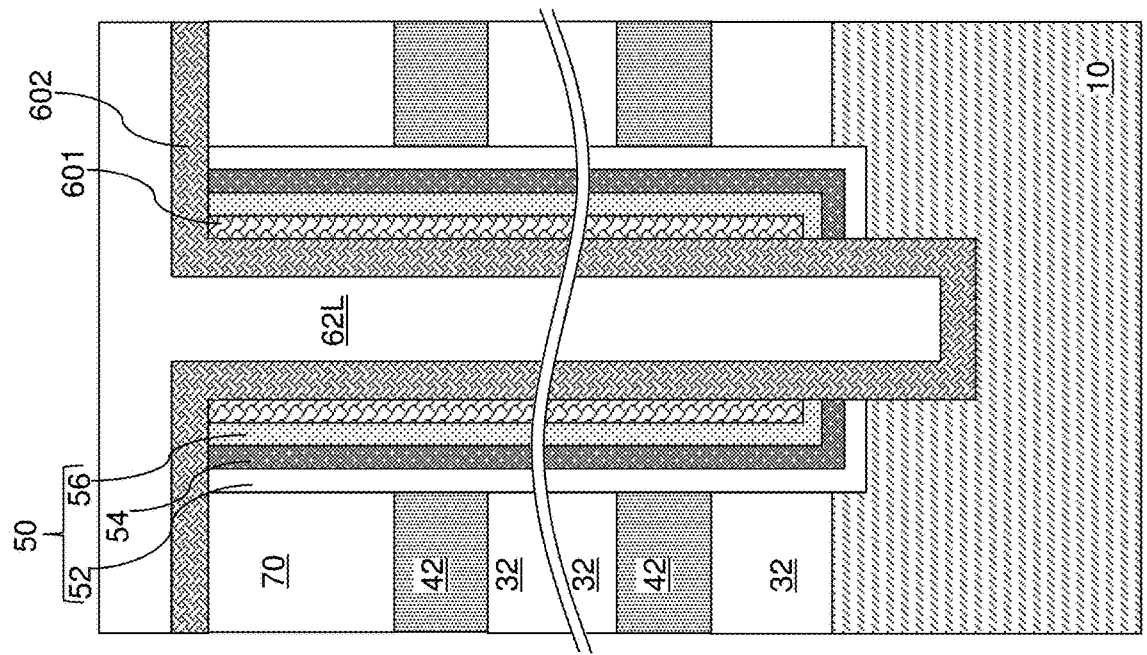
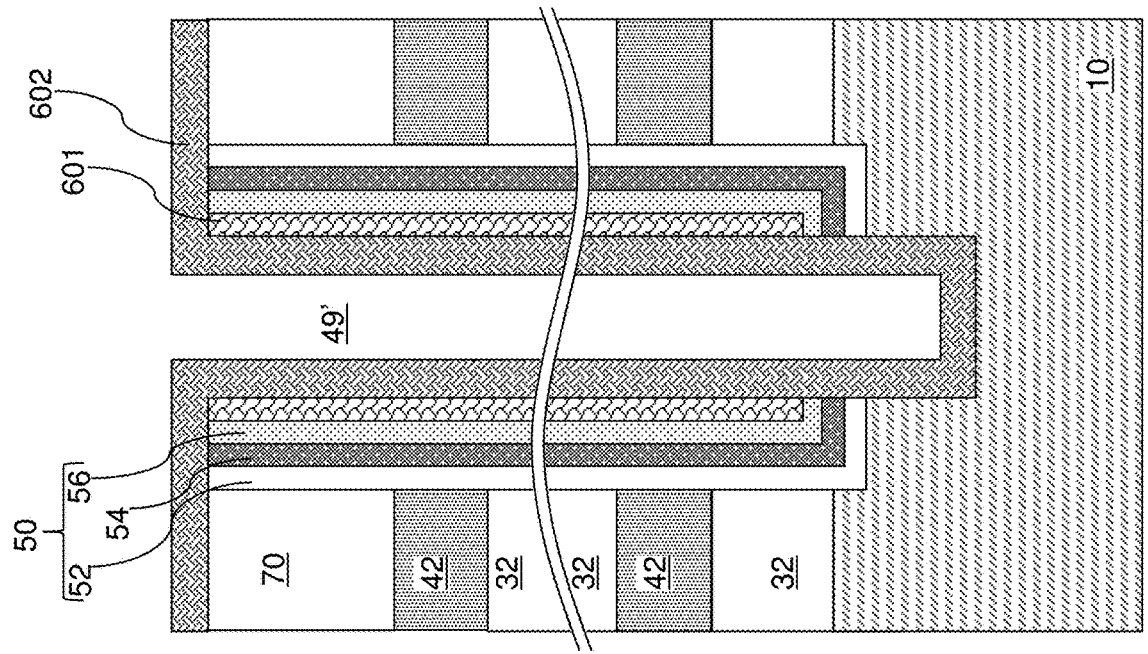

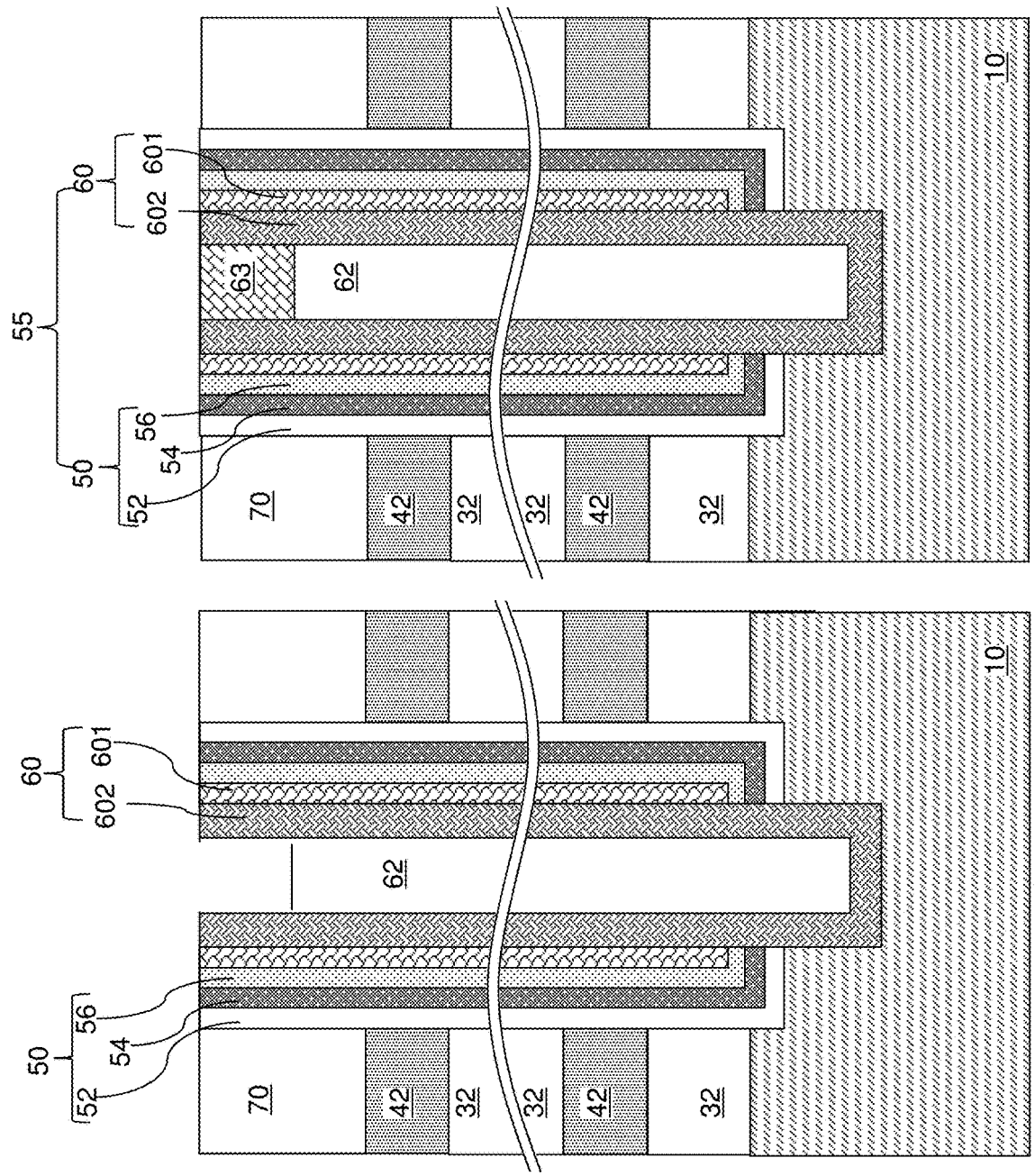

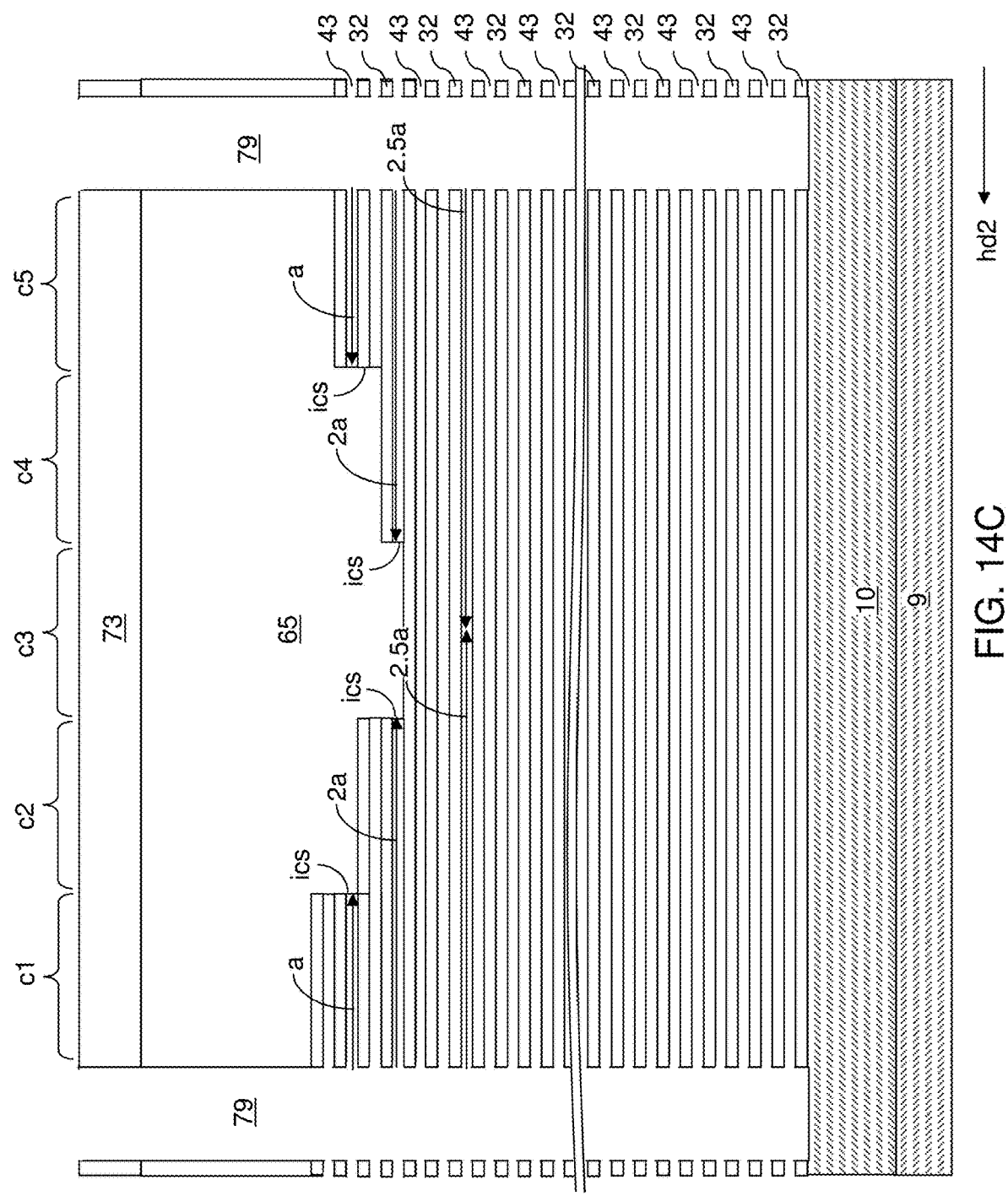

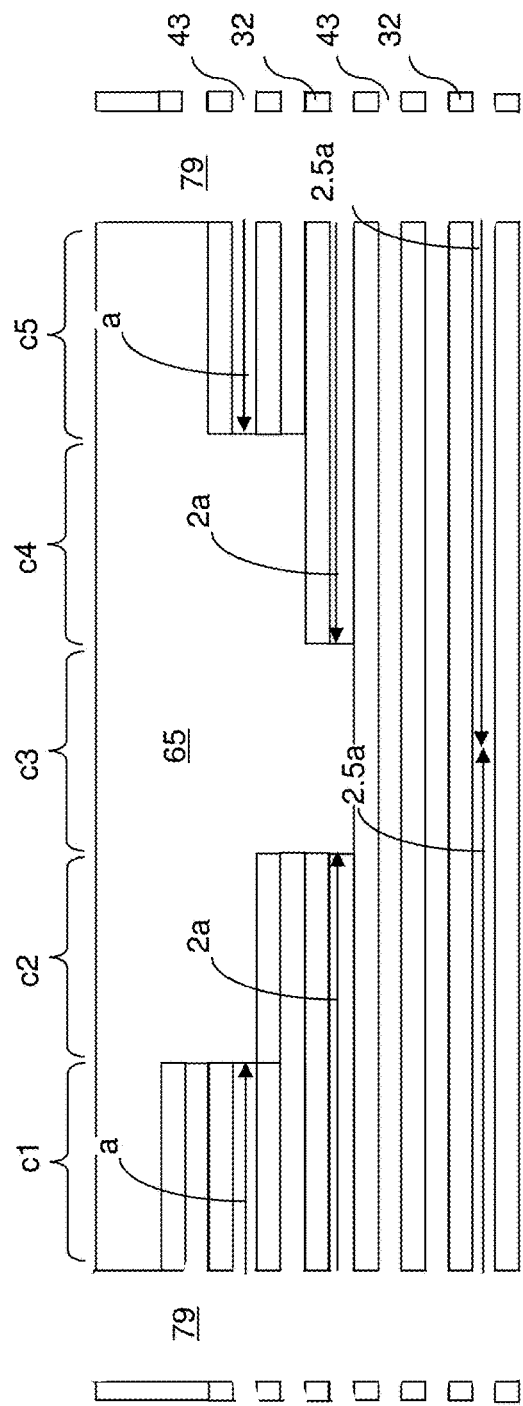
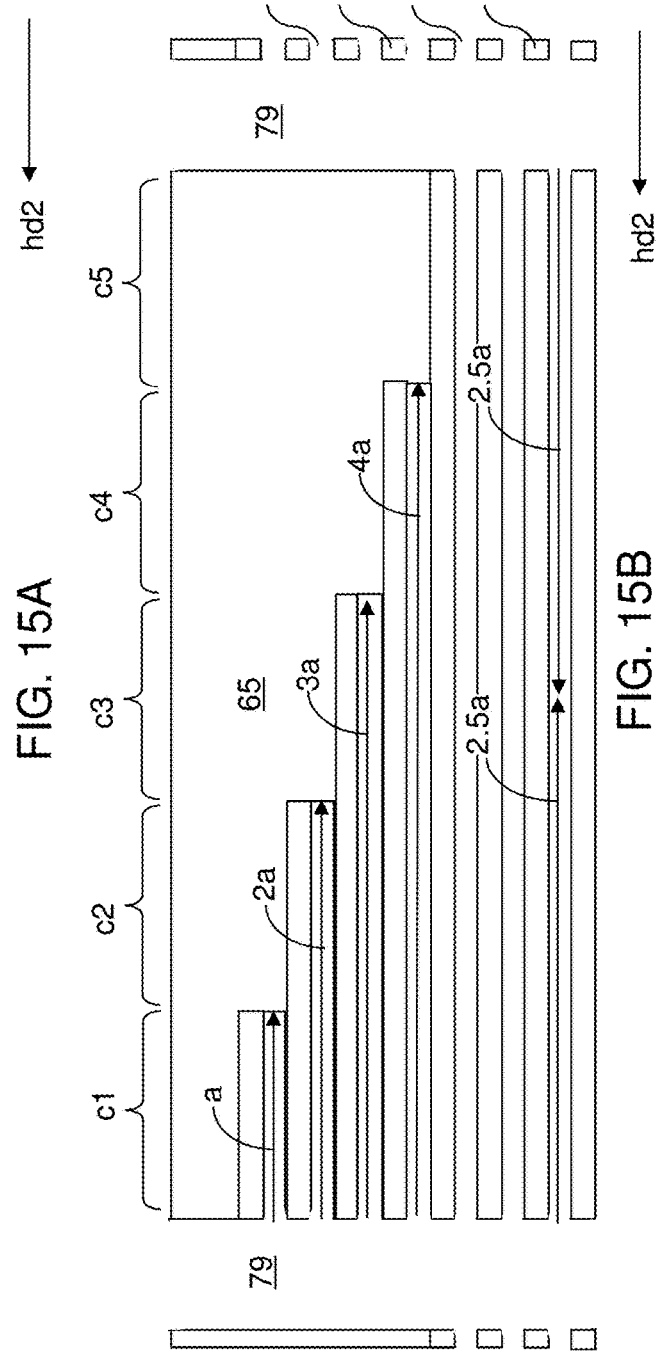
FIG. 15A
FIG. 15B

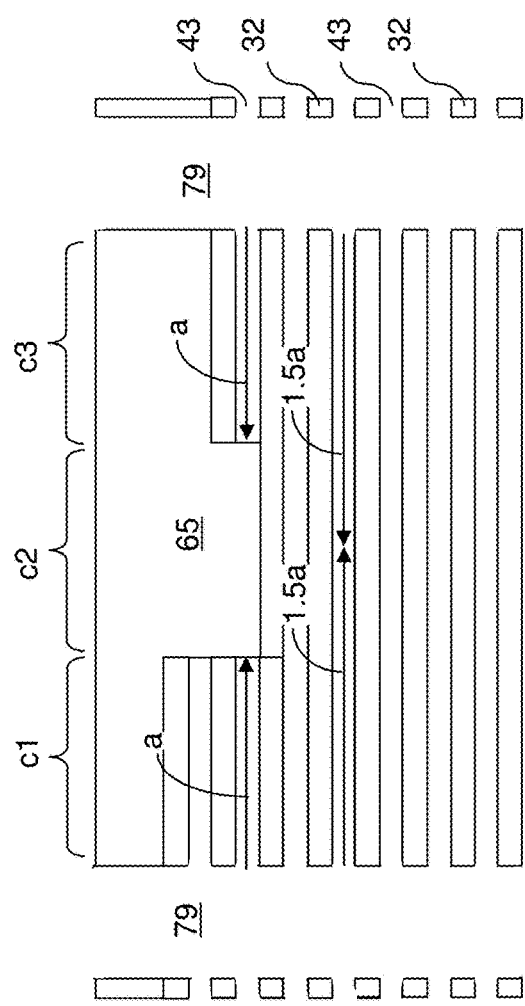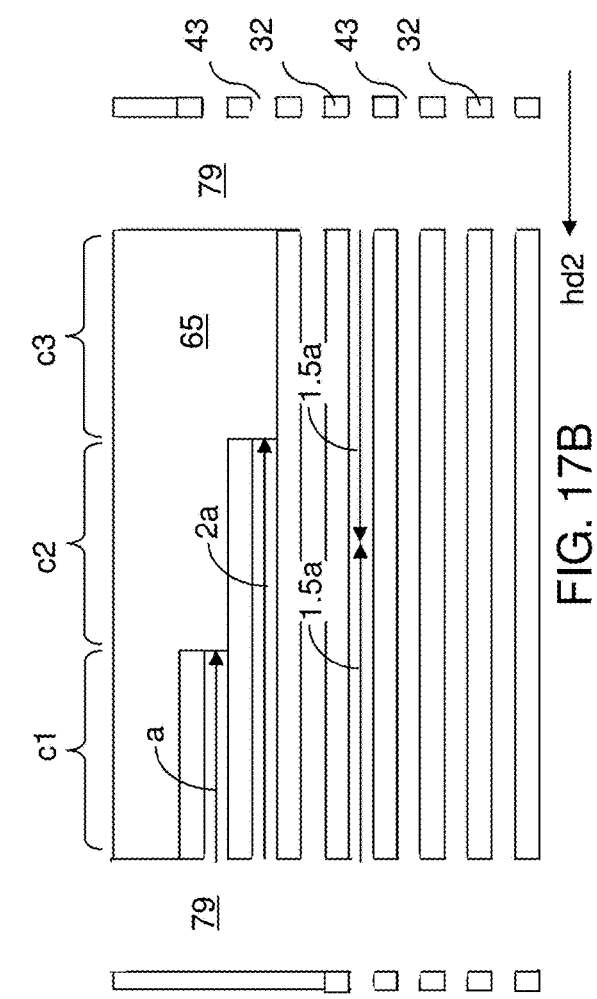
FIG. 17A
FIG. 17B

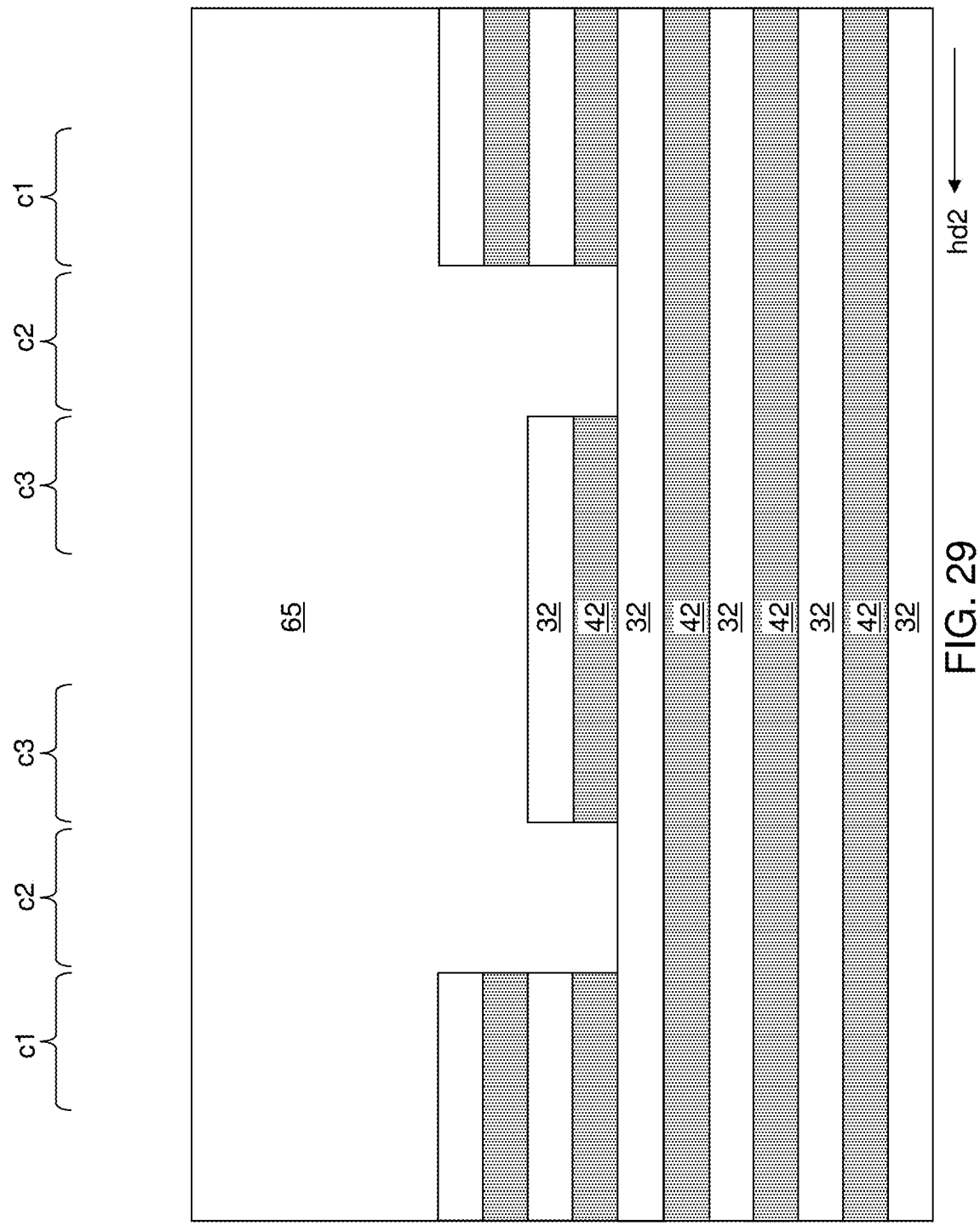

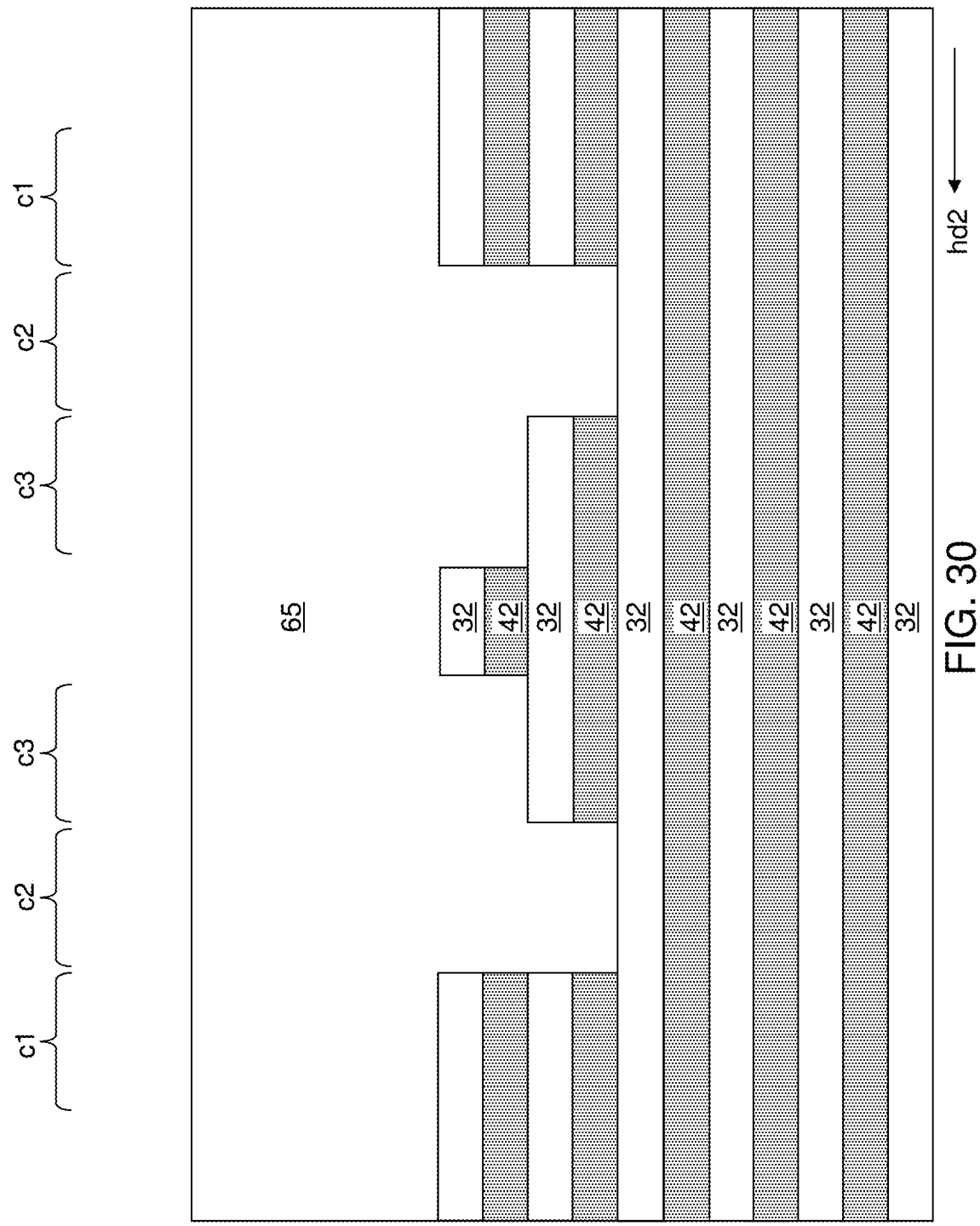

THREE-DIMENSIONAL MEMORY DEVICE CONTAINING OFFSET COLUMN STAIRS AND METHOD OF MAKING THE SAME

FIELD

The present disclosure relates generally to the field of semiconductor devices, and particular to a three-dimensional memory device containing offset column stairs and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and word line layers extending in a word line direction, a memory array region in the alternating stack containing memory stack structures, a group of more than two column stairs located in the alternating stack and extending in the word line direction from one side of the memory array region, and bit lines electrically contacting the vertical semiconductor channels and extending in a bit line direction which is perpendicular to the word line direction. The alternating stack containing the memory array region comprises a NAND memory string. Each column stair of the group of N column stairs has a respective step in a first vertical plane which extends in the bit line direction, and the respective steps in the first vertical plane decrease and then increase from one end column stair to another end column stair.

According to another aspect of the present disclosure, a three-dimensional memory device comprises trenches that extend in a first horizontal direction, alternating stacks of insulating layers and electrically conductive layers located over a substrate, wherein the alternating stacks are laterally spaced among one another by the trenches, and groups of memory stack structures, wherein each group of memory stack structures vertically extends through a respective one of the alternating stacks between a respective neighboring pair of trenches, and each of the memory stack structures includes a memory film and a vertical semiconductor channel laterally surrounded by the memory film. Each alternating stack includes a group of N column stairs, N being an integer greater than two. Each column stair within each group of N column stairs has a respective set of intra-column stepped surfaces that continuously extend from a bottommost layer to a topmost layer within each alternating stack with stepwise height increases along the first horizontal direction. Column stairs within each group of N column stairs of a respective alternating stack are located between the respective neighboring pair of trenches including a respective first trench and a respective second trench that border the respective alternating stack. Top surfaces of each group of N column stairs have vertical cross-sectional profiles along vertical cross-sectional planes that are perpendicular to the first horizontal direction, each of the vertical cross-sectional profiles include both a stepwise decreasing profile and a stepwise increasing profile.

According to another aspect of the present disclosure, a method of forming a three-dimensional memory device comprises forming a vertically alternating sequence of continuous insulating layers and continuous sacrificial material layers over a substrate, and forming vertically offset surfaces in a contact region of the vertically alternating sequence, wherein the vertically offset surfaces laterally extend along a first horizontal direction along a second horizontal direction that is perpendicular to the first horizontal direction, wherein the vertically offset surfaces are formed at N different horizontal planes that are vertically spaced apart among one another by a thickness of a respective neighboring pair of a continuous insulating layer and a continuous sacrificial material layer, and a sequence of the vertically offset surfaces along the second horizontal direction is selected such that the vertically offset surfaces have a vertical cross-sectional profile along the second horizontal direction which contains both a stepwise decreasing profile and a stepwise increasing profile. The method further comprises patterning the vertically offset surfaces into column stairs, wherein each column stair continuously extends from a bottommost layer to a topmost layer within the vertically alternating sequence, forming groups of memory stack structures through the vertically alternating sequence in a memory array region, wherein each of the memory stack structures includes a memory film and a vertical semiconductor channel laterally surrounded by the memory film, forming trenches through the alternating stack along the first horizontal direction, forming backside recesses by removing remaining portions of the continuous sacrificial material layers through the trenches; and forming electrically conductive layer in the backside recesses.

BRIEF DESCRIPTION OF THE DRAWINGS

FIG. 2 is a schematic vertical cross-sectional view of the exemplary structure after formation of an alternating stack of insulating layers and sacrificial material layers according to an embodiment of the present disclosure.

FIG. 3B is a top-down view of the exemplary structure of FIG. 3A. The vertical plane A-A' is the plane of the cross-section for FIG. 3A.

FIG. 5B is a top-down view of the exemplary structure of FIG. 5A. The vertical plane A-A' is the plane of the cross-section for FIG. 5A.

FIG. 7B is a top-down view of the exemplary structure of FIG. 7A. The vertical plane A-A' is the plane of the cross-section for FIG. 7A.

FIG. 8B is a top-down view of the exemplary structure of FIG. 8A. The vertical plane A-A' is the plane of the cross-section for FIG. 8A.

FIGS. 11A-11F are sequential schematic vertical cross-sectional views of a memory opening within the exemplary structure during formation of a memory stack structure, an optional dielectric core, and a drain region therein according to an embodiment of the present disclosure.

FIG. 14C is a vertical cross-sectional view along the vertical plane C-C' in FIG. 14B.

FIG. 15A is a schematic vertical cross-sectional view of a first configuration of the exemplary structure after formation of backside recesses according to an embodiment of the present disclosure.

FIG. 15B is a schematic vertical cross-sectional view of a first comparative exemplary structure after formation of backside recesses.

FIG. 17A is a schematic vertical cross-sectional view of a third configuration of the exemplary structure after formation of backside recesses according to an embodiment of the present disclosure.

FIG. 17B is a schematic vertical cross-sectional view of a third comparative exemplary structure after formation of backside recesses.

FIG. 29 is a vertical cross-sectional view of the exemplary structure after formation of the retro-stepped dielectric material portion at the processing steps of FIGS. 9A and 9B.

FIG. 30 is a vertical cross-sectional view of an alternative configuration of the exemplary structure after formation of the retro-stepped dielectric material portion at the processing steps of FIGS. 9A and 9B.

DETAILED DESCRIPTION

Figure 1:
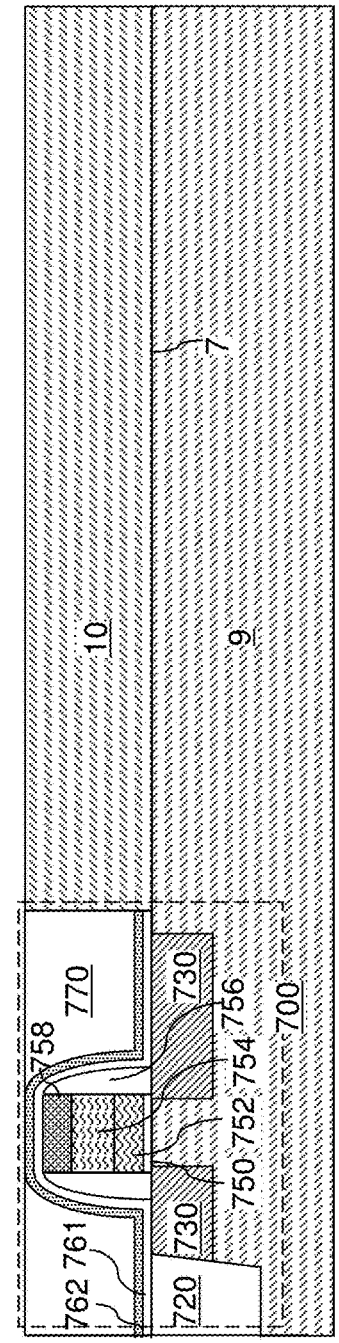
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device employing offset column stairs for providing efficient backside recess formation and metal fill-back and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Referring to FIG. 2, a stack of a vertically alternating sequence of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating sequence of first elements and second elements refers to a structure in which instances of the first elements and instances of the second elements alternate. Each instance of the first elements that is not an end element of the vertically alternating sequence is adjoined by two instances of the second elements on both sides, and each instance of the second elements that is not an end element of the vertically alternating sequence is adjoined by two instances of the first elements on both ends. The first elements may have the same thickness thereamongst, or may have different thicknesses. The second elements may have the same thickness thereamongst, or may have different thicknesses. The vertically alternating sequence of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the vertically alternating sequence.

Each first material layer includes a first material, and each second material layer includes a second material that is different from the first material. In one embodiment, each first material layer can be an insulating layer 32, and each second material layer can be a sacrificial material layer. In this case, the vertically alternating sequence of insulating layers 32 and sacrificial material layers 42 is provided. The insulating layers 32 are provided as continuous insulating layers, i.e., a single material layer that extends over the entire area of the substrate (9, 10). Likewise, the sacrificial material layers 42 are provided as continuous sacrificial material layers. Thus, a vertically alternating sequence of continuous insulating layers and continuous sacrificial material layers is provided, which is a prototype alternating stack of insulating layers 32 and sacrificial material layers 42. As used herein, a "prototype" structure or an "in-process" structure refers to a transient structure that is subsequently modified in the shape or composition of at least one component therein.

The vertically alternating sequence is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
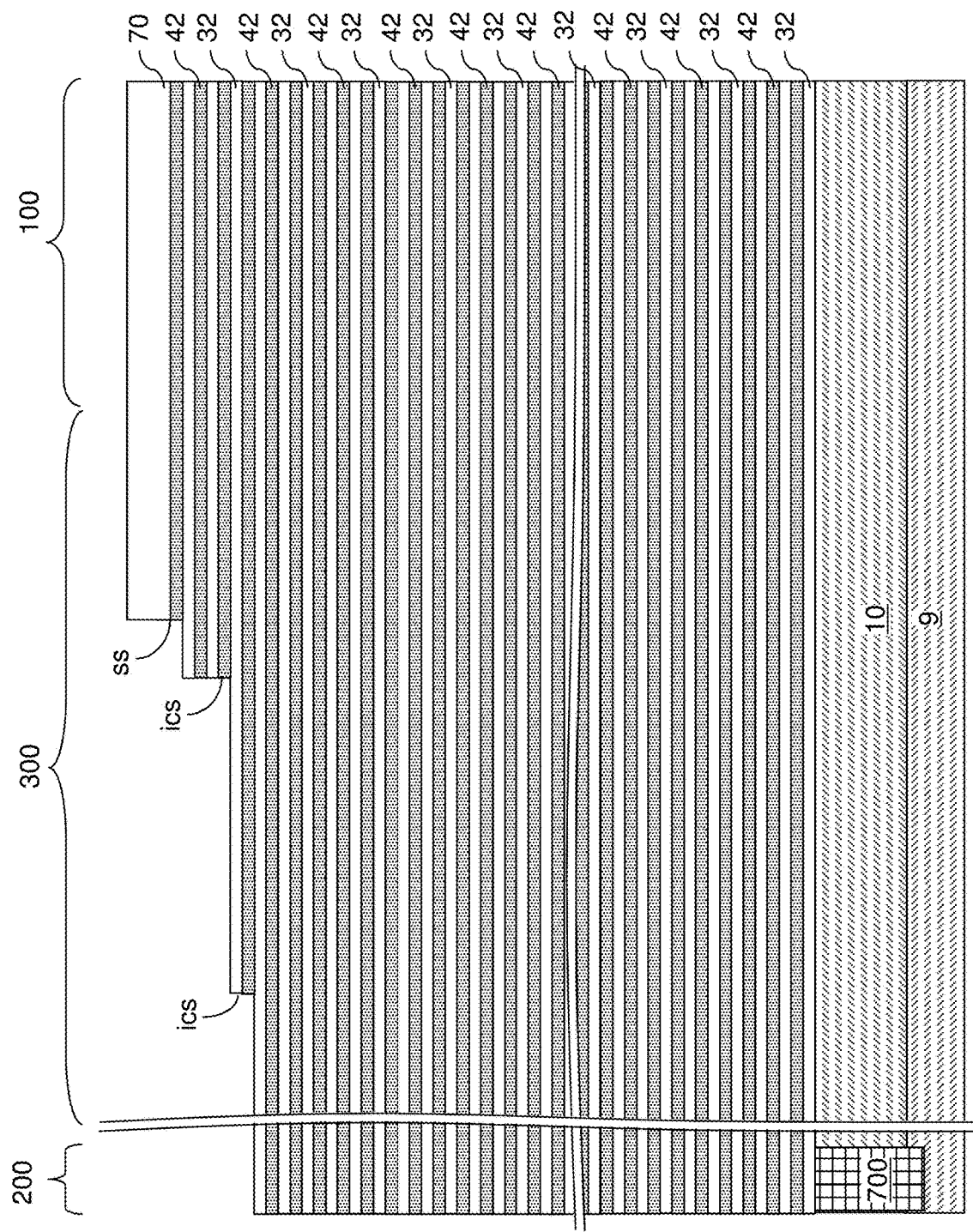
FIG. 3A is a schematic vertical cross-sectional view of the exemplary structure after formation of vertically offset surfaces in a contact region according to an embodiment of the present disclosure.
Figure 3C:
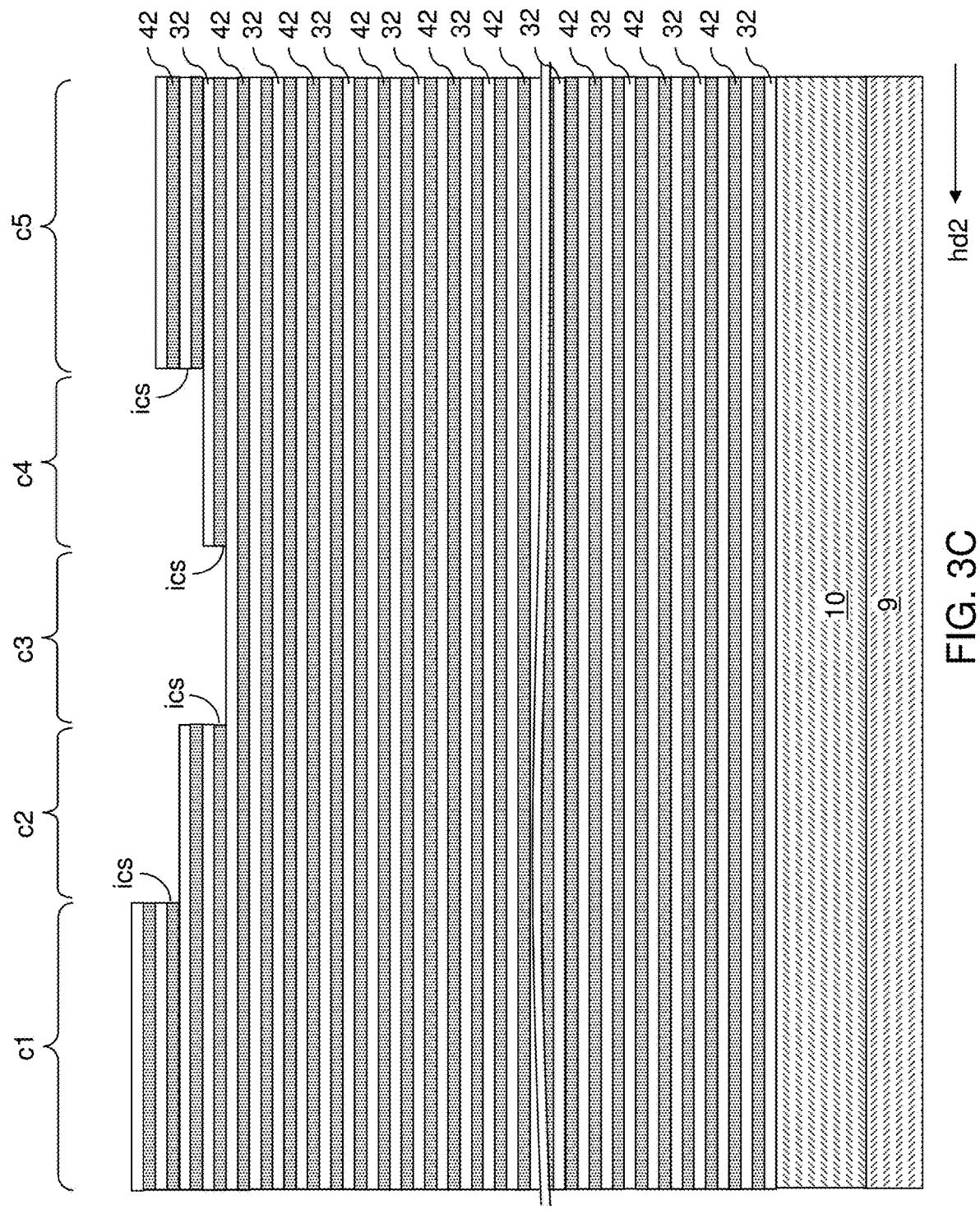
FIG. 3C is a vertical cross-sectional view along the vertical plane C-C' in FIG. 3B.

FIGS. 3B and 3C show the location of one memory string that will have five columns of staircases ("column stairs", "stair columns" or "column stair regions" hereinafter) c1-c5, each extending in a first horizontal direction hd1 (e.g., word line direction) and offset from each other in a second horizontal direction hd2 (e.g., bit line direction). It should be understood that there can any number of column stairs greater than two on each side of each NAND memory string. Each column stairs extends from the same side of the memory string in the memory array region 100 to the peripheral device region 200 in the contact region 300 in the first horizontal direction hd1. The steps in each column stairs step downward from the memory array region 100 to the peripheral device region 200. Each column stair can have a respective step in the same vertical plane which extends in the second horizontal direction hd2. The respective steps in the same vertical plane which extends in the second horizontal direction hd2 decrease and then increase from one end column stair (e.g., c1) to the other end column stair (e.g., c5). In other words, for three or more column stairs on the same side of the same memory string, the lowest step in the same vertical plane which extends in the second horizontal direction hd2 is located between the end stair columns (e.g., in one of the middle columns) and is not located in one of the two end columns.

Thus, the corresponding steps of stair columns of the same memory string are arranged in a "tick-tock" configuration in which the height of each step in the same vertical plane which extends parallel to the bit line direction and perpendicular to the word line direction decreases by one unit from the first end stair column (e.g., c1) to the second end column (e.g., c5) and decreases by one unit from the second end column (c5) to the first middle column (e.g., c2) closest to the first end column (c1). If there are more than three stair columns, then the height of each step in the same vertical plane which extends parallel to the bit line direction and perpendicular to the word line direction decreases by one unit from the first middle column (c2) to the second middle column (e.g., c4) adjacent to the second end column (c5), and decreases by one unit from the second middle column (c4) to a third middle column (e.g., c3) which is adjacent to the first middle column, and so on, depending on the number of stair columns. In one embodiment, one unit can be a pair of an adjacent insulating layer 32 and sacrificial material layer 42. However, in other embodiments, one unit can include two or more pairs of insulating and sacrificial material layers (32, 42).

Referring to FIGS. 3A-3C, the process for forming the column stairs described above is described in terms of vertically offset surfaces. The vertically offset surfaces are formed in the contact region 300 of the vertically alternating sequence of the continuous insulating layers 32 and the continuous sacrificial material layers 42. A combination of lithographic patterning steps and etch processes can be employed to form the vertically offset surfaces. As used herein, "vertically offset surfaces" refer to surfaces that are spaced apart from a horizontal plane including a top surface of the substrate (9, 10) by different distances. In one embodiment, the vertically offset surfaces laterally extend along the first horizontal direction hd1 and spaced apart along a second horizontal direction hd2 that is perpendicular to the first horizontal direction hd1. In one embodiment, the first horizontal direction hd1 may be perpendicular to a boundary between the memory array region 100 and the contact region 300. In one embodiment, if there are N column stairs to be formed on the same side of a memory string, then the vertically offset surfaces can be formed at N different horizontal planes that are vertically spaced apart among one another by a thickness of a respective neighboring pair of a continuous insulating layer 32 and a continuous sacrificial material layer 42. N is an integer greater than 2, such as 3, 4, 5, 6, 7, 8, 9, 10, etc. N is less than the total number of repetitions of the continuous insulating layers 32 and the continuous sacrificial layers 42 by a factor greater than 2. In one embodiment, top surfaces of N topmost continuous insulating layers 32 may be physically exposed after formation of the vertically offset surfaces. Alternatively, top surfaces of N topmost continuous sacrificial material layers 42 may be physically exposed after formation of the vertically offset surfaces.

As shown in FIG. 3C, the sequence of the vertically offset surfaces along the second horizontal direction hd2 can be selected such that the vertically offset surfaces have a vertical cross-sectional profile along the second horizontal direction hd2 in which a stepwise decreasing profile and a stepwise increasing profile alternate along the second horizontal direction hd2 between each neighboring pair of a topmost surface among the vertically offset surfaces and a second topmost surface among the vertically offset surfaces. The configuration illustrated in FIGS. 3A-3C corresponds to the embodiment in which N is 5. In this case, a first column stair region c1, a second column stair region c2, a third column stair region c3, a fourth column stair region c4, and a fifth column stair region c5 are sequentially arranged from one side to another in the vertical cross-sectional view of FIG. 3C, which is a vertical cross-sectional view along the second horizontal direction. The sequence of the first column stair region c1, the second column stair region c2, the third column stair region c3, the fourth column stair region c4, and the fifth column stair region c5 is located between a neighboring pair of a topmost surface among the vertically offset surfaces and a second topmost surface among the vertically offset surfaces. In one embodiment, each topmost surface can be a top surface of a topmost one of the continuous insulating layers 32 within the alternating stack (32, 42), and each second topmost surface can be a top surface of a second continuous insulating layer 32 as counted from the top of the alternating stack (32, 42).

Each of vertical cross-sectional profiles can have N different top surfaces of the alternating stack (32, 42). In on embodiment, the N different top surfaces of the alternating stack (32, 42) can be top surfaces of N vertically consecutive insulating layers 32 within the alternating stack (32, 42), or top surfaces of N vertically consecutive sacrificial material layers 42 within the alternating stack (32, 42). Each of the vertical cross-sectional profiles between a neighboring pair of a topmost surface among the vertically offset surfaces and a second topmost surface among the vertically offset surfaces can have (N−1) inter-column vertical steps ics between neighboring column stairs of the alternating stack (32, 42). In one embodiment, the (N−1) inter-column vertical steps ics comprises one single level inter-column vertical step and (N−2) double level inter-column vertical steps. In each single level inter-column vertical step (such as the inter-column vertical step ics between the third column stair region c3 and the fourth column stair region c4 illustrated in FIG. 3C), a height of top surfaces of the alternating stack (32, 42) changes by a vertical distance between vertically neighboring top surfaces of insulating layers 32 of the alternating stack (32, 42). In each double level inter-column vertical step, a height of top surfaces of the alternating stack (32, 42) changes by twice the vertical distance between vertically neighboring top surfaces of the insulating layers 32 within the alternating stack (32, 42).

The vertically offset surfaces can be formed by repetition of application and patterning of a photoresist layer, and an anisotropic etch process that etches unmasked portions of the alternating stack (32, 42). Alternatively, a combination of masking processes to be subsequently described and anisotropic etch processes can be employed.

Figure 4A:
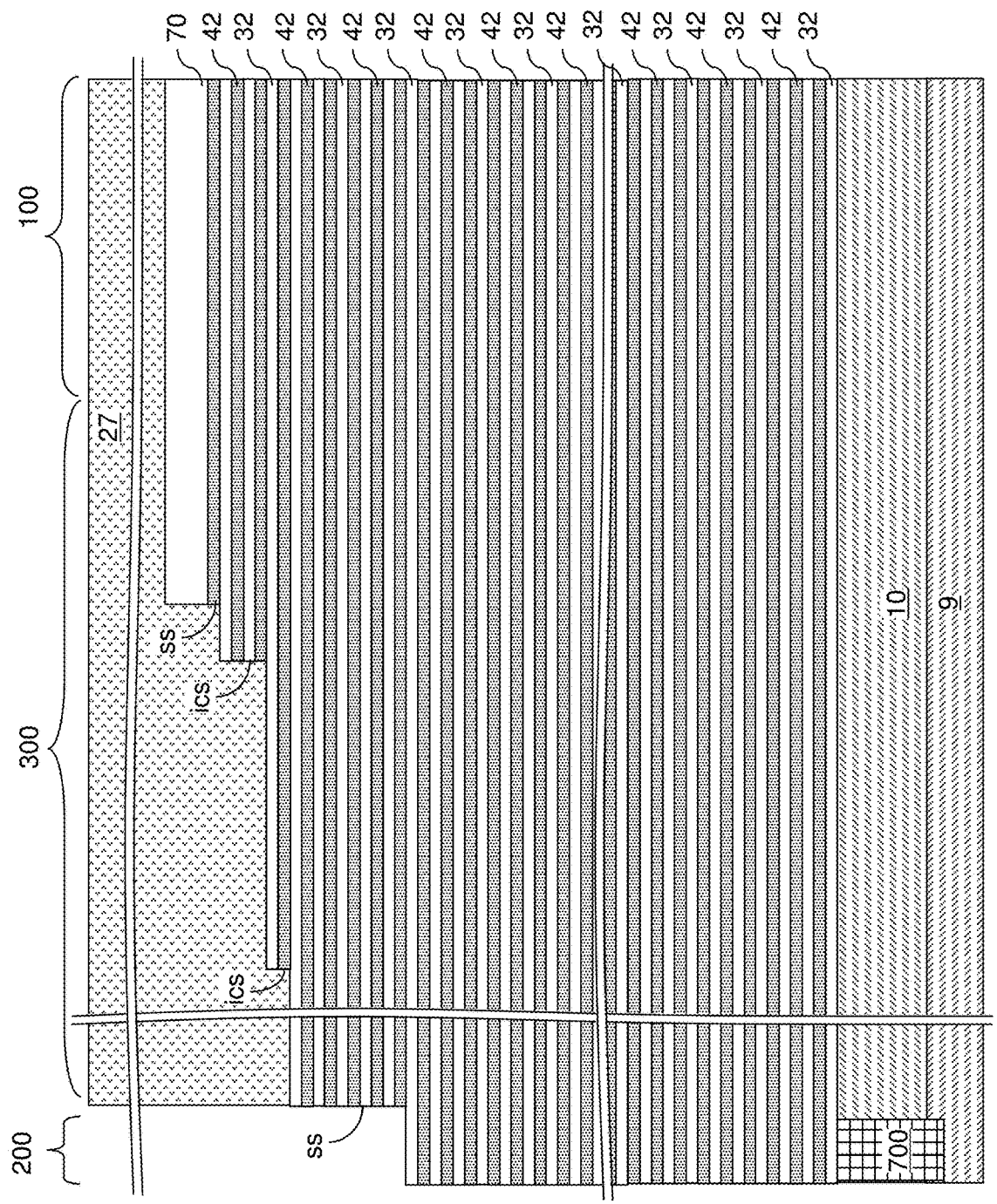
FIG. 4A is a schematic vertical cross-sectional view of the exemplary structure after formation of first intra-column vertical steps according to an embodiment of the present disclosure.
Figure 4B:
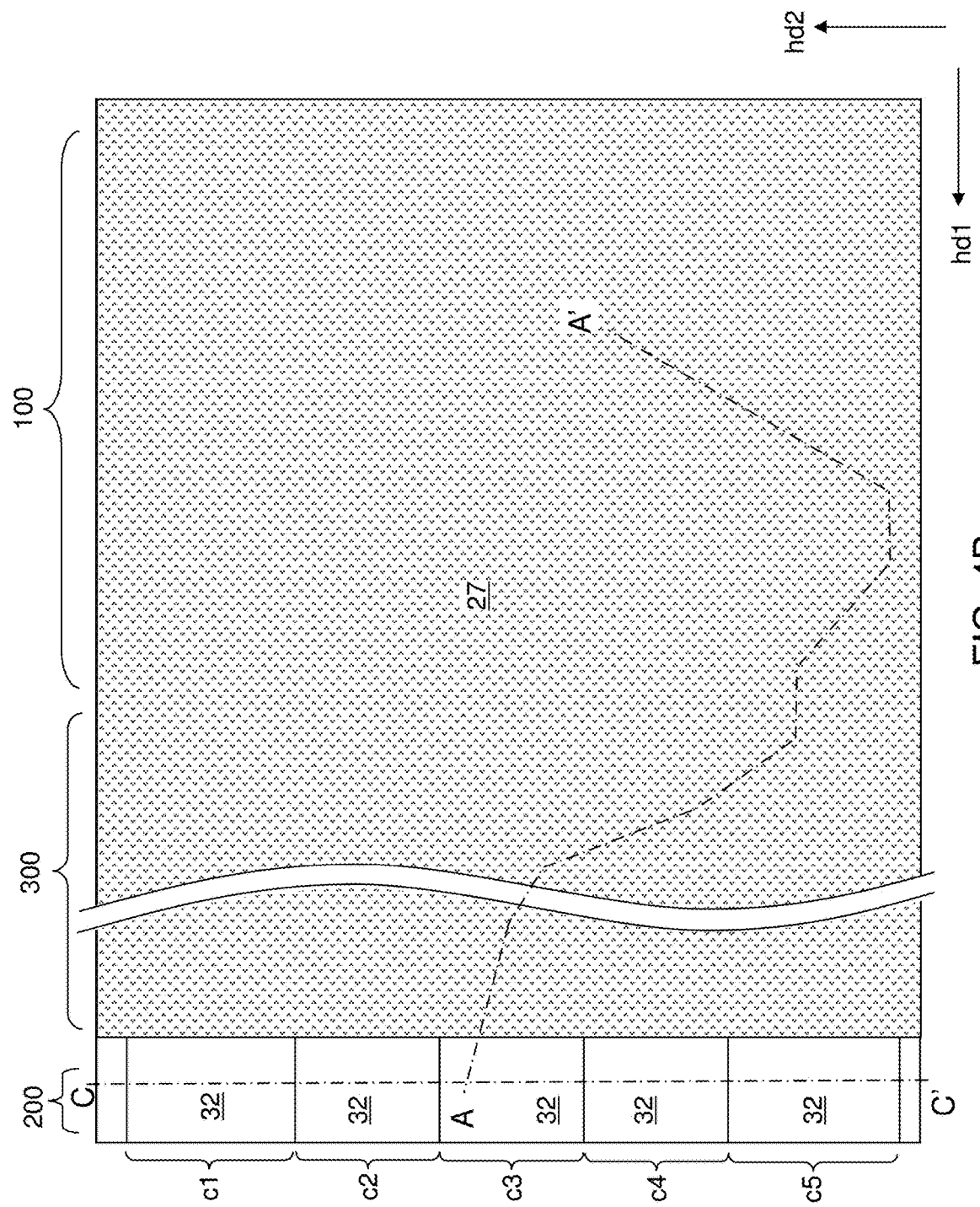
FIG. 4B is a top-down view of the exemplary structure of FIG. 4A. The vertical plane A-A' is the plane of the cross-section for FIG. 4A.
Figure 4C:
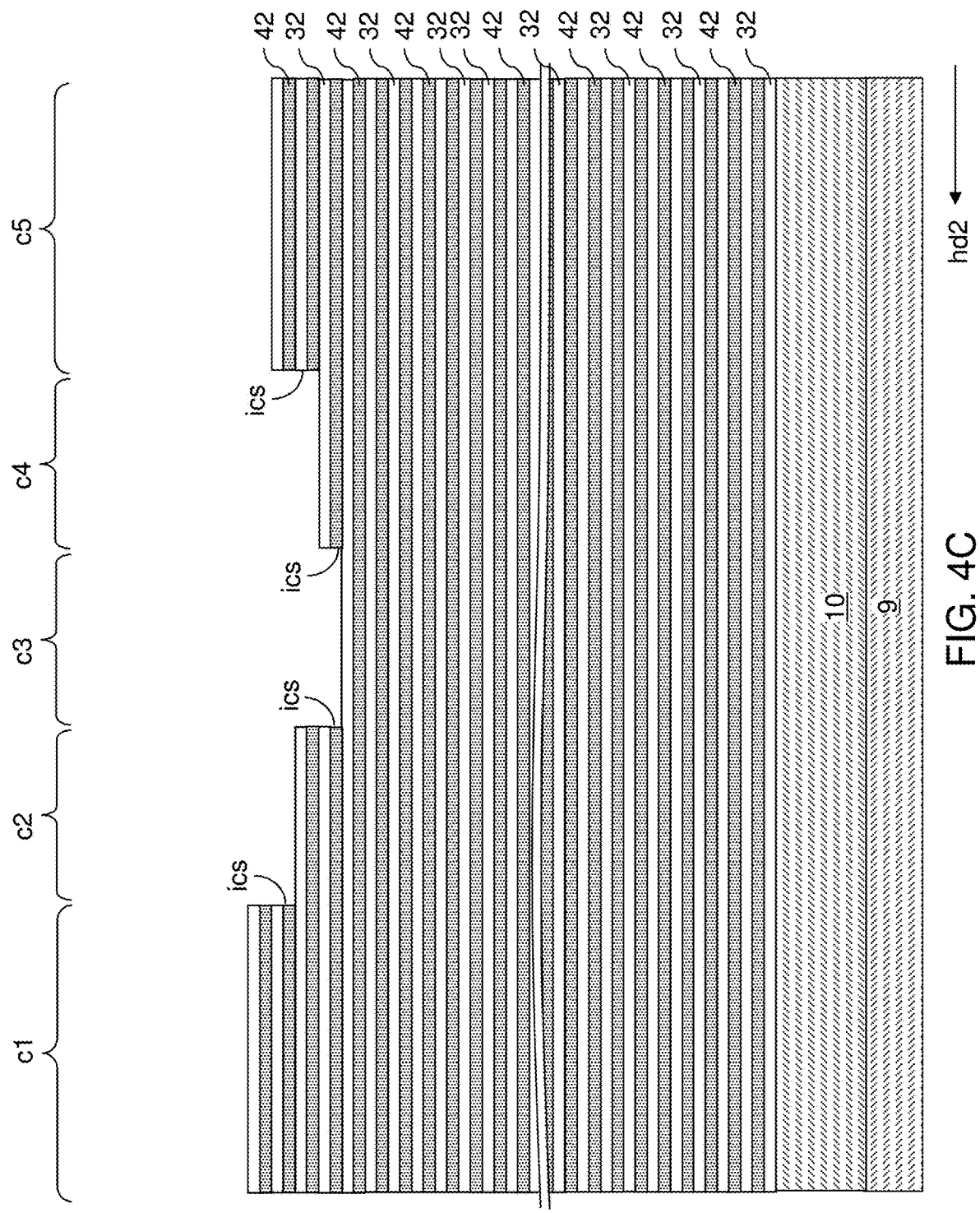
FIG. 4C is a vertical cross-sectional view along the vertical plane C-C' in FIG. 4B.

Referring to FIGS. 4A-4C, a trimmable mask layer 27 can be applied over the exemplary structure, and can be lithographically patterned to cover the memory array region 100 and the contact region 300 without covering the peripheral device region 200. The trimmable mask layer 27 can be a photoresist layer that can be trimmed isotropically by a trimming process, which can be a controlled ashing process or an isotropic etch process. An edge of the trimmable mask layer 27 can be formed at a boundary between the contact region 300 and the peripheral device region 200.

An anisotropic etch can be performed to etch physically exposed portions of the alternating stack (32, 42). In one embodiment, N pairs of insulating layers 32 and sacrificial material layers 42 can be vertically recessed within the area that is not covered by the trimmable mask layer 27. A vertical step is formed within the vertical plane including the edge of the trimmable mask layer 27 located at the boundary between the peripheral device region 200 and the contact region 300, which are herein referred to as a first intra-column vertical step ss. The first intra-column vertical step ss is formed within each column stair region (c1-c5). In case the continuous insulating layers 32 have a same insulating layer thickness and the continuous sacrificial material layers 42 have a same sacrificial material layer thickness, the height of the first intra-column vertical step ss can be equal to a vertical distance between top surfaces of a topmost one and a bottommost one among (N+1) vertically consecutive insulating layers irrespective of the location of measurement.

Figure 5A:
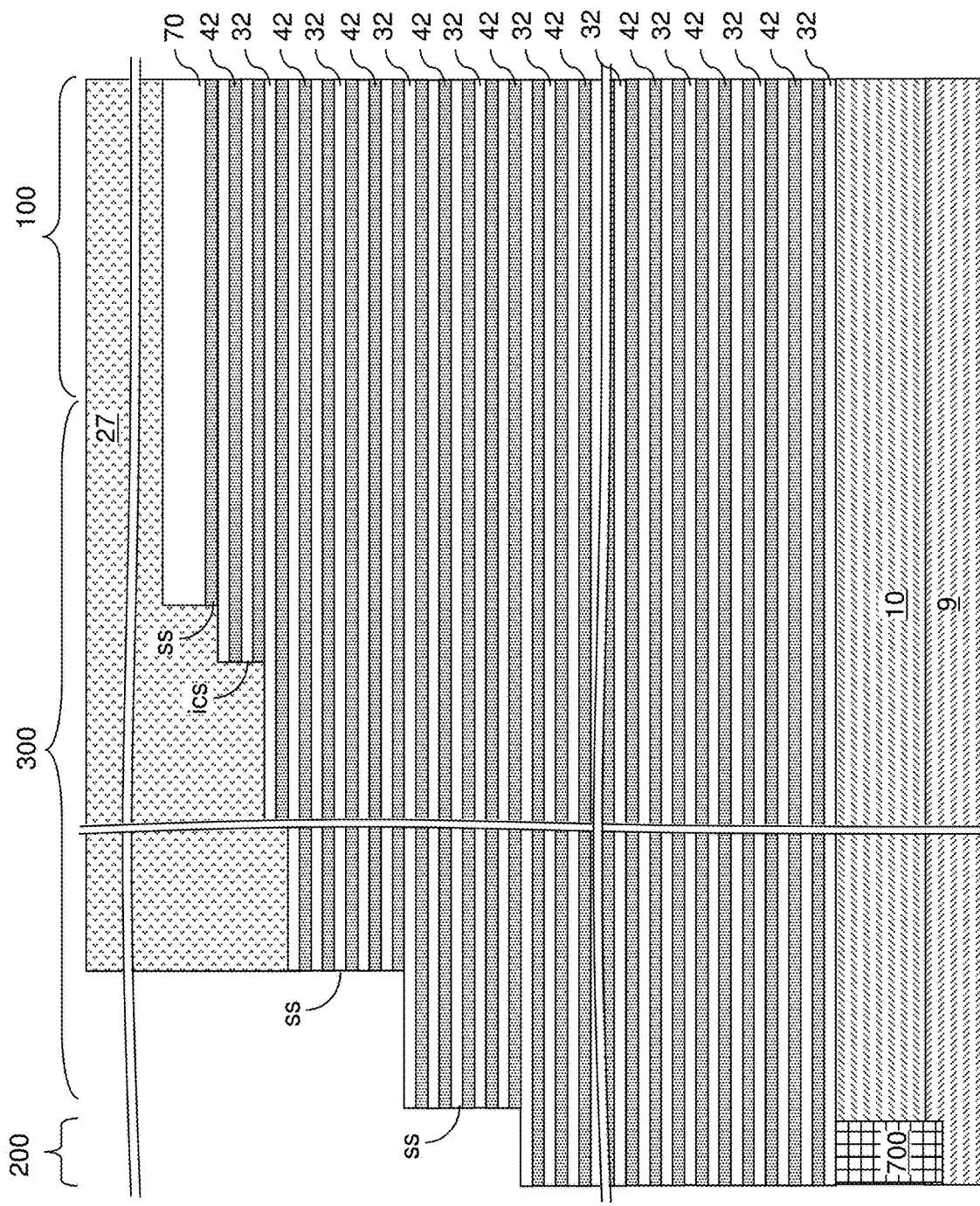
FIG. 5A is a schematic vertical cross-sectional view of the exemplary structure after formation of second intra-column vertical steps according to an embodiment of the present disclosure.
Figure 5C:
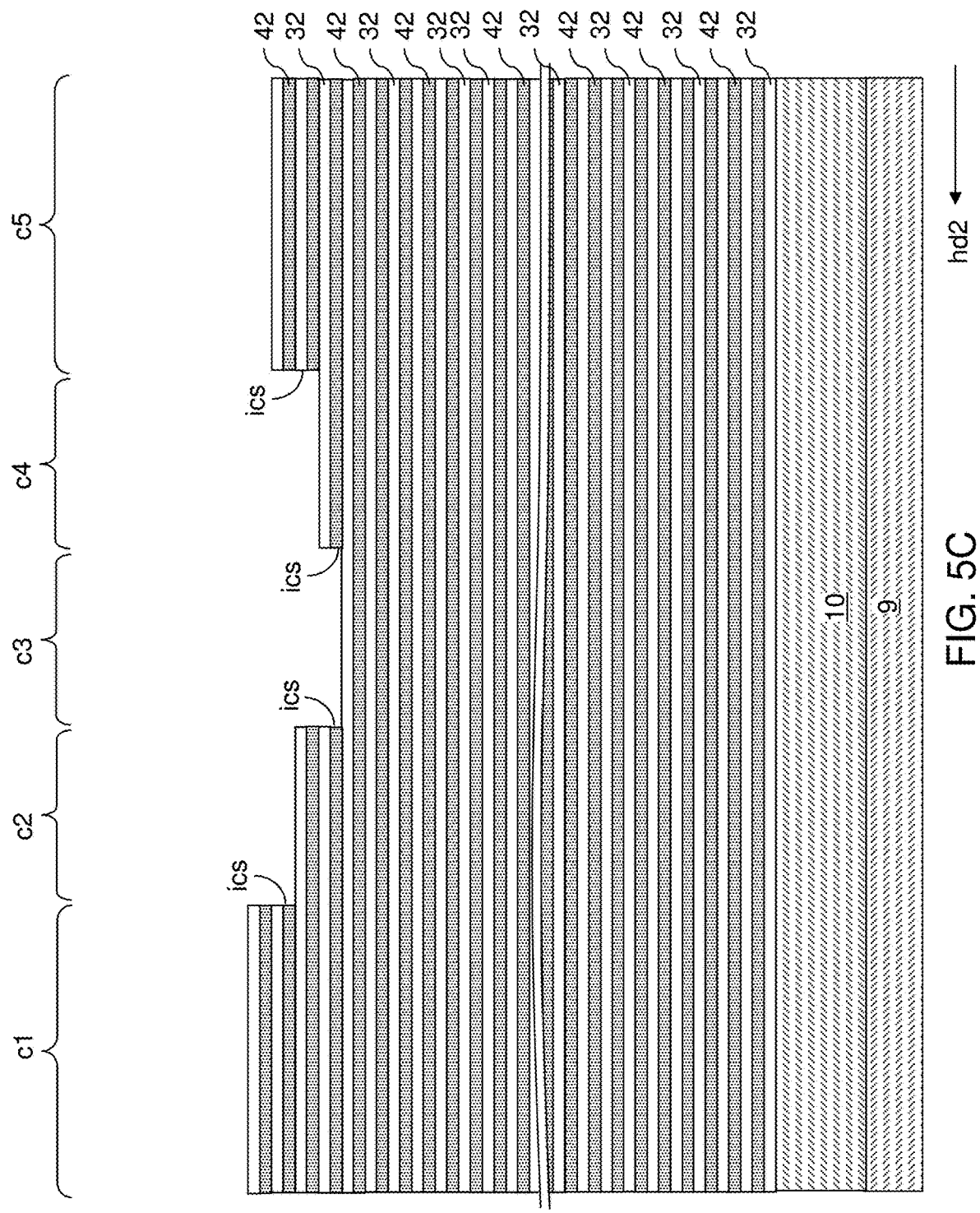
FIG. 5C is a vertical cross-sectional view along the vertical plane C-C' in FIG. 5B.

Referring to FIGS. 5A-5C, the trimmable mask layer 27 can be trimmed isotropically by a trimming process. The trimming distance can be the dimension of steps along the first horizontal direction hd1 to be subsequently formed. For example, the trimming distance can be in a range from 30 nm to 300 nm, although lesser and greater trimming distances can also be employed. An edge of the trimmable mask layer 27 shifts toward the memory array region 100 from the boundary between the contact region 300 and the peripheral device region 200 by the trimming distance.

An anisotropic etch can be performed to etch physically exposed portions of the alternating stack (32, 42). In one embodiment, N pairs of insulating layers 32 and sacrificial material layers 42 can be vertically recessed within the area that is not covered by the trimmable mask layer 27. A second intra-column vertical step ss is formed within the vertical plane including the edge of the trimmable mask layer 27. The first intra-column vertical step ss shifts downward by N pairs of insulating layers 32 and sacrificial material layers 42. In case the continuous insulating layers 32 have a same insulating layer thickness and the continuous sacrificial material layers 42 have a same sacrificial material layer thickness, the height of the first and second intra-column vertical steps ss can be equal to a vertical distance between top surfaces of a topmost one and a bottommost one among (N+1) vertically consecutive insulating layers irrespective of the location of measurement.

Figure 6A:
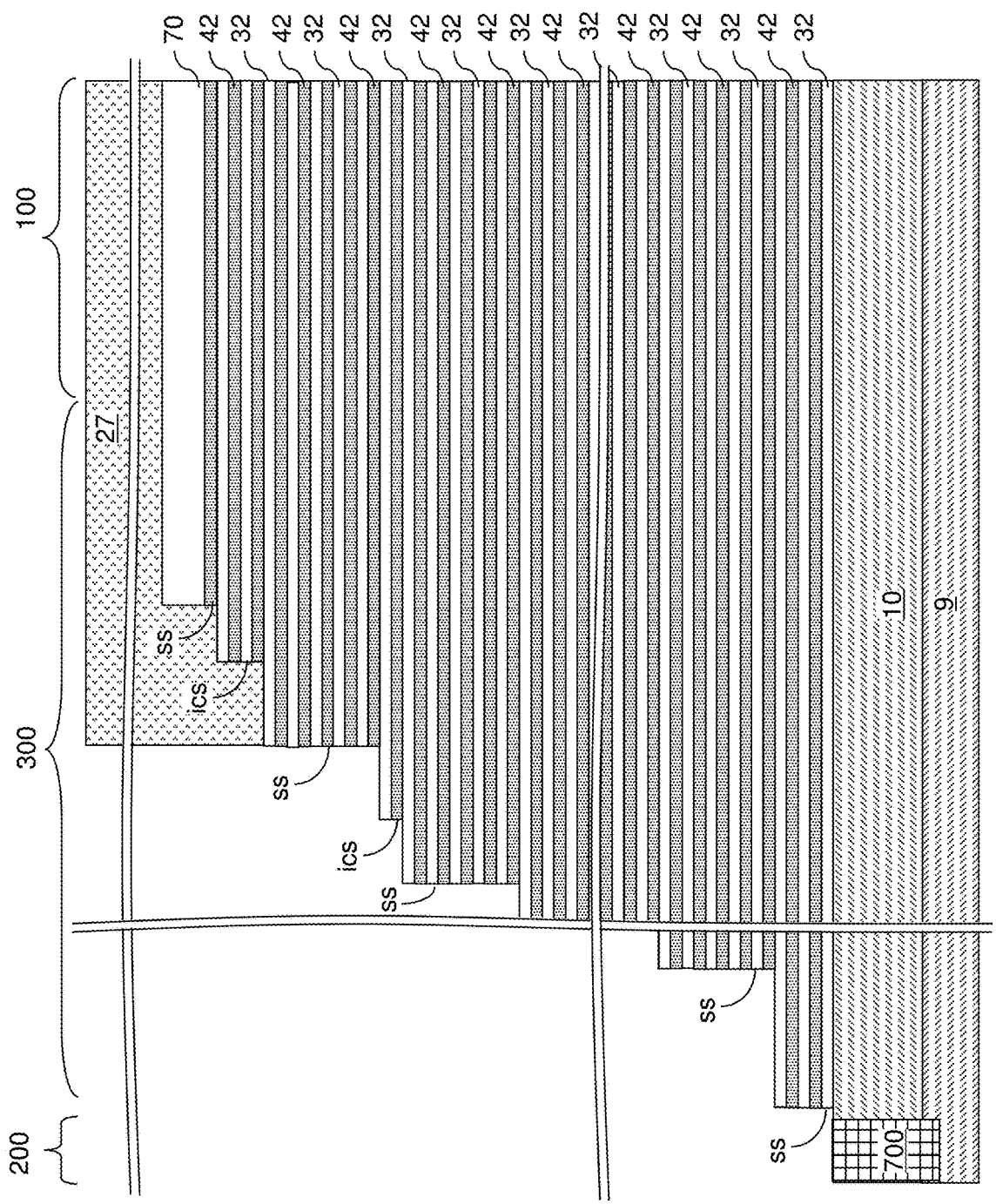
FIG. 6A is a schematic vertical cross-sectional view of the exemplary structure after formation of M-th intra-column vertical steps according to an embodiment of the present disclosure.
Figure 6B:
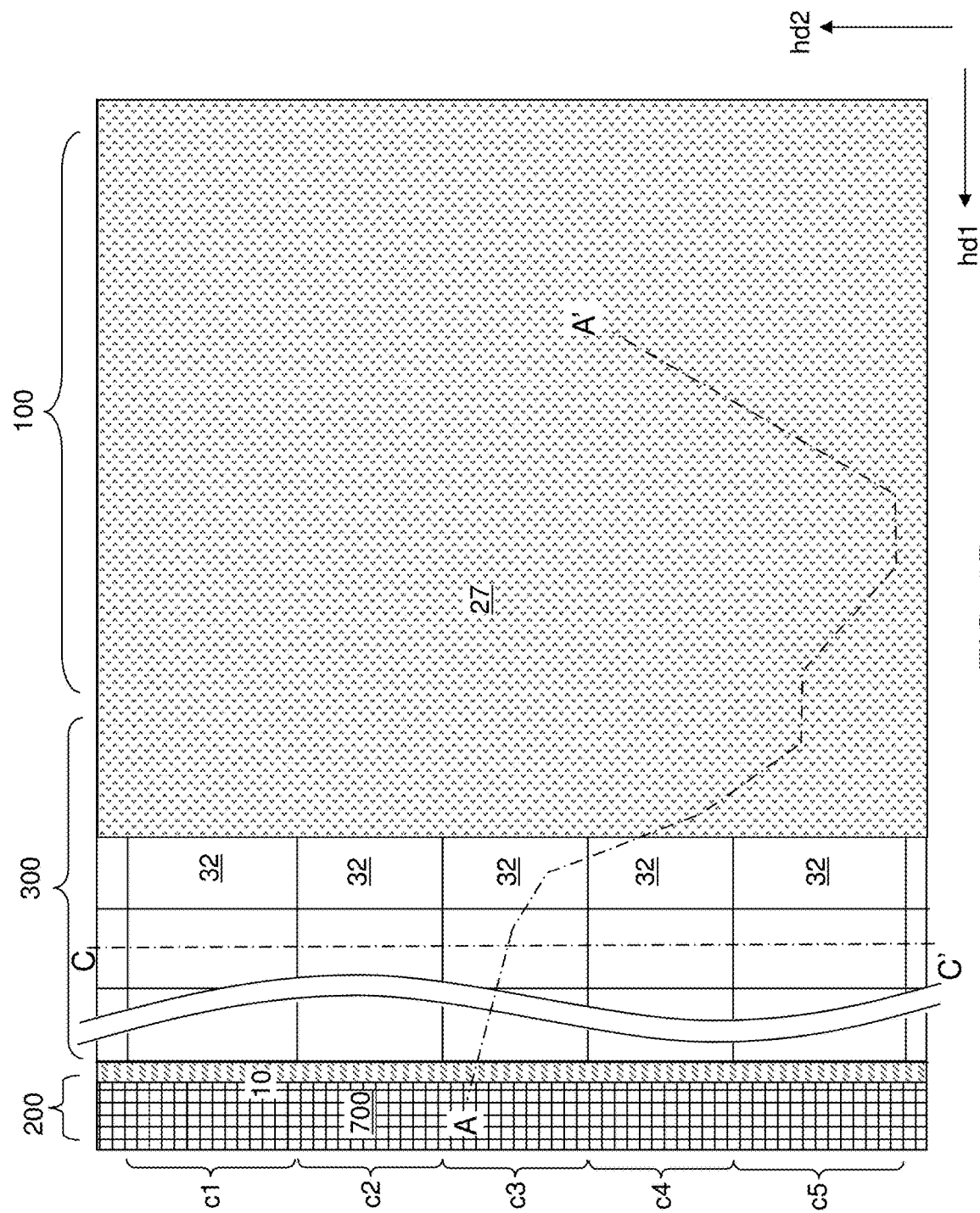
FIG. 6B is a top-down view of the exemplary structure of FIG. 6A. The vertical plane A-A' is the plane of the cross-section for FIG. 6A.
Figure 6C:
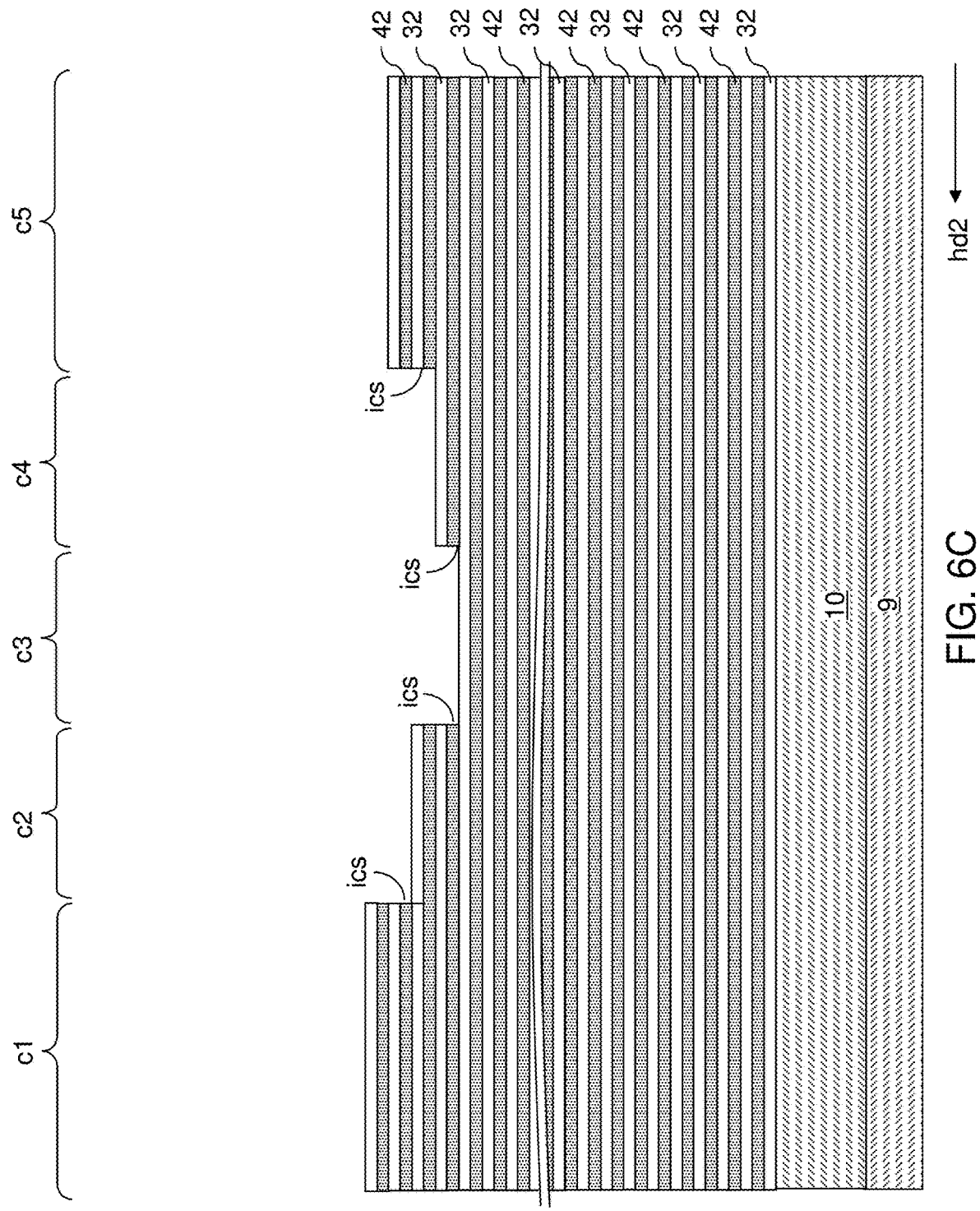
FIG. 6C is a vertical cross-sectional view along the vertical plane C-C' in FIG. 6B.

Referring to FIGS. 6A-6C, the processing steps of FIGS. 5A-5C can be repeated (M−2) times to form additional intra-column vertical steps ss. M can be an integer greater than 2. The integer M can be selected such that (M+1)×N is the same as, or greater than, the total number of sacrificial material layers 42 in the alternating stack (32, 42). The integer M can be selected such that M×N is the same as, or greater than, the total number of sacrificial material layers 42 in the alternating stack (32, 42). In one embodiment, a total number of the continuous sacrificial material layers 42 within the alternating stack (32, 42) can be in a range from M×N to (M+2)×N. An M-th intra-column vertical step ss can be formed within each column stair region (c1-c5) after repetition of the processing steps of FIGS. 5A-5C (M−2) times.

The processing steps of FIGS. 4A-4C, 5A-5C, and 6A-6C pattern the vertically offset surfaces into column stairs. Each column stair is located within a respective one of the column stair regions (c1-c5). Each column stair continuously extends from a bottommost layer to a topmost layer within the vertically alternating sequence, i.e., the alternating stack, of the continuous insulating layers 32 and the continuous sacrificial material layers 42. Each column stair has a respective set of intra-column stepped surfaces that provides stepwise height increases along the first horizontal direction hd1. The magnitude of each stepwise height increase is equal to a vertical distance between top surfaces of a topmost one and a bottommost one among (N+1) vertically consecutive insulating layers 32. Each set of intra-column stepped surfaces within each column stair region (c1-c5) can include M intra-column stepped surfaces at which a height of top surfaces of a respective column stair changes by N times a vertical distance between vertically neighboring top surfaces of the continuous insulating layers 32.

Figure 7A:
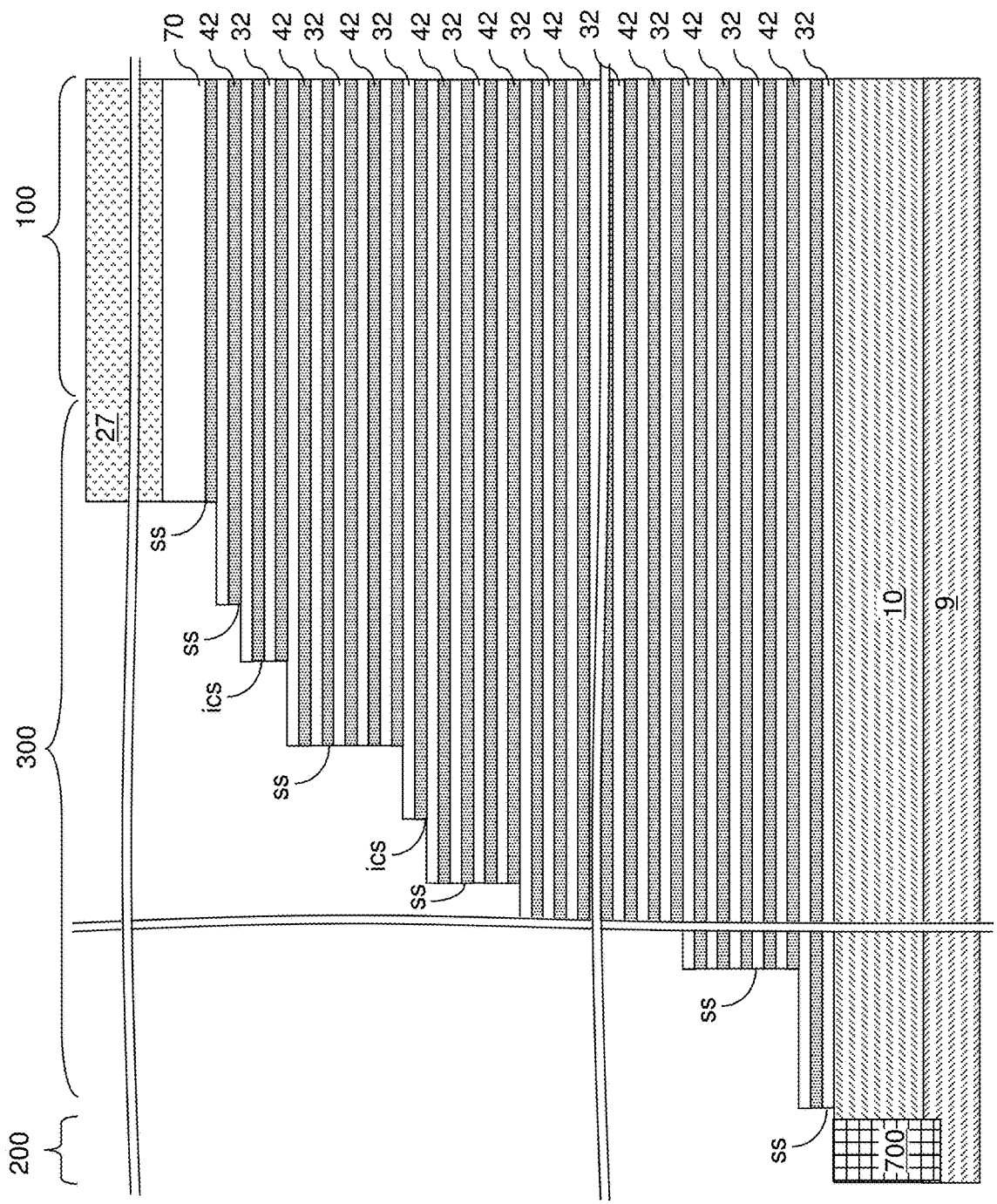
FIG. 7A is a schematic vertical cross-sectional view of the exemplary structure after formation of drain-select-level intra-column vertical steps according to an embodiment of the present disclosure.
Figure 7C:
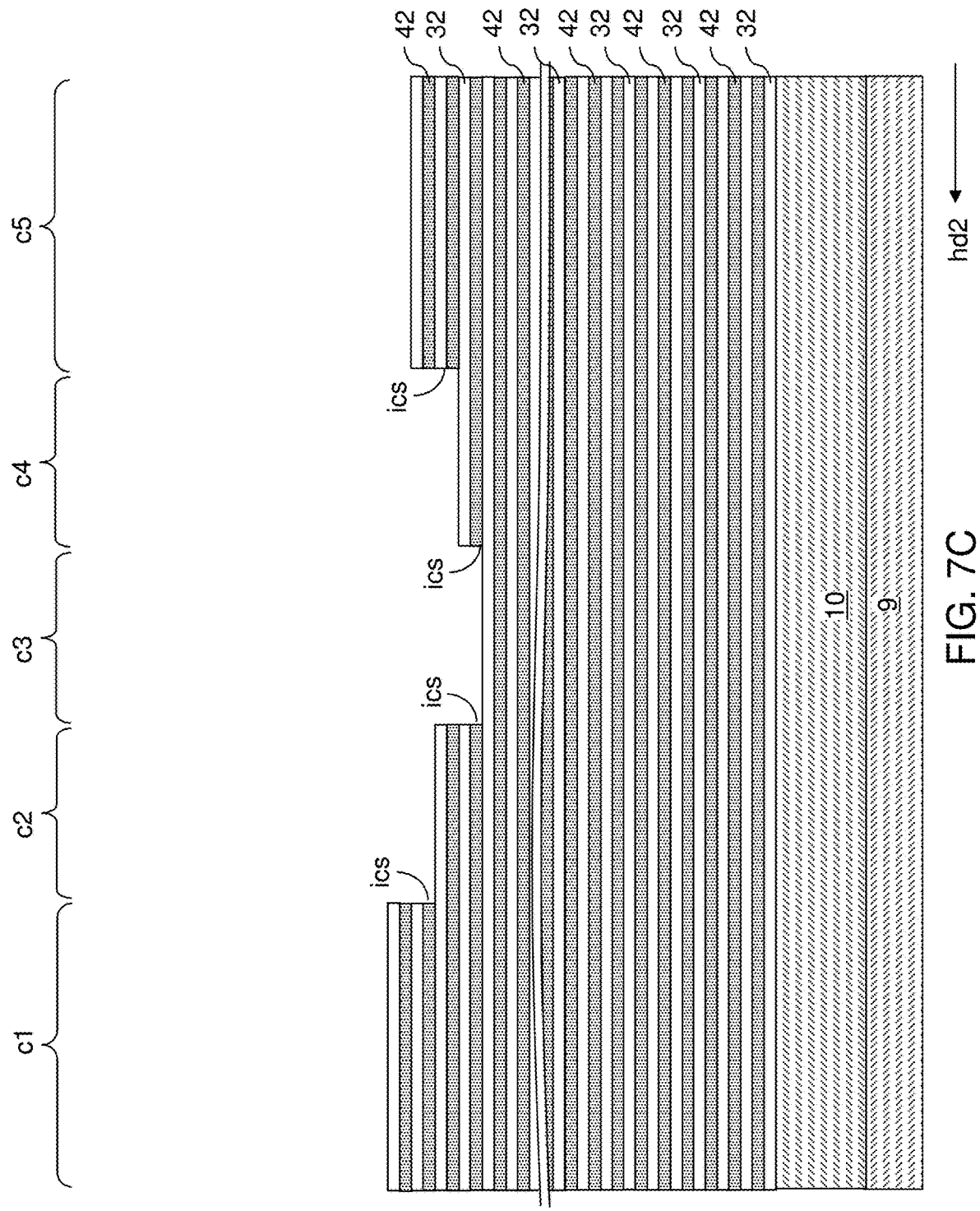
FIG. 7C is a vertical cross-sectional view along the vertical plane C-C' in FIG. 7B.

Referring to FIGS. 7A-7C, the trimmable mask layer 27 can be trimmed toward a peripheral portion of the contact region 300 that is proximal to the memory array region 100. A first step of an anisotropic etch process can be performed to etch the insulating cap layer 70 and physically exposed insulating layers 32 selective to the material of the sacrificial material layers. A second step of the anisotropic etch process can be performed to etch physically exposed portions of the sacrificial material layers 42, thereby vertically shifting the intra-column stepped surfaces by the thickness of a pair of an insulating layer 32 and a sacrificial material layer 42 and forming a vertical step including a sidewall of a topmost one of the sacrificial material layers 42. The vertical step including a sidewall of a topmost one of the sacrificial material layers 42 is herein referred to as a drain-select-level intra-column vertical step. The trimmable mask layer 27 can be subsequently removed, for example, by ashing. A stepped cavity is formed in the contact region 300.

Figure 8A:
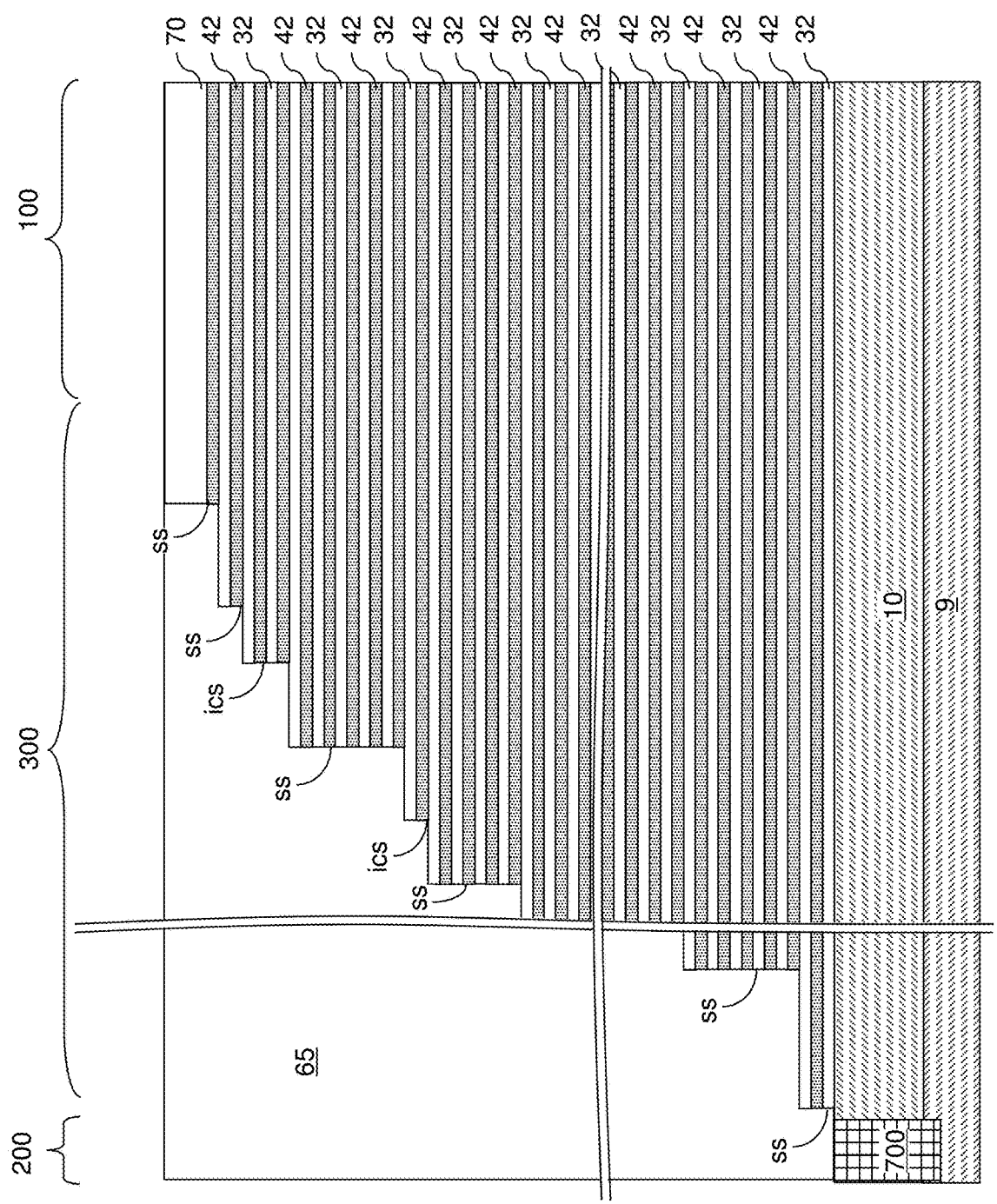
FIG. 8A is a schematic vertical cross-sectional view of the exemplary structure after formation of a retro-stepped dielectric material portion according to an embodiment of the present disclosure.
Figure 8C:
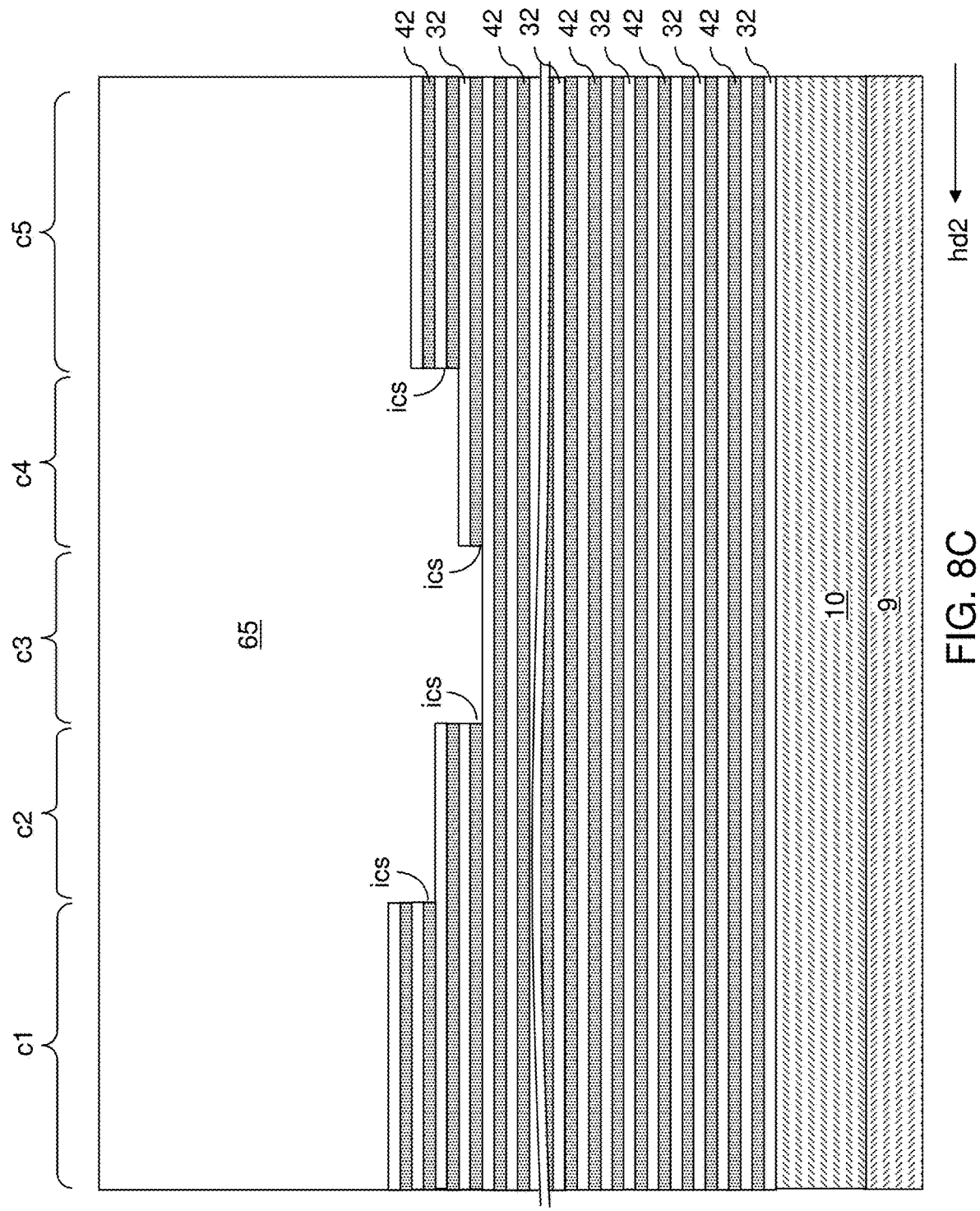
FIG. 8C is a vertical cross-sectional view along the vertical plane C-C' in FIG. 8B.

Referring to FIGS. 8A-8C, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 9A:
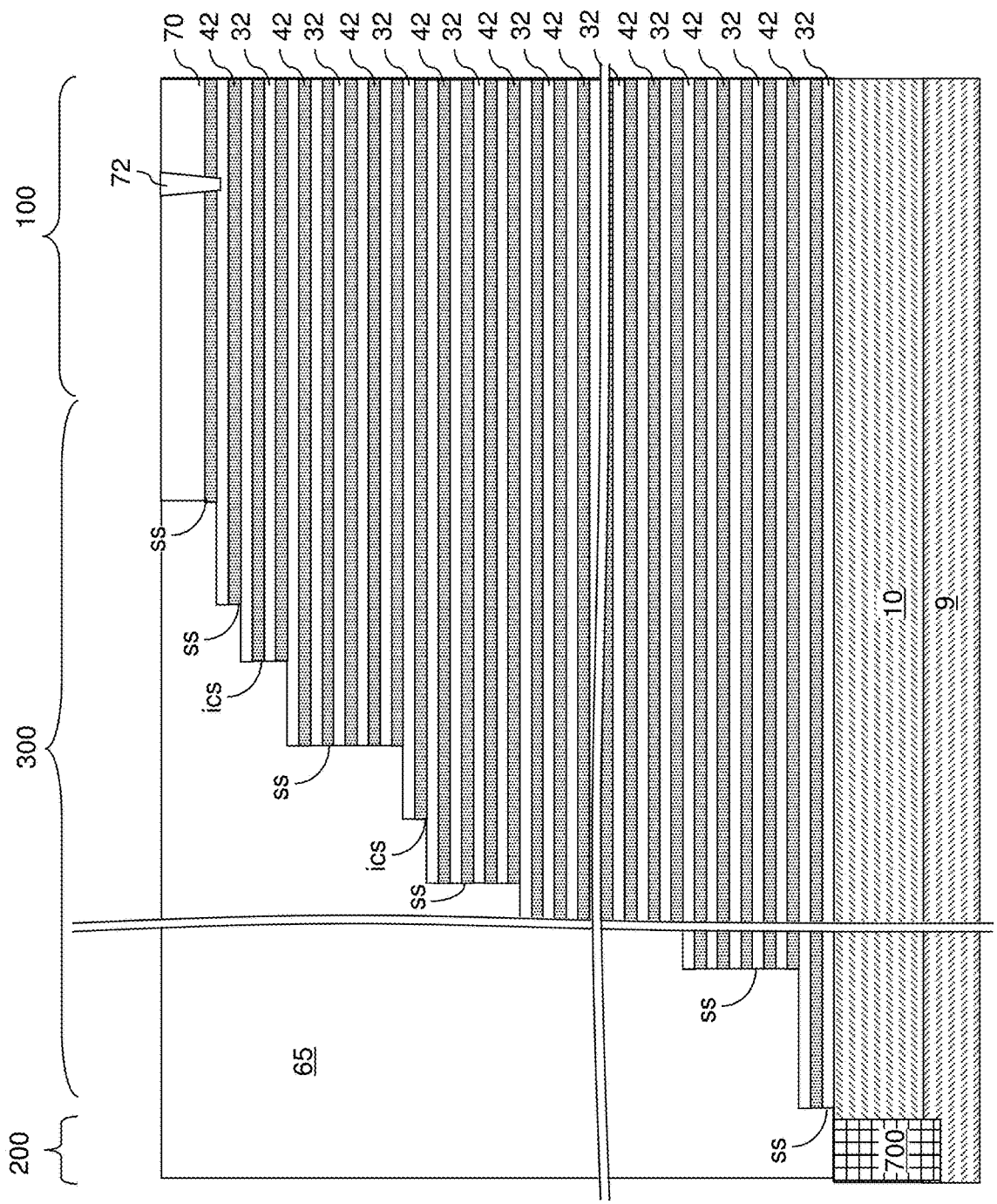
FIG. 9A is a schematic vertical cross-sectional view of the exemplary structure after formation of drain-select-level isolation structures according to an embodiment of the present disclosure.
Figure 9B:
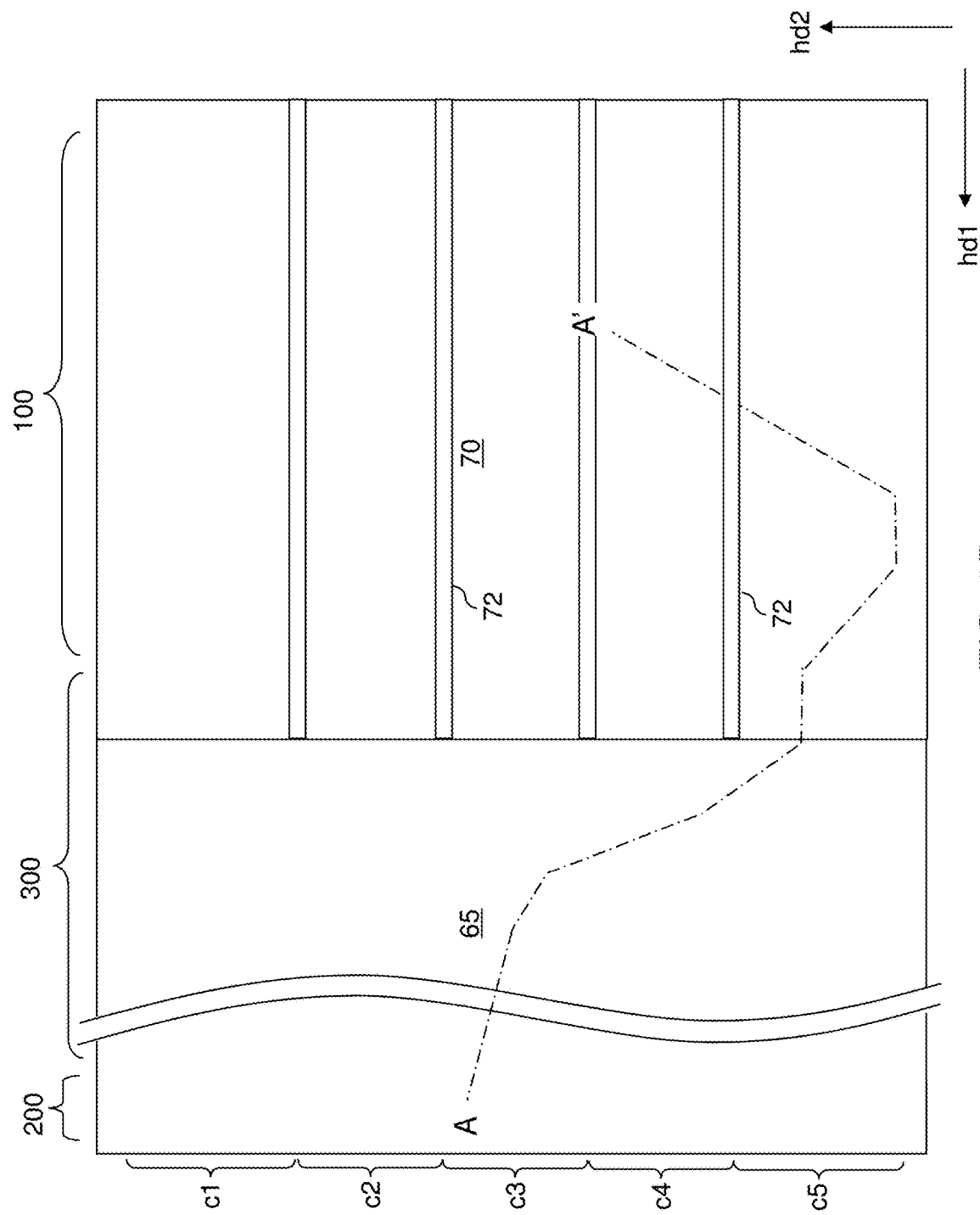
FIG. 9B is a top-down view of the exemplary structure of FIG. 9A. The vertical plane A-A' is the plane of the cross-section for FIG. 9A.

Referring to FIGS. 9A and 9B, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 10A:
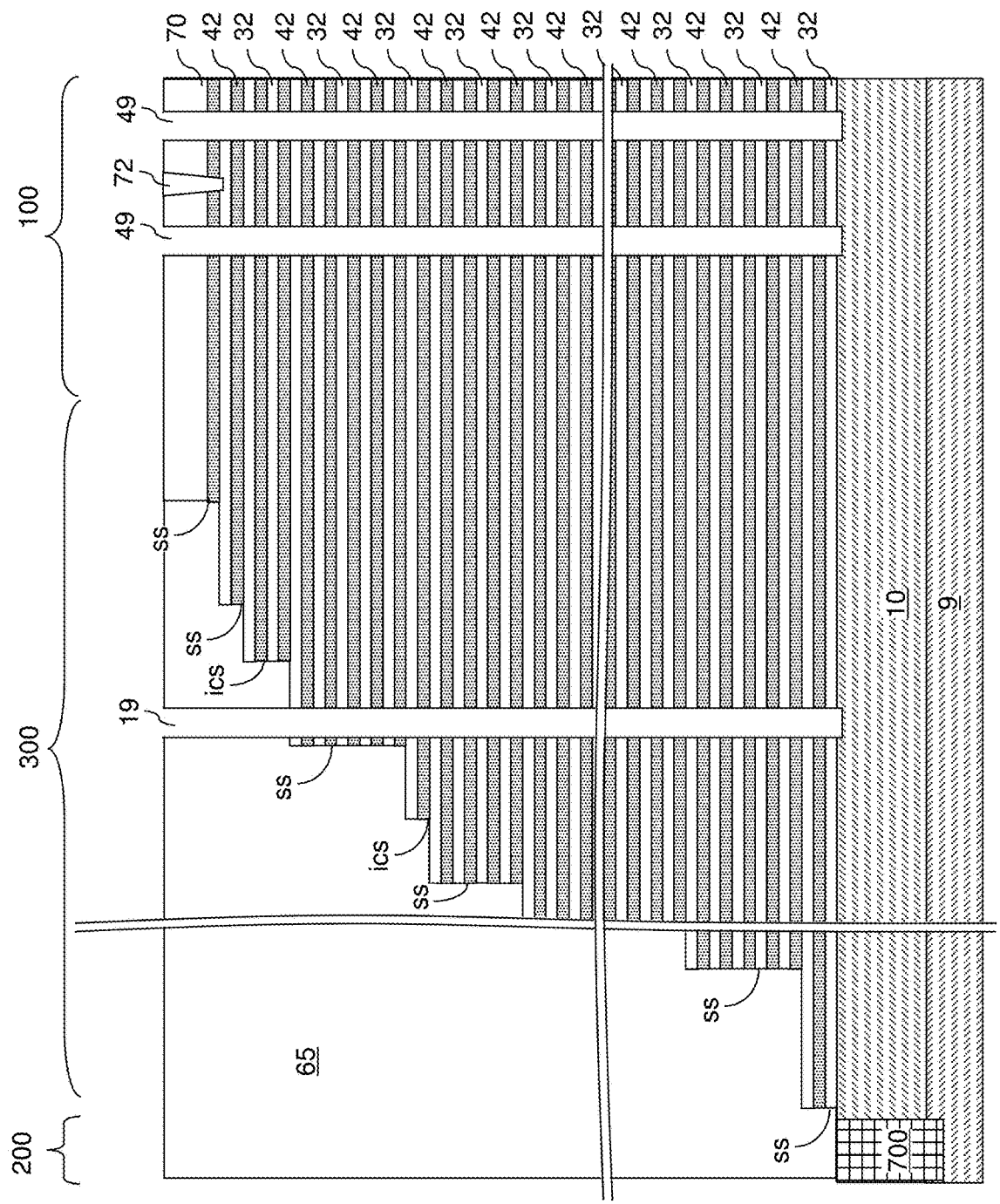
FIG. 10A is a schematic vertical cross-sectional view of the exemplary structure after formation of memory openings and support openings according to an embodiment of the present disclosure.
Figure 10B:
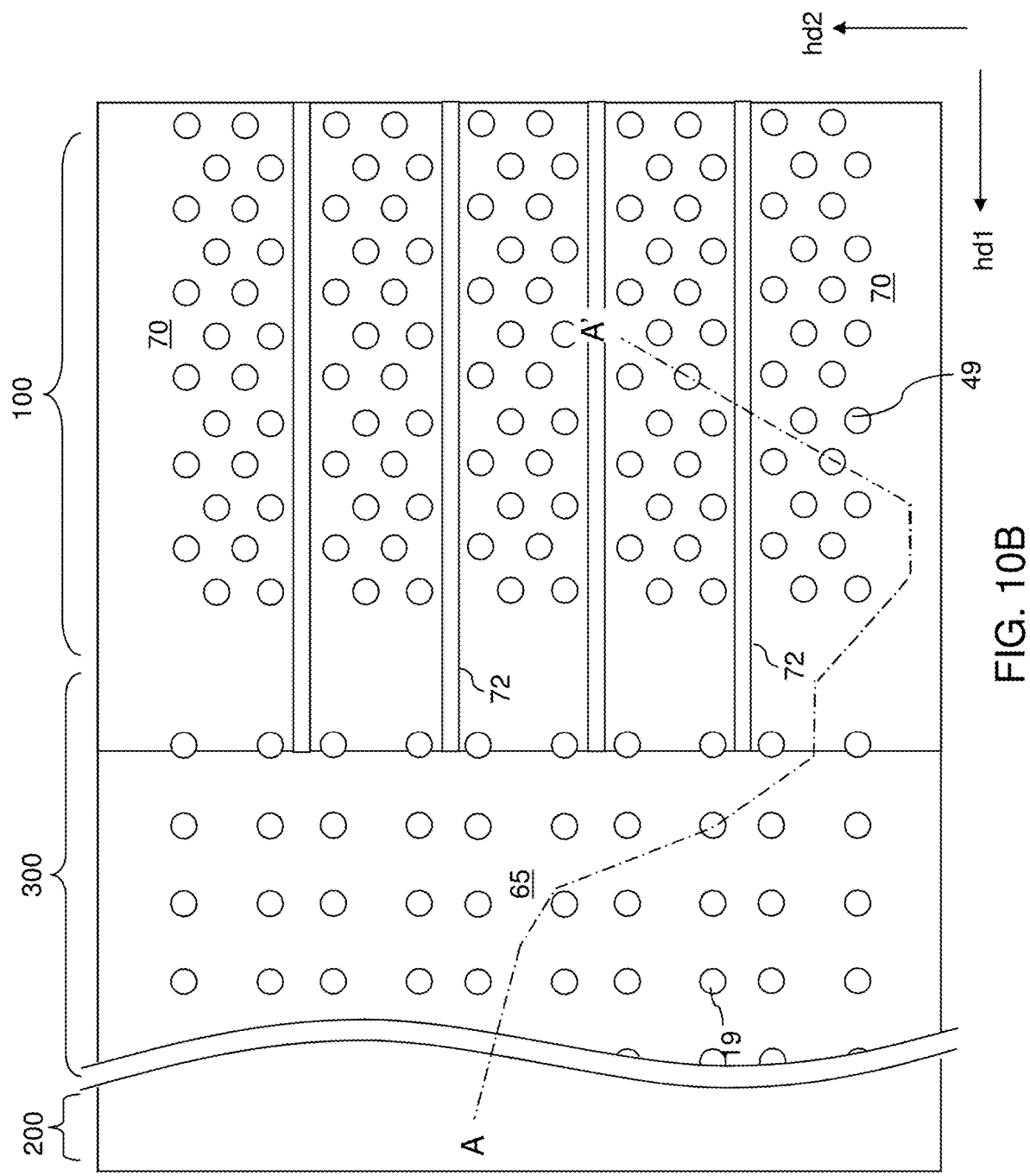
FIG. 10B is a top-down view of the exemplary structure of FIG. 10A. The vertical plane A-A' is the plane of the cross-section for FIG. 10A.

Referring to FIGS. 10A and 10B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 11A-11F illustrate a memory opening 49, which is one of the memory openings 49 in the exemplary structure of FIGS. 10A and 10B, during formation of a memory stack structure therein. The same structural change occurs simultaneously in each of the other memory openings 49 and in each support opening 19.

Referring to FIG. 11A, a stack of layers including a blocking dielectric layer 52, a charge storage layer 54, a tunneling dielectric layer 56, and an optional first semiconductor channel layer 601 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 11B, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the semiconductor material layer 10 can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 11C, a second semiconductor channel layer 602 can be deposited directly on the semiconductor surface of the semiconductor material layer 10 and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 11D, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 11E, the horizontal portion of the dielectric core layer 62L can be removed, for example, by a recess etch from above the top surface of the insulating cap layer 70. The dielectric core layer 62L can be further recessed below a horizontal plane including the top surface of the insulating cap layer 70. Each remaining portion of the dielectric core layer 62L has a top surface between the horizontal plane including the top surface of the insulating cap layer 70 and the horizontal plane including the bottom surface of the insulating cap layer, and constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 11F, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a memory stack structure 55, a dielectric core 62, and a drain region 63 within a memory opening 49 is herein referred to as a memory opening fill structure (11, 55, 62, 63). Each combination of a memory film 50, a vertical semiconductor channel 60, a dielectric core 62, and a drain region 63 within each support opening 19 fills the respective support openings 19, and constitutes a support pillar structure 20. See FIG. 6.

Figure 12A:
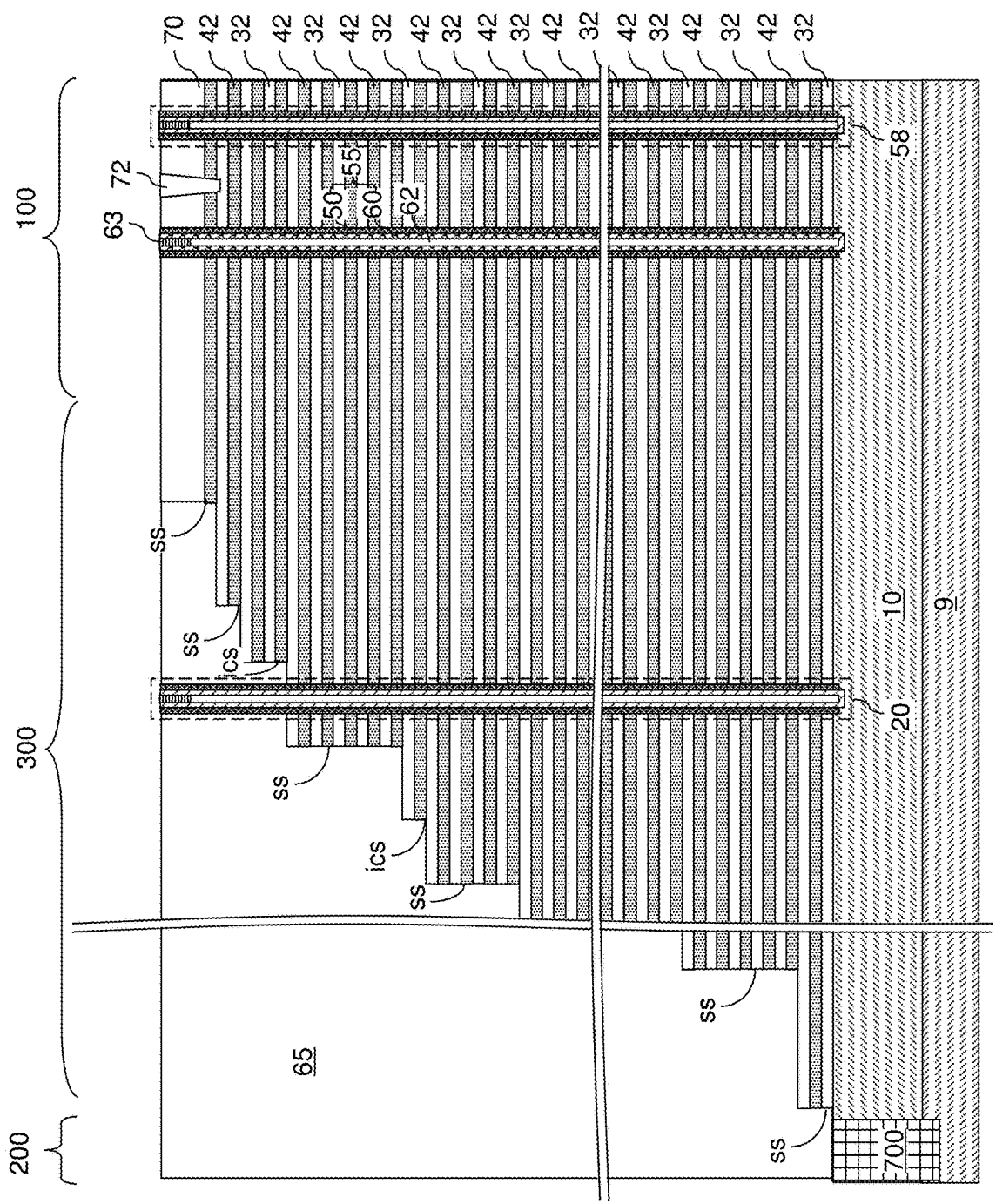
FIG. 12A is a schematic vertical cross-sectional view of the exemplary structure after formation of memory stack structures and support pillar structures according to an embodiment of the present disclosure.
Figure 12B:
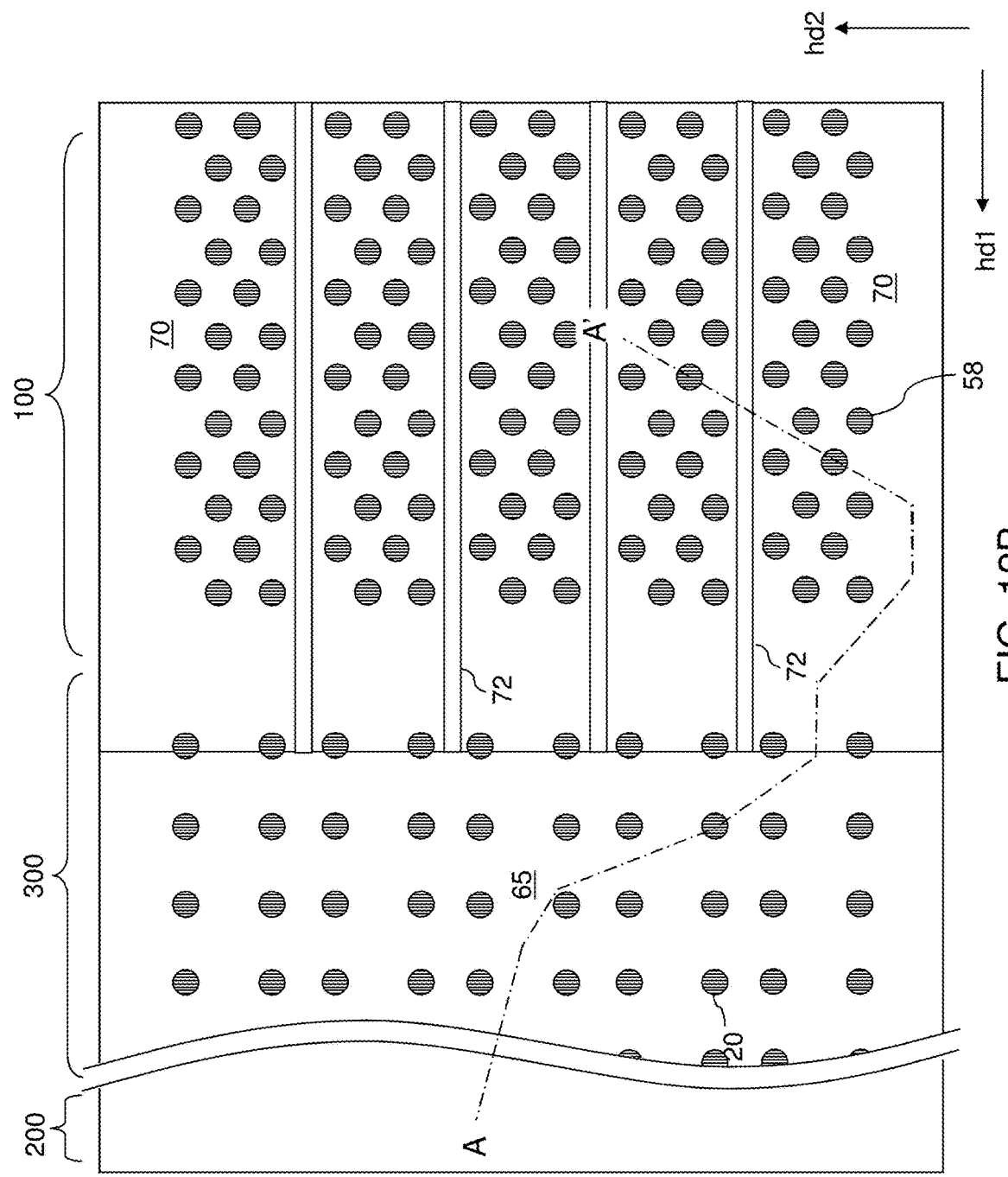
FIG. 12B is a top-down view of the exemplary structure of FIG. 12A. The vertical plane A-A' is the plane of the cross-section for FIG. 12A.

Referring to FIGS. 12A and 12B, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 10A and 10B. An instance of the support pillar structure 20 can be formed within each support opening 19 of the structure of FIGS. 10A and 10B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 13A:
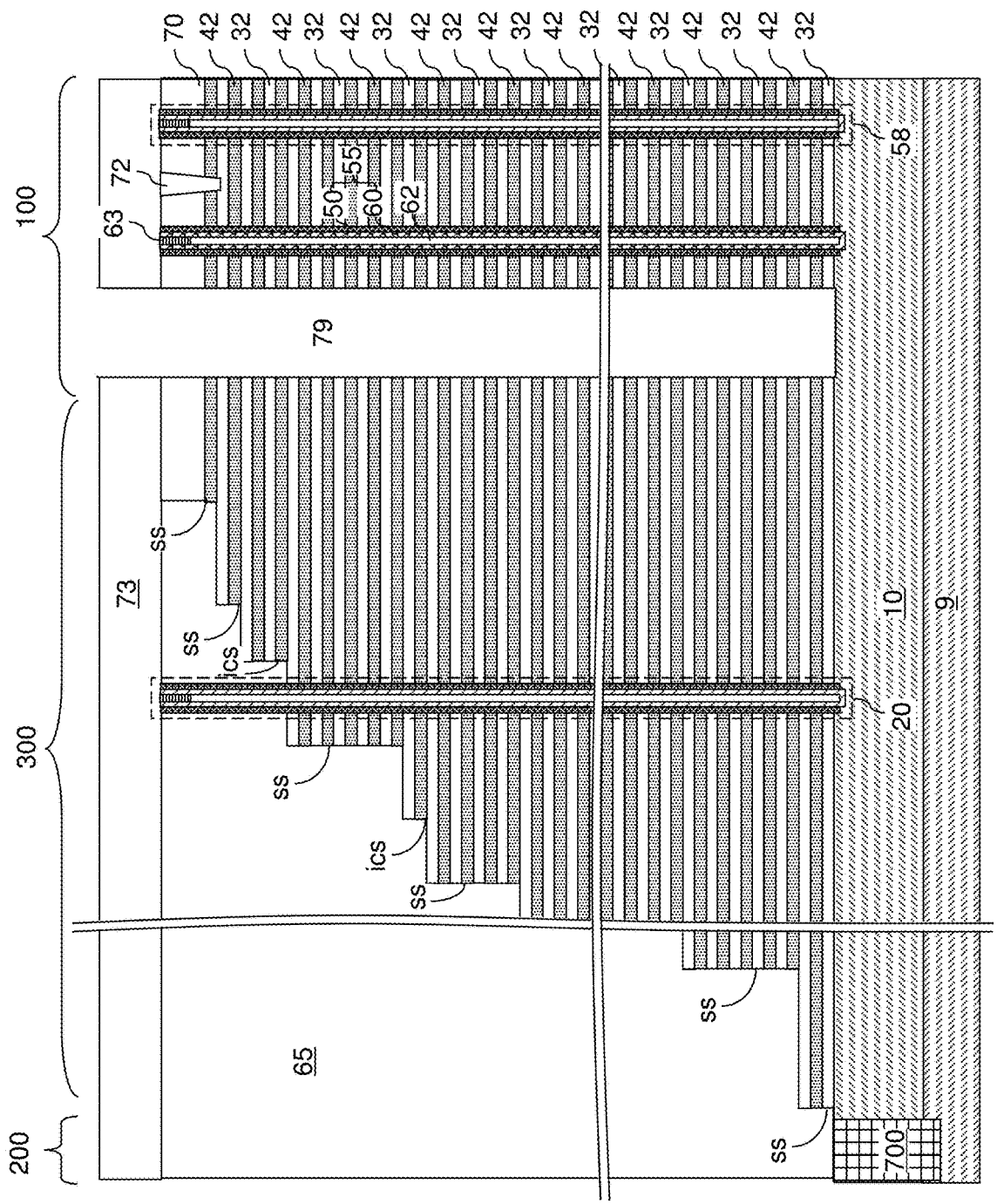
FIG. 13A is a schematic vertical cross-sectional view of the exemplary structure after formation of backside trenches according to an embodiment of the present disclosure.
Figure 13B:
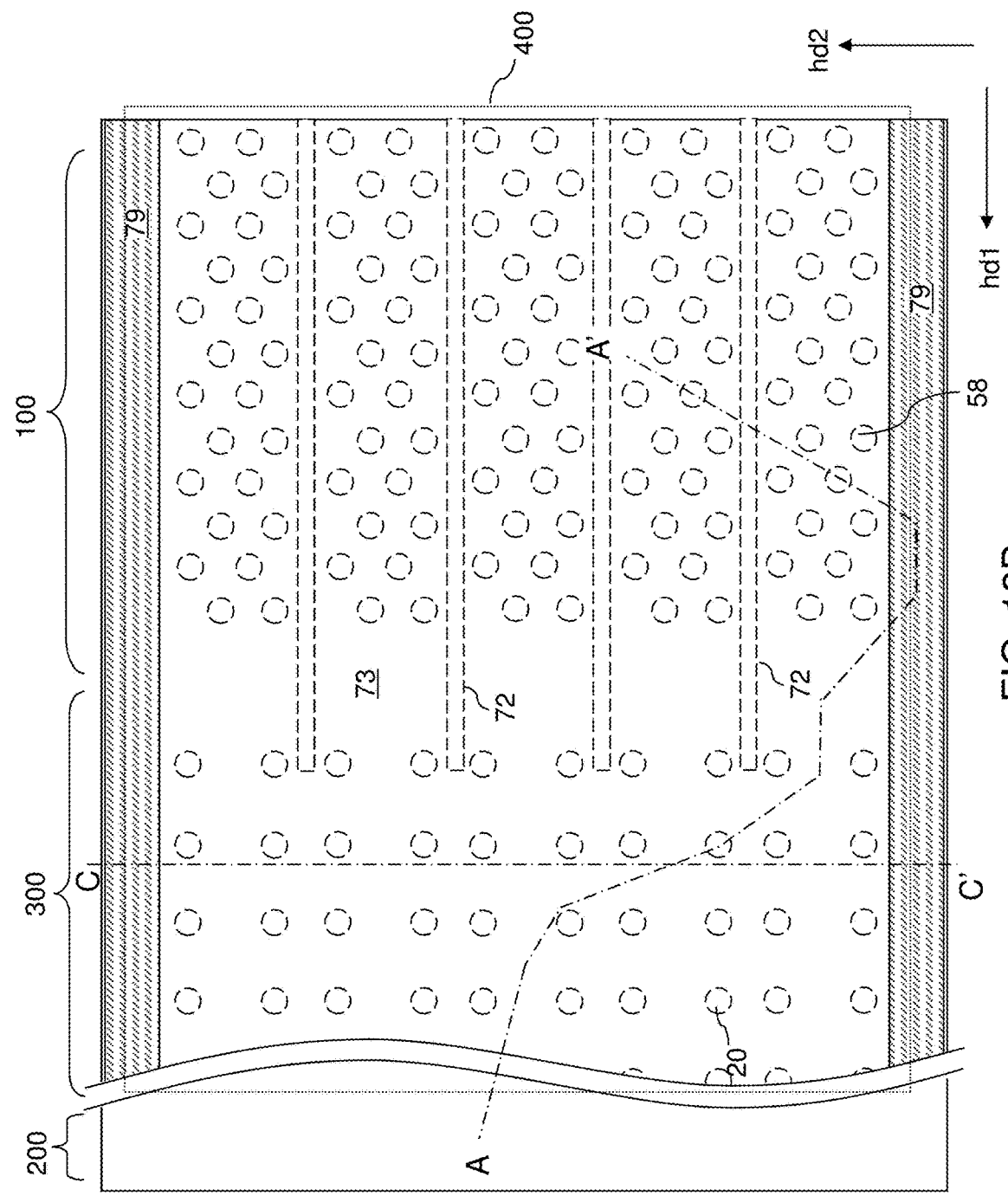
FIG. 13B is a partial see-through top-down view of the exemplary structure of FIG. 13A. The vertical plane A-A' is the plane of the schematic vertical cross-sectional view of FIG. 13A.
Figure 13C:
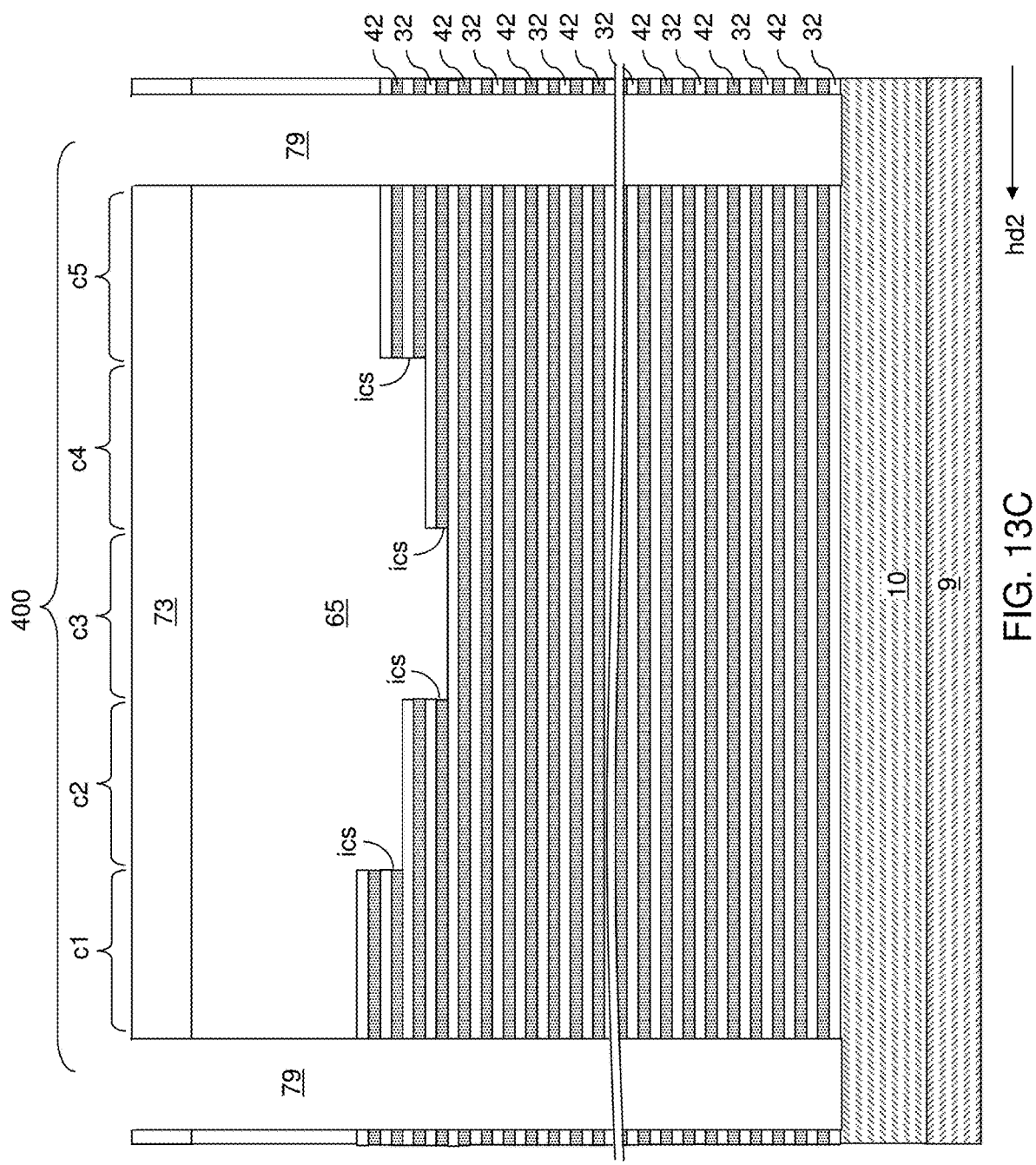
FIG. 13C is a vertical cross-sectional view along the vertical plane C-C' in FIG. 13B.

Referring to FIGS. 13A-13C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form line openings in areas between clusters of memory stack structures 55. The pattern in the photoresist layer can be transferred through the contact level dielectric layer 73, the alternating stack (32, 42) and the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. The backside trenches 79 can be line trenches having a uniform width throughout.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing. The area between the nearest neighbor backside trenches 79 corresponds to one memory string 400 (e.g., string 0, string 1, etc.) of a memory plane.

The backside trenches 79 divide the vertically alternating sequence of the continuous insulating layers 32 and the continuous sacrificial material layers 42 into a plurality of alternating stacks (32, 42) of insulating layers 32 and sacrificial material layers 42. The backside trenches 79 can be line trenches laterally extending along the first horizontal direction hd1. The locations of the backside trenches 79 can be selected such that a set of N column stair regions (c1-c5) is provided between each neighboring pair of backside trenches 79. The N column stair regions (c1-c5) are vertically offset among one another such that (N−1) inter-column vertical steps ics are provided between neighboring column stairs within each alternating stack (32, 42). In one embodiment, the (N−1) inter-column vertical steps ics comprises one single level inter-column vertical step (and (N−2) double level inter-column vertical steps. In the one single level inter-column step (such as the inter-column vertical step ics between the third column stair region c3 and the fourth column stair region c4 illustrated in FIG. 13C), a height of top surfaces of an alternating stack (32, 42) changes by a vertical distance between vertically neighboring top surfaces of insulating layers 32 of the alternating stack (32, 42). In each double level inter-column vertical step, a height of top surfaces of the alternating stack (32, 42) changes by twice the vertical distance between vertically neighboring top surfaces of the insulating layers 32 within the alternating stack (32, 42).

The locations of the backside trenches 79 are selected such that each column stair (such as a first column stair c1 or an N-th column stair such as c5) having a pair of downward steps to neighboring column stairs in a vertical cross-sectional view (such as the vertical cross-sectional view of FIG. 13C) perpendicular to the first horizontal direction hd1 is divided into two portions by a respective one of the backside trenches 79. In one embodiment, for each alternating stack (32, 42), a group of N column stairs of the alternating stack (32, 42) are adjoined among one another between a respective neighboring pair of line trenches (i.e., backside trenches 79) including a respective first line trench and a respective second line trench that border the alternating stack (32, 42).

The top surfaces of each group of N column stairs have vertical cross-sectional profiles along vertical cross-sectional planes that are perpendicular to the first horizontal direction hd1 such that each of the vertical cross-sectional profiles is a juxtaposition of a stepwise decreasing profile and a stepwise increasing profile. In an illustrative example, the portion of the vertical cross-sectional profile between the left-side backside trench 79 in FIG. 13C and the third column stair region c3 is a stepwise decreasing profile, and the portion of the vertical cross-sectional profile between the third column stair region c3 and the right-side backside trench 79 in FIG. 13C is a stepwise increasing profile. Generally, the stepwise decreasing profile continuously extends from the respective first line trench (such as the left-side backside trench 79 in FIG. 13C) to the stepwise increasing profile and the stepwise increasing profile continuously extends to the respective second line trench (such as the right-side backside trench 79 in FIG. 13C) within the vertical cross-sectional profile for each of the vertical cross-sectional profiles.

Thus, as shown in FIG. 13C, the corresponding steps of stair columns of the same memory string 400 are arranged in a "tick-tock" configuration in which the height of each step in the same horizontal plane which extends parallel to the bit line direction and perpendicular to the word line direction (i.e., the plane of view in FIG. 13C) decreases by one unit from the first end stair column (e.g., c1) to the second end column (e.g., c5) and decreases by one unit from the second end column (c5) to the first middle column (e.g., c2) closest to the first edge column (c1). If there are more than three stair columns, then the height of each step in the same horizontal plane which extends parallel to the bit line direction and perpendicular to the word line direction decreases by one unit from the first middle column (c2) to the second middle column (e.g., c4) adjacent to the second end column (c5), and decreases by one unit from the second middle column (c4) to a third middle column (e.g., c3) which is adjacent to the first middle column, and so on, depending on the number of stair columns. In one embodiment, one unit can be a pair of an adjacent insulating layer 32 and sacrificial material layer 42. However, in other embodiments, one unit can include two or more pairs of insulating and sacrificial material layers (32, 42).

Figure 14A:
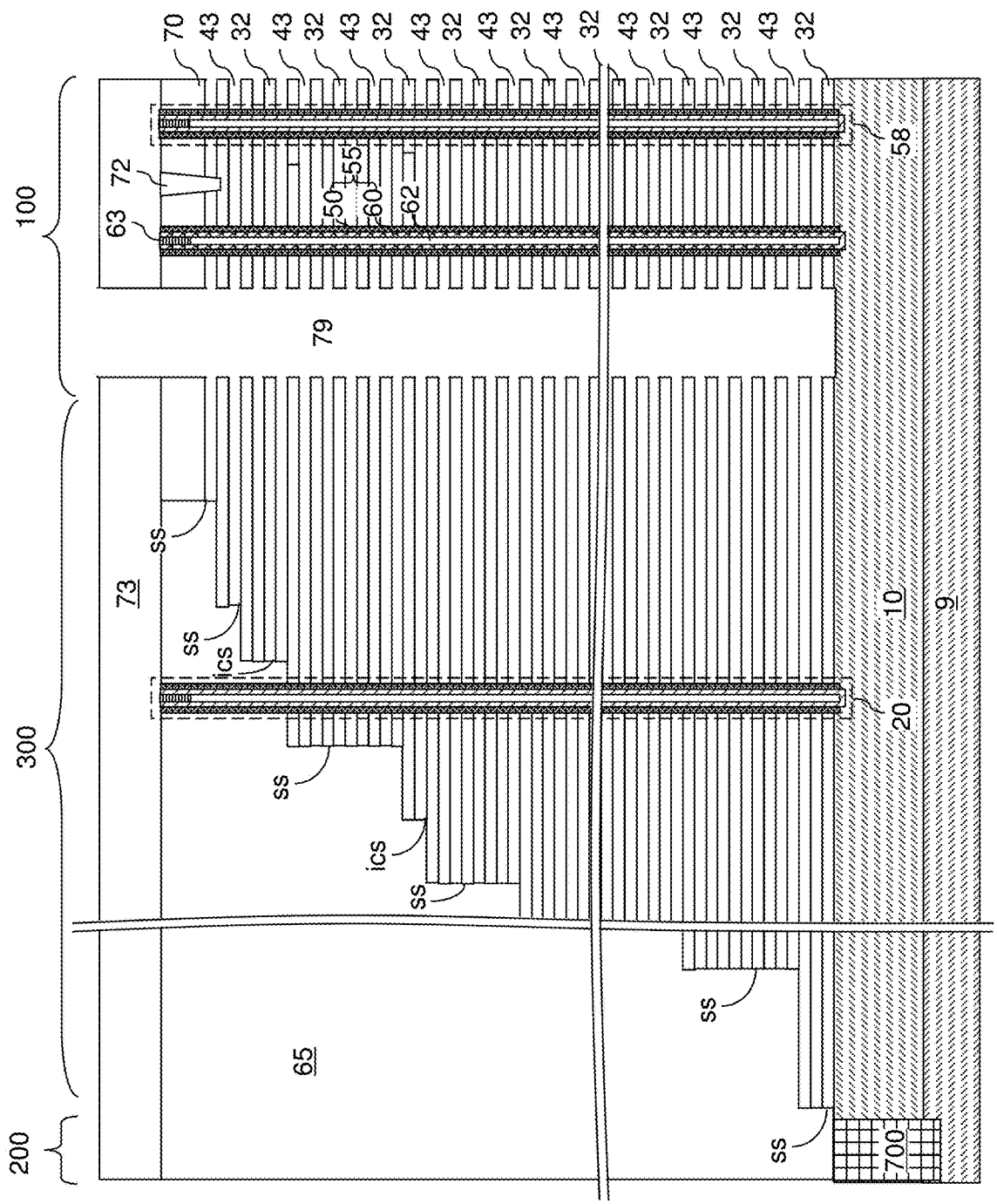
FIG. 14A is a schematic vertical cross-sectional view of the exemplary structure after formation of backside recesses according to an embodiment of the present disclosure.
Figure 14B:
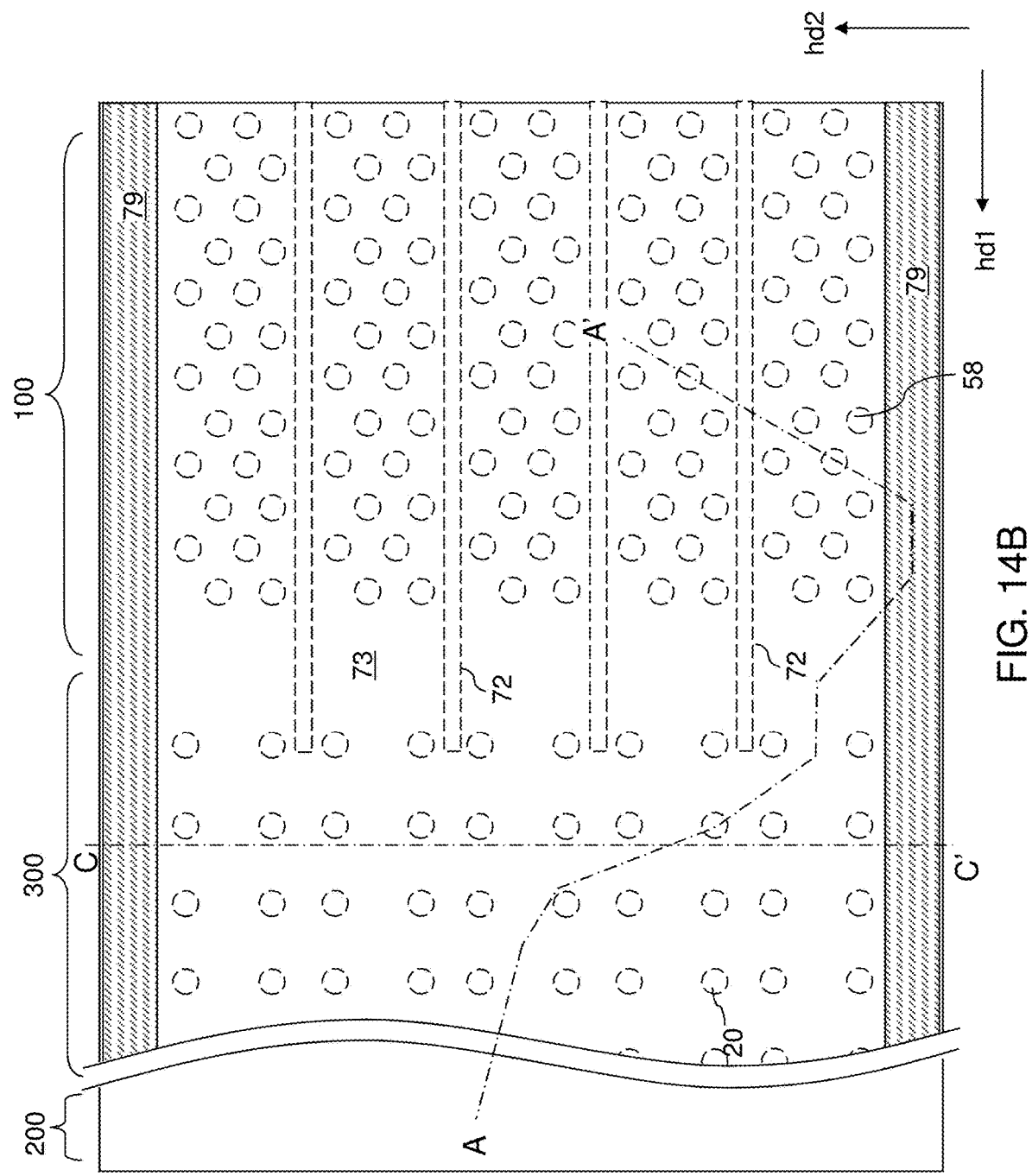
FIG. 14B is a partial see-through top-down view of the exemplary structure of FIG. 14A. The vertical plane A-A' is the plane of the schematic vertical cross-sectional view of FIG. 14A.

Referring to FIGS. 14A-14C, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

According to an aspect of the present disclosure, the lateral etch distance to completely remove the sacrificial material layers 42 is not more than one half of the lateral separation distance between a neighboring pair of backside trenches 79. The various configurations of the vertically stepped surfaces in the contact region 300 according to embodiments of the present disclosure can limit the lateral etch distance for formation of the backside recesses 43.

The advantages of embodiments of the present disclosure over comparative exemplary structures are illustrated employing pairs of a configuration according to an embodiment of the present disclosure and a comparative exemplary structure. In each comparative exemplary structure, a single level step height change is employed between neighboring column stairs as known in the art. Thus, the step height only increases or only decreases at each inter-column step between a neighboring pair of backside trenches 79 in the comparative exemplary structures.

Figure 16A:
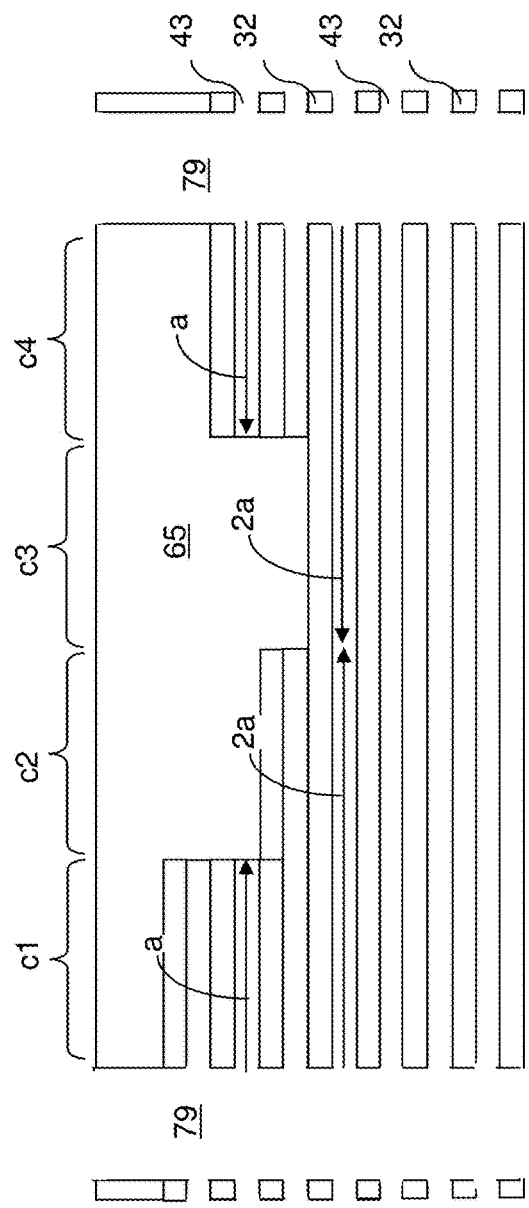
FIG. 16A is a schematic vertical cross-sectional view of a second configuration of the exemplary structure after formation of backside recesses according to an embodiment of the present disclosure.
Figure 16B:
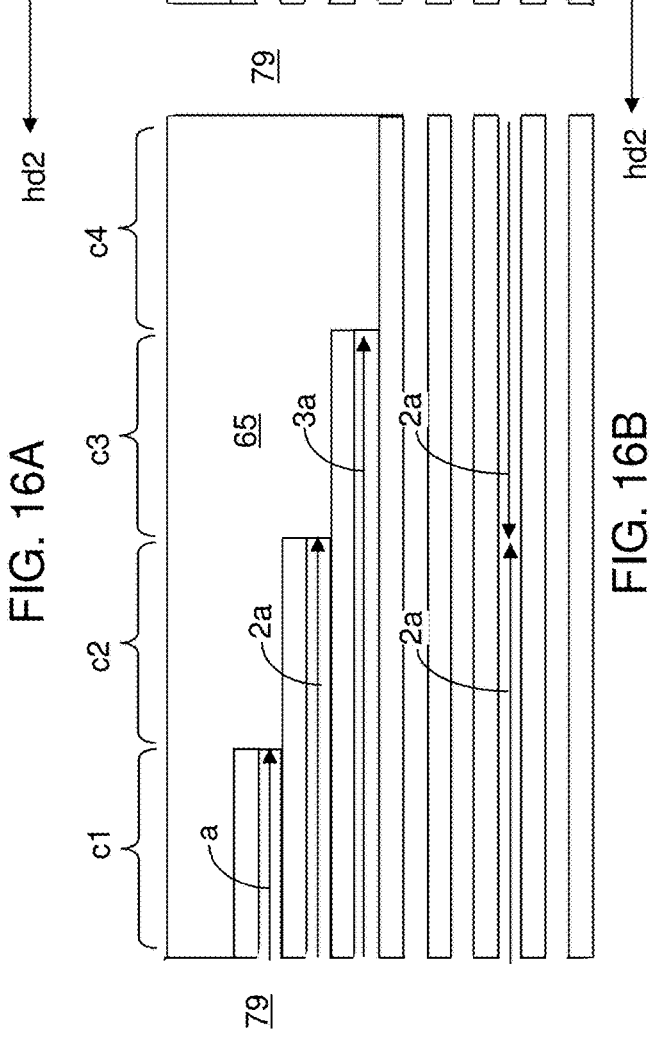
FIG. 16B is a schematic vertical cross-sectional view of a second comparative exemplary structure after formation of backside recesses.

FIG. 15A illustrates a first configuration of the exemplary structure according to an embodiment of the present disclosure for the case in which N=5, and FIG. 15B illustrates a first comparative exemplary structure after formation of backside recesses 43 in which N=5. FIG. 16A illustrates a second configuration of the exemplary structure according to an embodiment of the present disclosure for the case in which N=4, and FIG. 16B illustrates a second comparative exemplary structure after formation of backside recesses 43 in which N=4. FIG. 17A illustrates a third configuration of the exemplary structure according to an embodiment of the present disclosure for the case in which N=3, and FIG. 17B illustrates a third comparative exemplary structure after formation of backside recesses 43 in which N=3.

Each column stair region (c1-c5) can have a column stair width "a" along the second horizontal direction hd2. The height of the top surface of the column stairs changes by two levels except for one inter-column step adjoined to a bottommost insulating layer 32 among N top surfaces of the insulating layers 32 that contact the retro-stepped dielectric material portion 65 within vertical cross-sectional views along the second horizontal direction hd2. The lateral etch distance for the sacrificial material layers 42 can be N times a divided by 2 in the first, second, and third configurations of the exemplary structure. In contrast, the lateral etch distance for the sacrificial material layers 42 can be (N−1) times "a" in the first, second, and third comparative exemplary structures. For each integer N greater than 2, N times "a" divided by 2 is less than (N−1) times "a".

Figure 18:
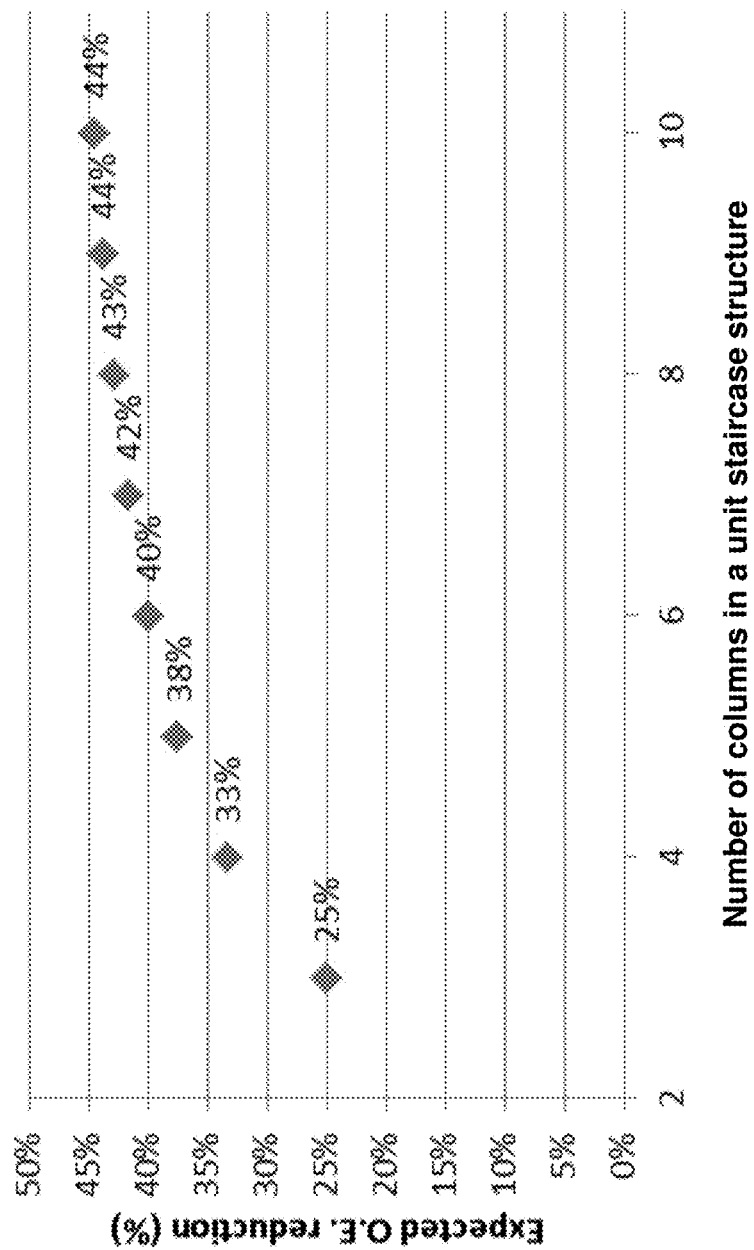
FIG. 18 is a graph illustrating overetch reduction during formation of backside recessed that can be achieved by employing configurations of the present disclosure relative to comparative exemplary configurations.

FIG. 18 shows the percentage reduction in the lateral etch distance for the configurations of the present disclosure relative to the required lateral etch distance for a comparative exemplary structure including a same number of column stairs between a neighboring pair of backside trenches 79. In this case, the percentage reduction is given by $\{[(N-1) \times a - (N \times a)/2]/[(N-1) \times a]\} \times 100\%$. As the total number N of column stairs between a pair of backside trenches 79 increases, the percentage reduction increases more.

Figure 19A:
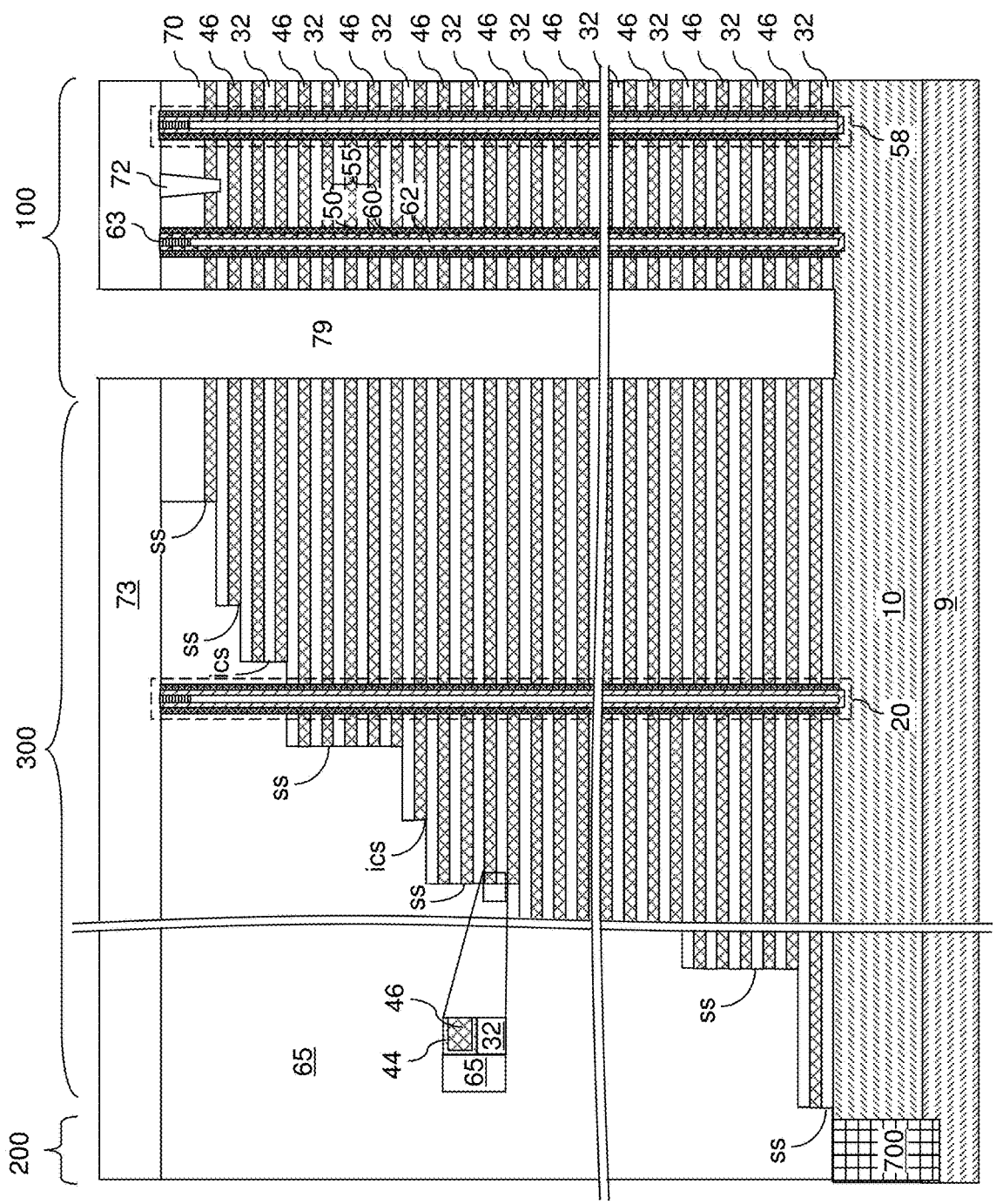
FIG. 19A is a schematic vertical cross-sectional view of the exemplary structure after formation of electrically conductive layers according to an embodiment of the present disclosure.
Figure 19B:
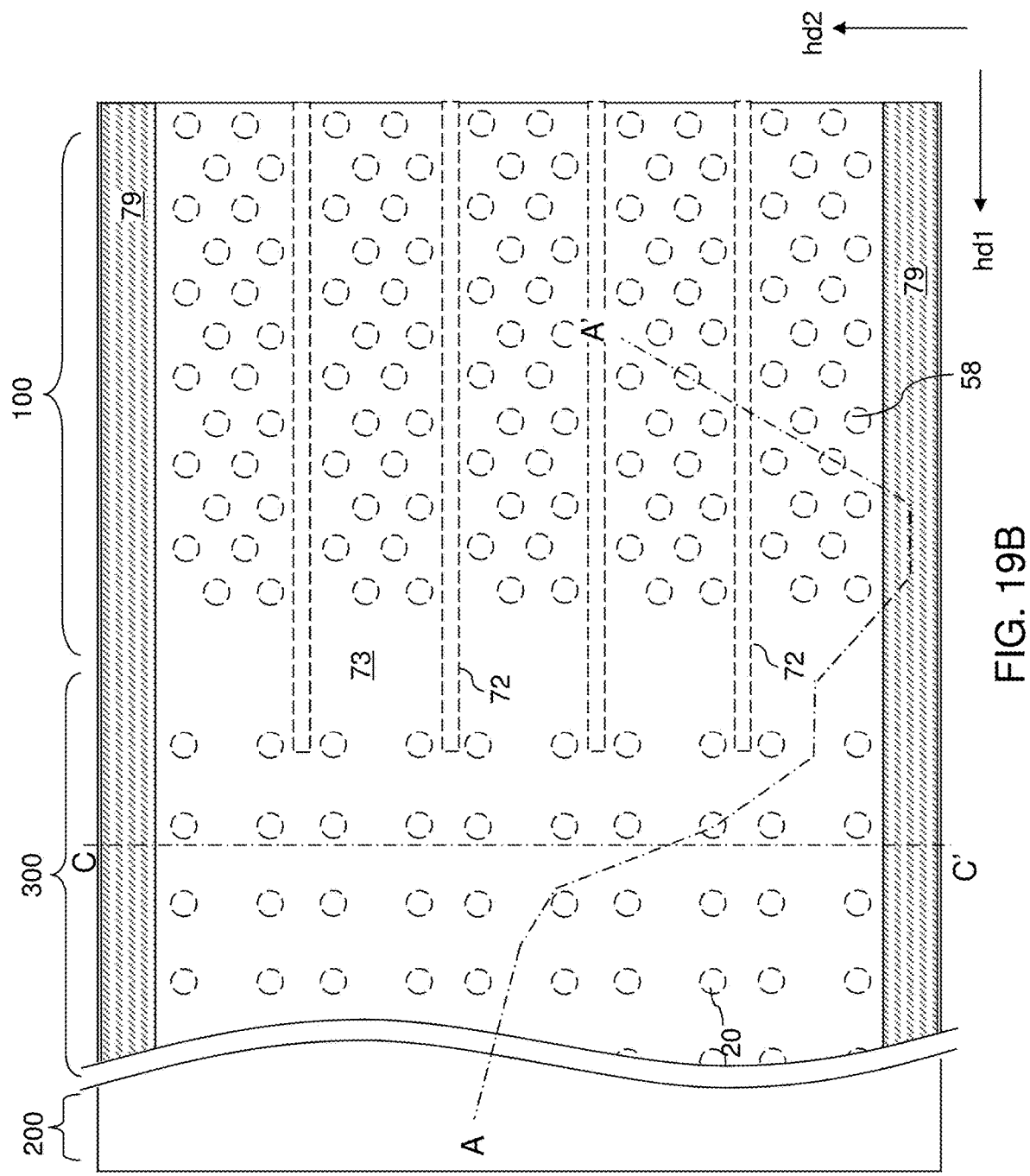
FIG. 19B is a partial see-through top-down view of the exemplary structure of FIG. 19A. The vertical plane A-A' is the plane of the schematic vertical cross-sectional view of FIG. 19A.
Figure 19C:
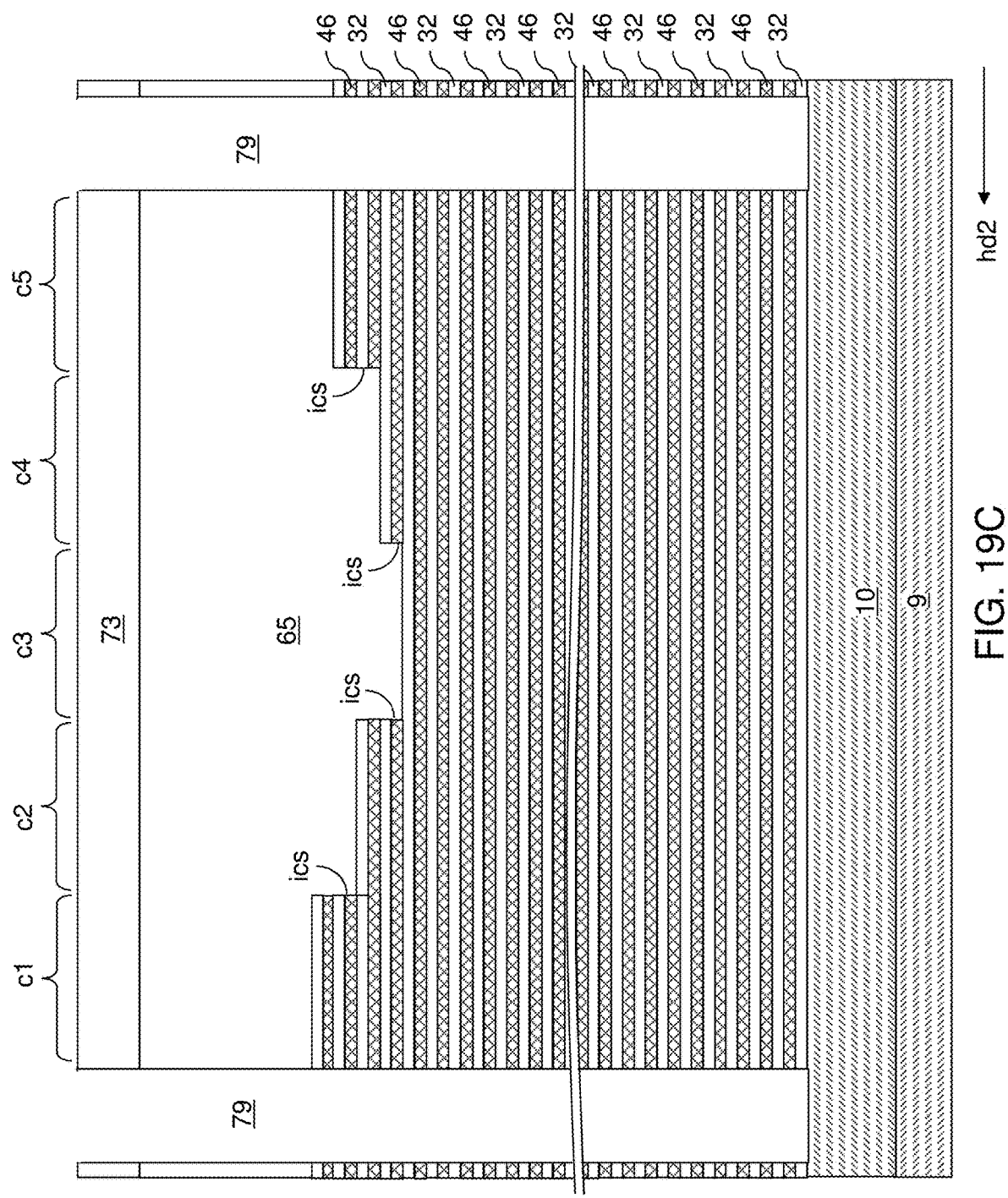
FIG. 19C is a vertical cross-sectional view along the vertical plane C-C' in FIG. 19B.

Referring to FIGS. 19A-19C, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

A metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact level dielectric layer 73. Each sacrificial material layer 42 can be replaced with an electrically conductive layer 46. A backside cavity 79' is present in the portion of each backside trench 79 that is not filled with the backside blocking dielectric layer 44 and the continuous metallic material layer.

the deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. The planar dielectric portions 616 can be removed during removal of the continuous electrically conductive material layer. A backside cavity 79' is present within each backside trench 79.

Multiple alternating stacks of insulating layers 32 and electrically conductive layers 46 are formed over the substrate (9, 10). Each insulating layer 32 is a patterned portion of a respective continuous insulating layer 32. The alternating stacks (32, 42) are laterally spaced among one another by the backside trenches 79. Each alternating stack (32, 42) includes a group of N column stairs, and each column stair within each group of N column stairs has a respective set of intra-column stepped surfaces ss that continuously extends from a bottommost layer to a topmost layer within each alternating stack (32, 42) with stepwise height increases along the first horizontal direction hd1.

In one embodiment, each vertical cross-sectional view that is parallel to the second horizontal direction hd2 and perpendicular to the first horizontal direction hd1 and cuts through each column stair within a group of N column stairs includes a juxtaposition of a respective stepwise decreasing profile and a respective stepwise increasing profile between the respective first backside trench 79 and the respective second backside trench 79. In one embodiment, each of vertical cross-sectional profiles has N different top surfaces of each alternating stack (32, 42). The N different top surfaces of each alternating stack (32, 42) can be top surfaces of N vertically consecutive insulating layers 32 within each alternating stack (32, 42), top surfaces of N vertically consecutive electrically conductive layers 46 within each alternating stack (32, 46), or top surfaces of N vertically consecutive backside blocking dielectric layers 44 enclosing N vertically consecutive electrically conductive layers 46. The steps in the stair columns c1 to c5 are arranged in the "tick-tock" configuration described above, in which one unit can be a pair of an adjacent insulating layer 32 and electrically conductive layer 46. However, in other embodiments, one unit can include two or more pairs of insulating and electrically conductive layers (32, 46).

In one embodiment, each of the vertical cross-sectional profiles has (N−1) inter-column vertical steps ics between neighboring column stairs for each alternating stack (32, 46). In one embodiment, the (N−1) inter-column vertical steps comprises: one single level inter-column vertical step ics at which a height of top surfaces of a respective alternating stack changes by a vertical distance between vertically neighboring top surfaces of insulating layers 32 of the respective alternating stack (32, 42), and (N−2) double level inter-column vertical steps at which a height of top surfaces of the respective alternating stack (32, 42) changes by twice the vertical distance between vertically neighboring top surfaces of the insulating layers 32 within the respective alternating stack (32, 42).

Figure 20A:
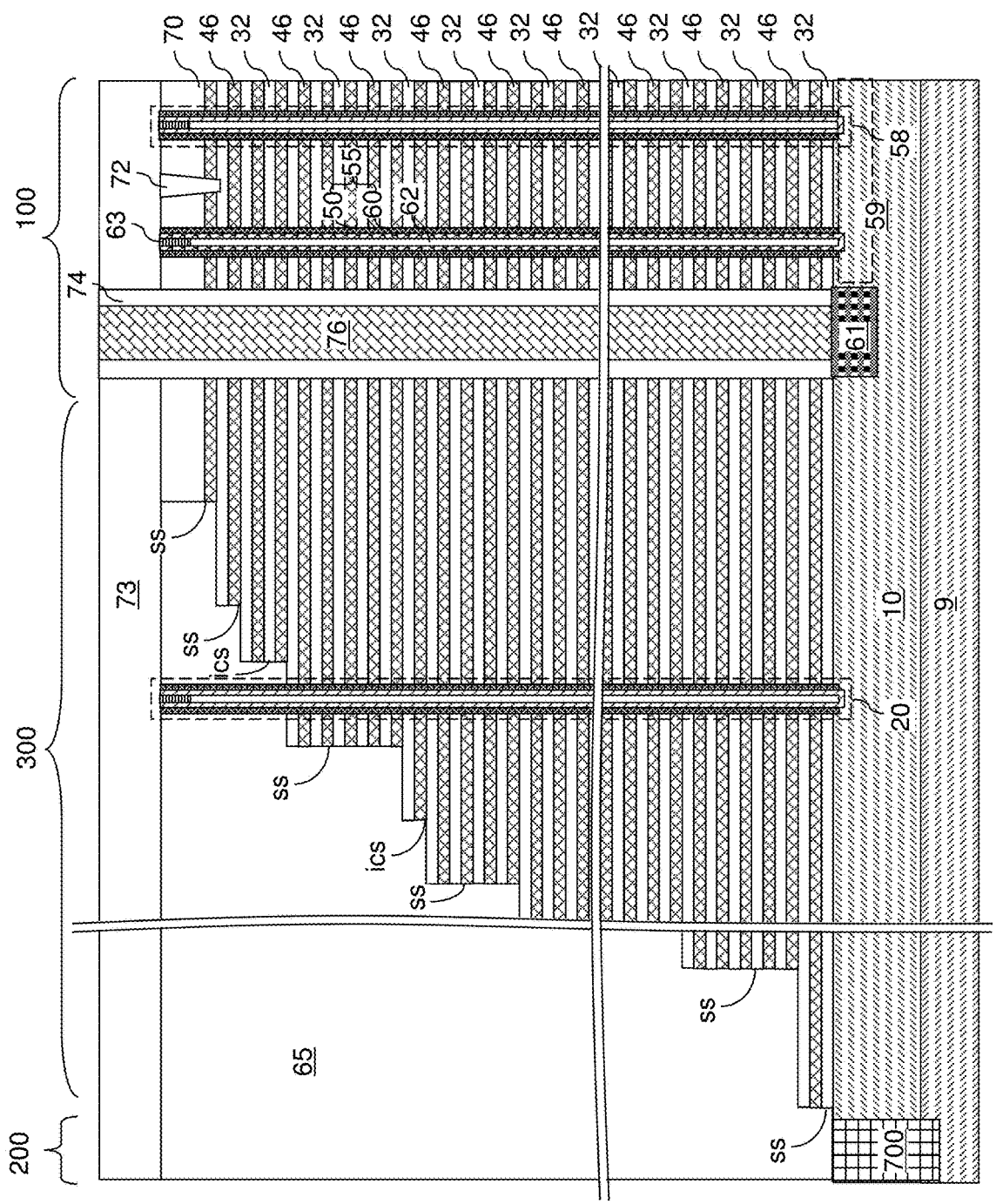
FIG. 20A is a schematic vertical cross-sectional view of the exemplary structure after formation of source regions, insulating spacers, and backside contact via structures according to an embodiment of the present disclosure.
Figure 20B:
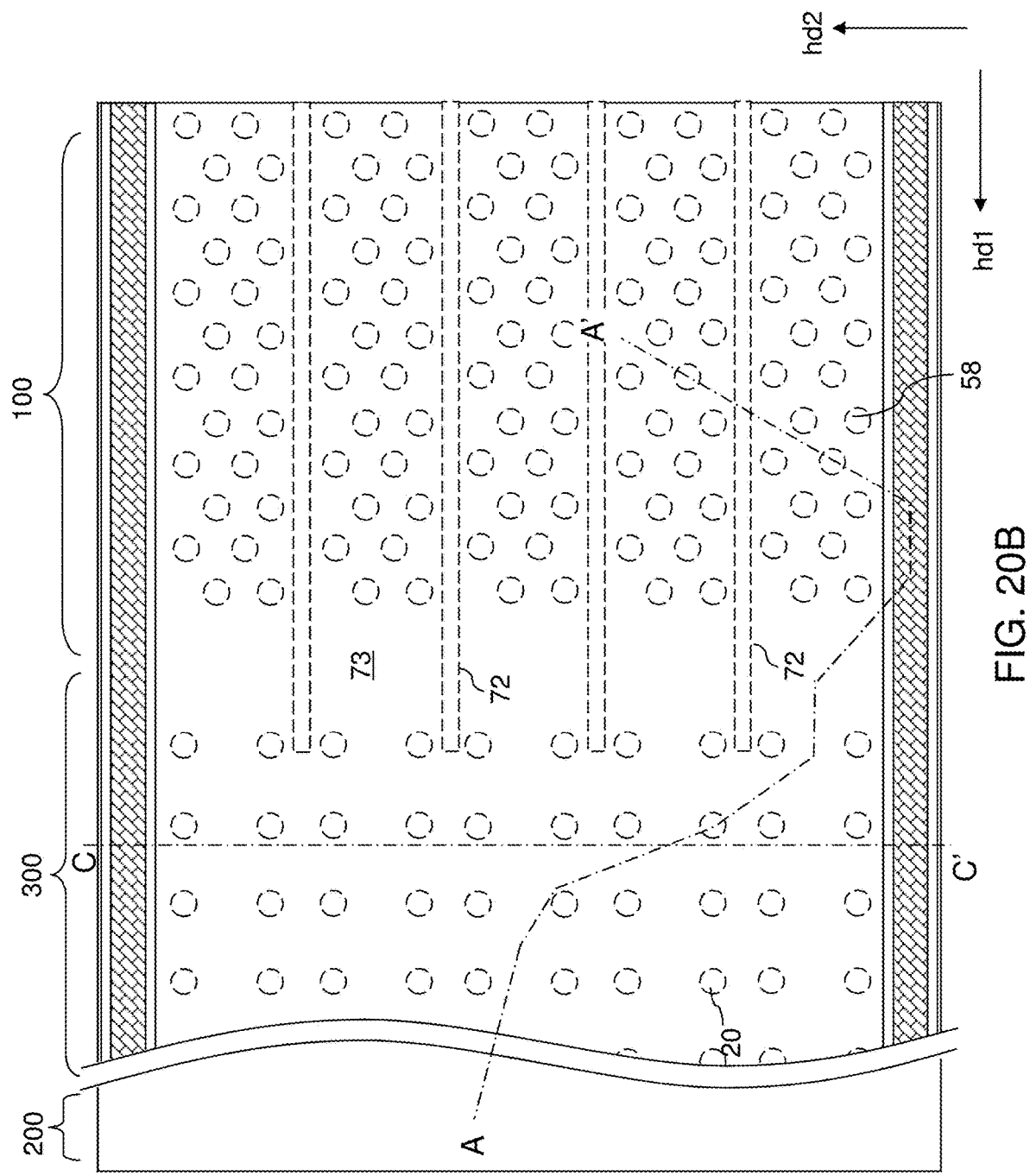
FIG. 20B is a partial see-through top-down view of the exemplary structure of FIG. 20A. The vertical plane A-A' is the plane of the schematic vertical cross-sectional view of FIG. 20A.
Figure 20C:
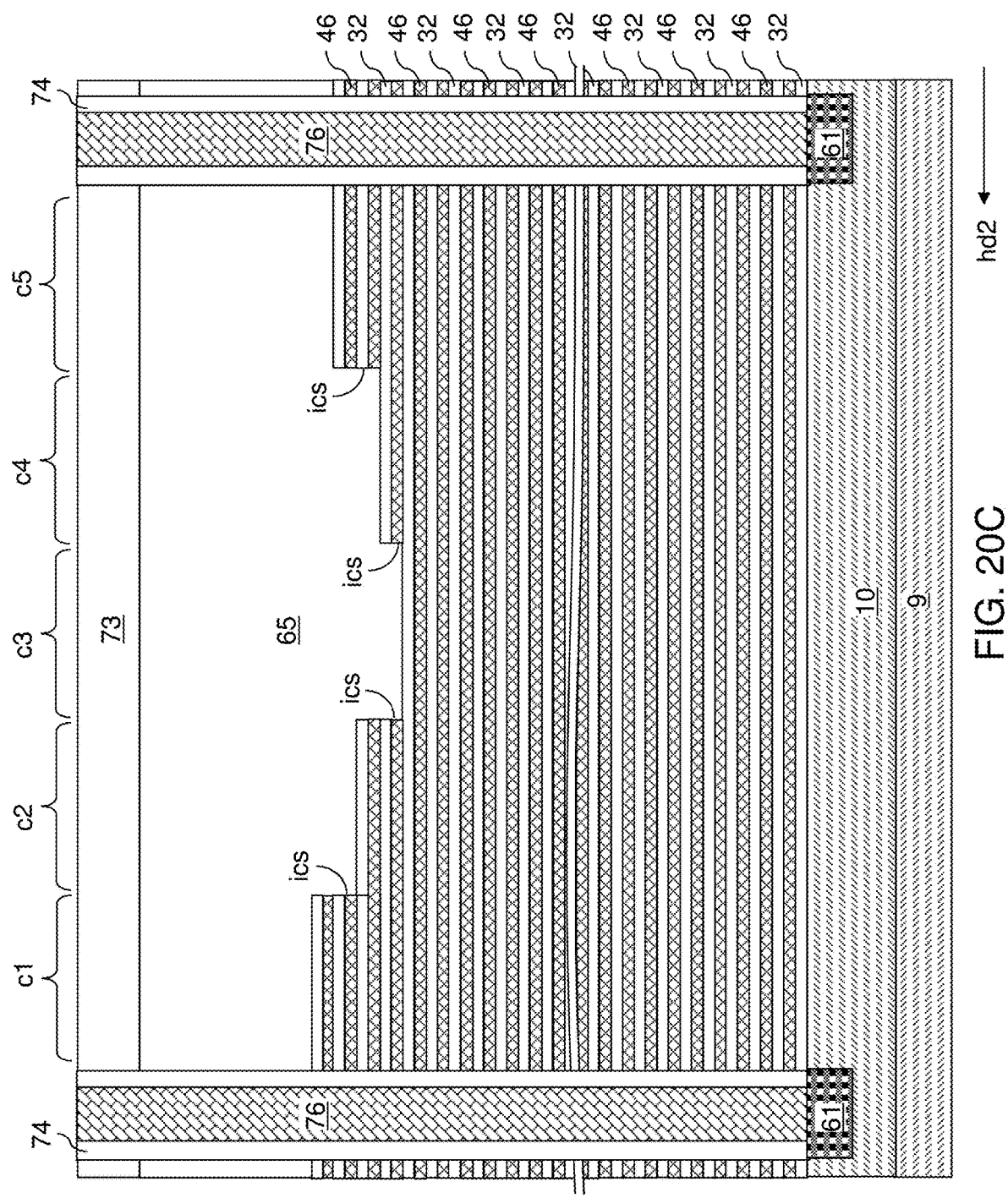
FIG. 20C is a vertical cross-sectional view along the vertical plane C-C' in FIG. 20B.

Referring to FIGS. 20A-20C, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the vertical semiconductor channels 60 constitutes a horizontal semiconductor channel 59 for a plurality of field effect transistors. A bottommost electrically conductive layer 46 provided upon formation of the electrically conductive layers 46 within the alternating stack (32, 46) can comprise a select gate electrode for the field effect transistors.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 21A:
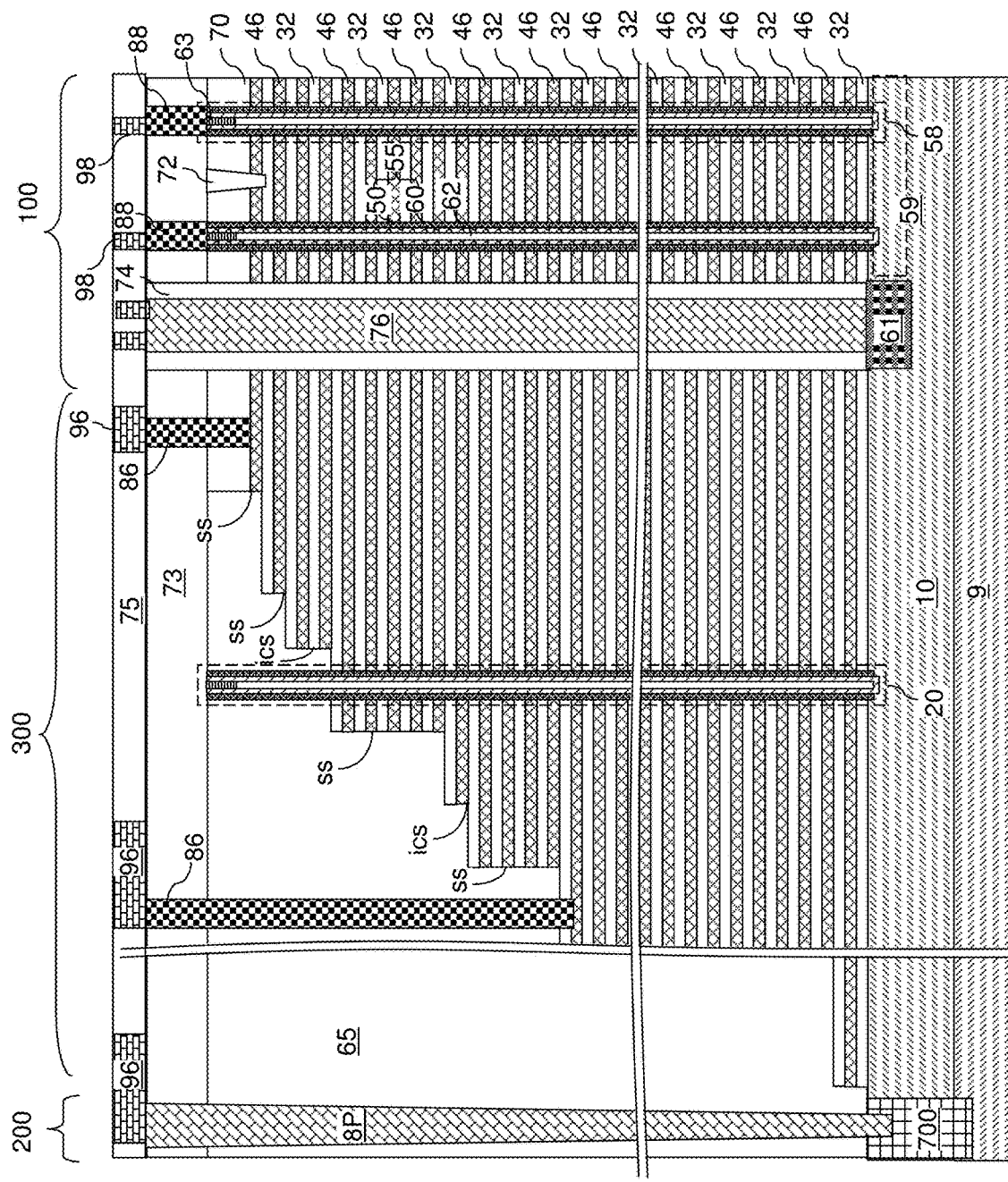
FIG. 21A is a schematic vertical cross-sectional view of the exemplary structure after formation of additional contact via structures according to an embodiment of the present disclosure.
Figure 21B:
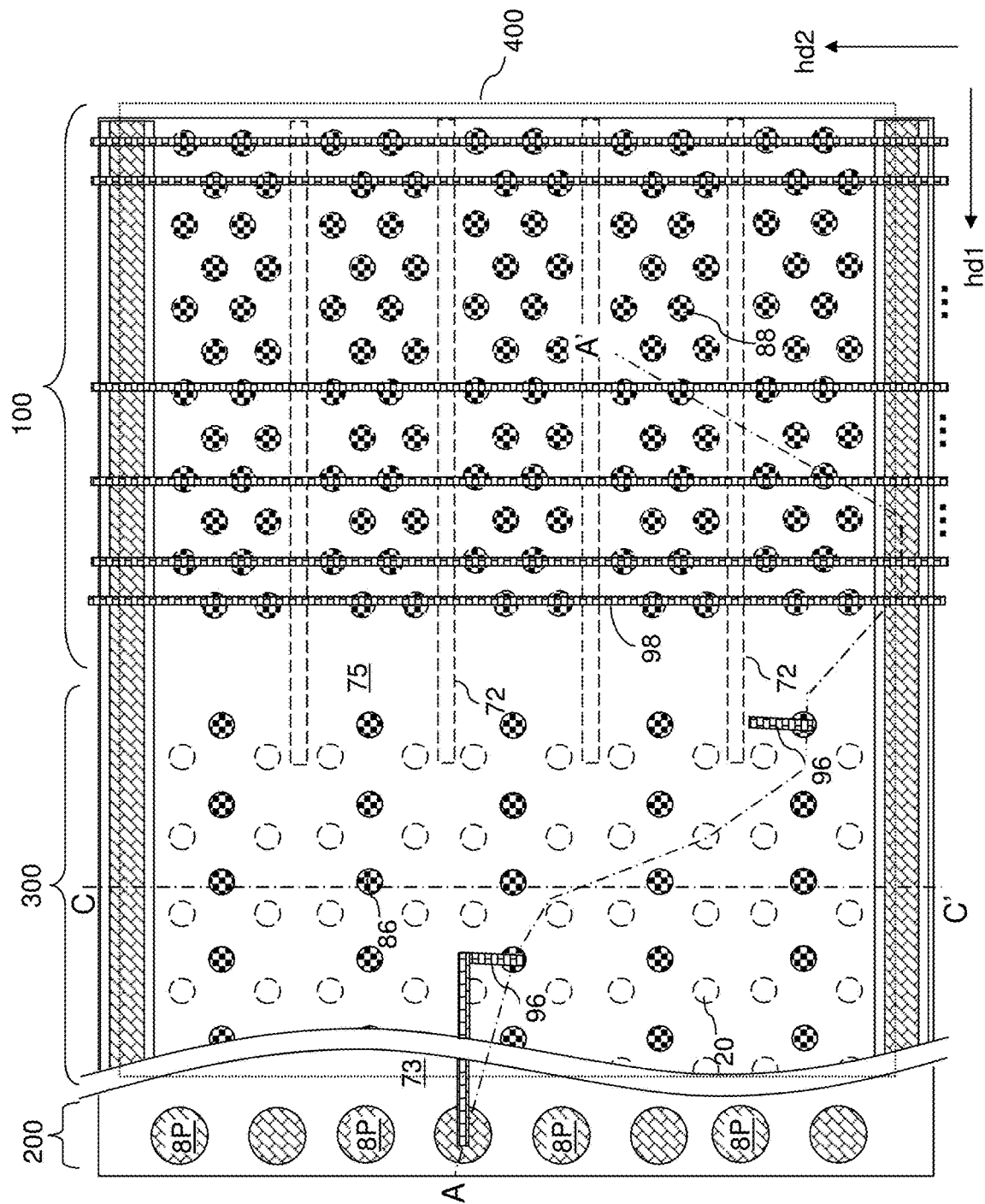
FIG. 21B is a partial see-through top-down view of the exemplary structure of FIG. 21A. The vertical plane A-A' is the plane of the schematic vertical cross-sectional view of FIG. 21A.
Figure 21C:
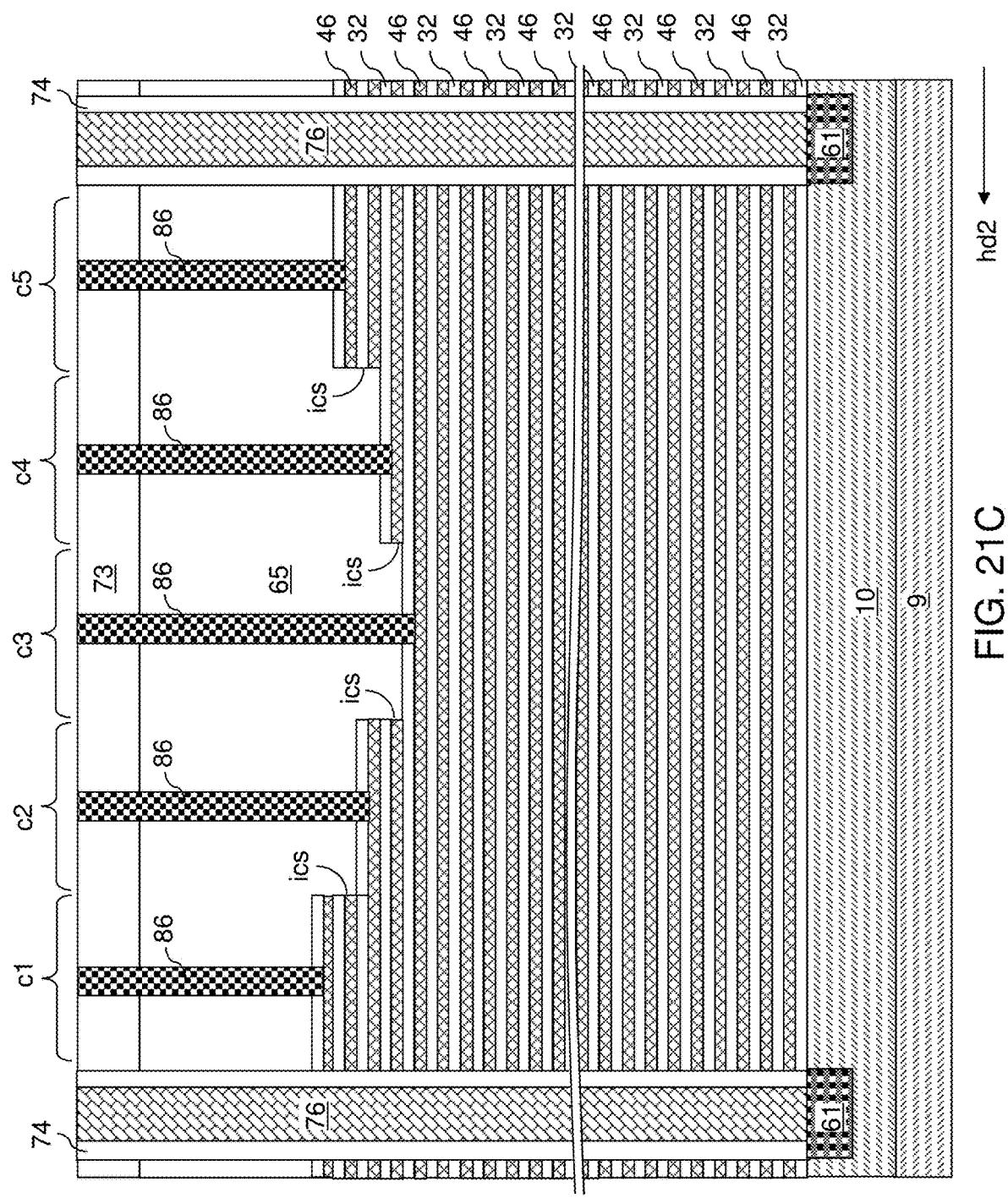
FIG. 21C is a vertical cross-sectional view along the vertical plane C-C' in FIG. 21B.

Referring to FIGS. 21A-21C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

At least one upper interconnect level dielectric layer 75 can be formed over the contact level dielectric layer 73. Various upper interconnect level metal structures can be formed in the at least one upper interconnect level dielectric layer 75. For example, the various upper interconnect level metal structures can include line level metal interconnect structures (96, 98). The line level metal interconnect structures (96, 98) can include upper metal line structures 96 that contact a top surface of a respective one of the peripheral device contact via structures 8P and/or word line contact via structure 86, and bit lines 98 which contact a respective one of the drain contact via structures 88 and extend along the second horizontal direction (e.g., bit line direction) hd2 and perpendicular to the first horizontal direction (e.g., word line direction) hd1.

FIGS. 22-29 illustrate an exemplary processing sequence that can be employed to form vertically offset surfaces at the processing steps of FIGS. 3A-3C in case the number of column stairs per alternating stack (32, 46) of insulating layers 32 and electrically conductive layers 46 is 3. The processing steps of FIGS. 22-29 may be performed repeatedly and/or with modifications to pattern four or more column stairs per alternating stack (32, 46).

Figure 22:
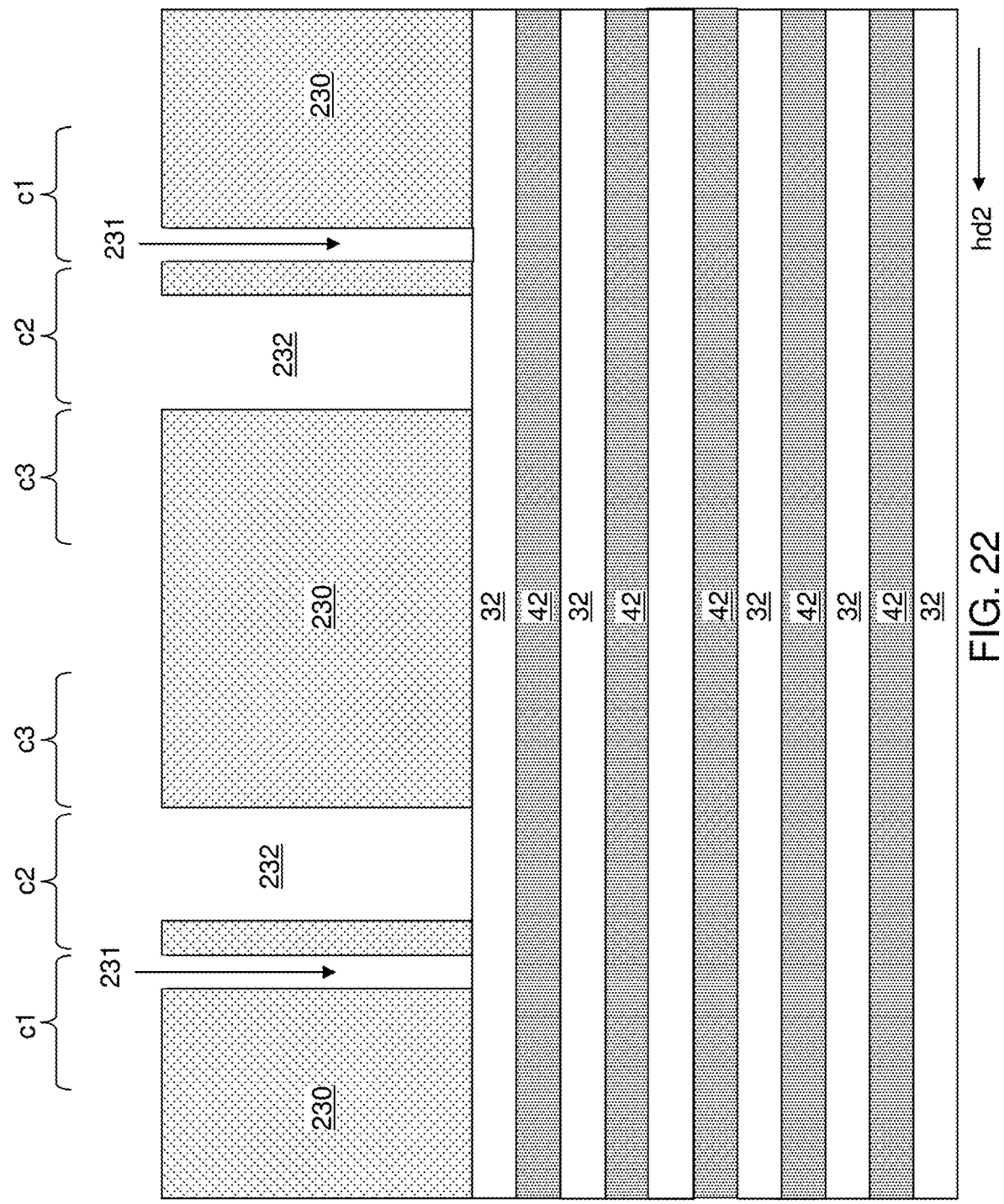
FIG. 22 is a vertical cross-sectional view of the exemplary structure after formation of a patterned trimmable etch mask layer after the processing steps of FIG. 2 and prior to the processing steps of FIGS. 3A and 3C according to an embodiment of the present disclosure.

Referring to FIG. 22, a patterned trimmable etch mask layer 230 (e.g., carbon or photoresist) can be applied over the vertically alternating sequence of continuous insulating layers 32 and continuous sacrificial material layers 42 of the exemplary structure of FIG. 2. The patterned trimmable etch mask layer 230 includes first linear openings 231 having a first width along the second horizontal direction hd2 and extending along the first horizontal direction hd1, and second linear openings 232 having a second width along the second horizontal direction hd2 and extending along the first horizontal direction hd1. The second width is greater than the first width. In one embodiment, the patterned trimmable etch mask layer 230 comprises carbon. In the illustrated exemplary structure of FIG. 22, the first linear openings 231 can be formed in first column stair regions c1, and the second linear openings 232 can be formed in the second column stair regions c2. The exemplary structure of FIG. 22 can be repeated along the second horizontal direction with a periodicity that is equal to twice the lateral separation distance of backside trenches 79 to be subsequently formed.

Figure 23:
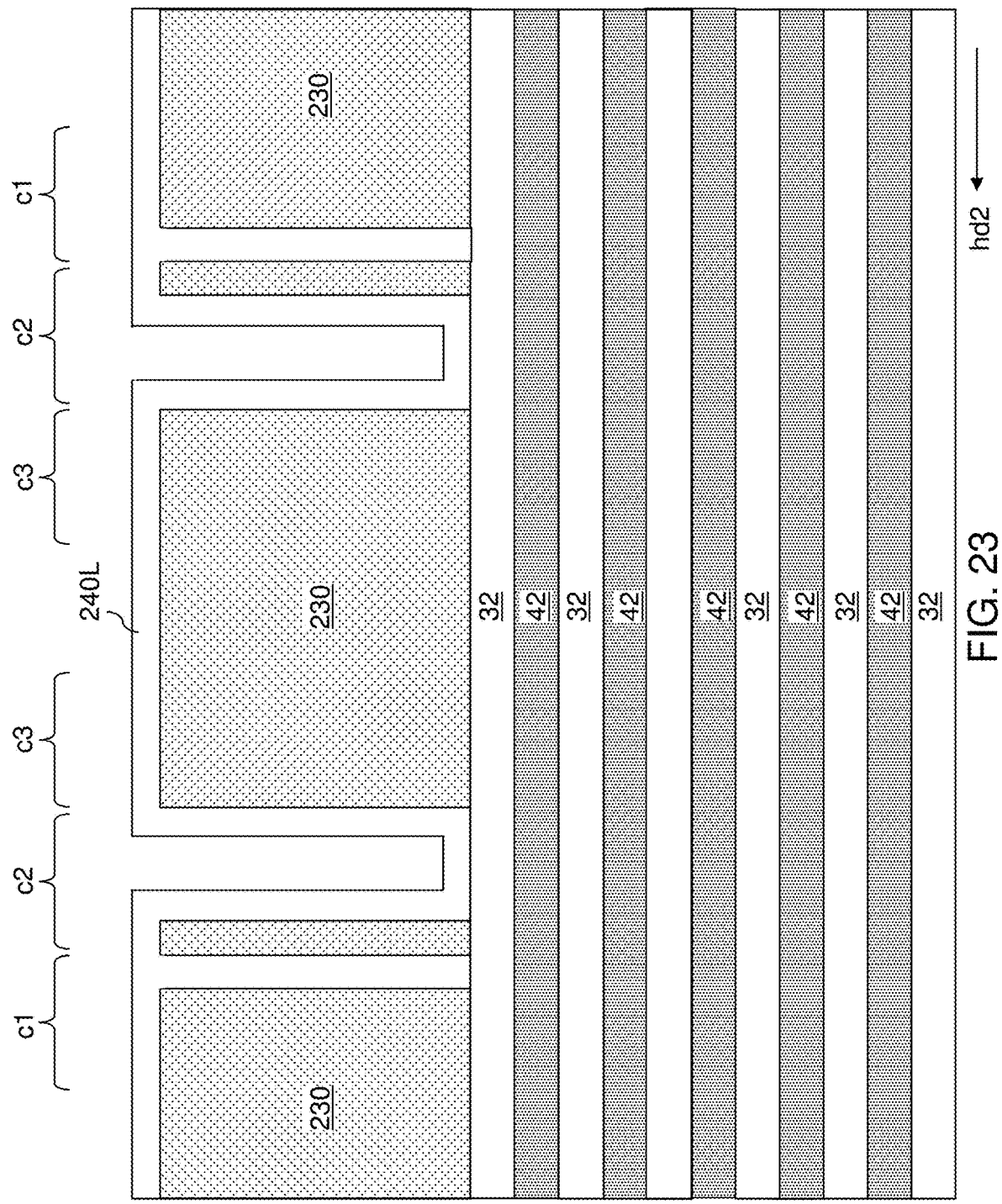
FIG. 23 is a vertical cross-sectional view of the exemplary structure after formation of a conformal dielectric material layer according to an embodiment of the present disclosure.

Referring to FIG. 23, a conformal dielectric material layer 240L can be deposited over the patterned trimmable etch mask layer 230. The conformal dielectric material layer 240L includes a dielectric material such as silicon oxide. For example, low temperature oxide (LTO) can be deposited by thermal decomposition of tetraethylorthosilicate (TEOS) to form the conformal dielectric material layer 240L. The thickness of the conformal dielectric material layer 240L can be selected such that the conformal dielectric material layer 240L fills the first linear openings 231, and does not completely fill the second linear openings 232.

Figure 24:
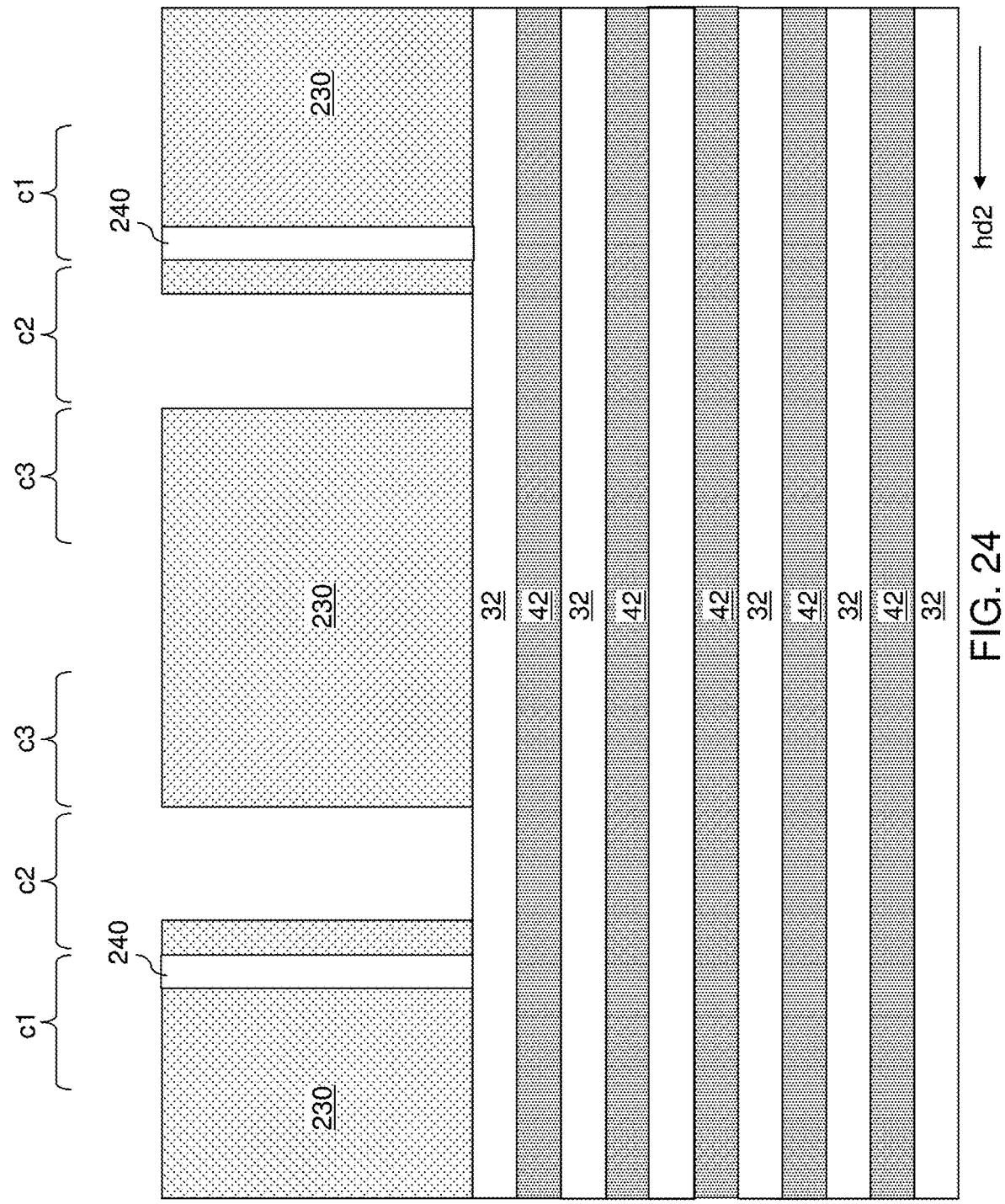
FIG. 24 is a vertical cross-sectional view of the exemplary structure after an isotropic etch process that forms dielectric rails according to an embodiment of the present disclosure.

Referring to FIG. 24, the material of the conformal dielectric material layer 240L can be isotropically etched by an etch back process. For example, a wet etch process employing dilute hydrofluoric acid can be employed to remove portions of the conformal dielectric material layer 240L from the second linear openings 232 and from above the patterned trimmable etch mask layer 230. Each remaining portion of the conformal dielectric material layer 240L constitutes a dielectric rail structure 240.

Figure 25:
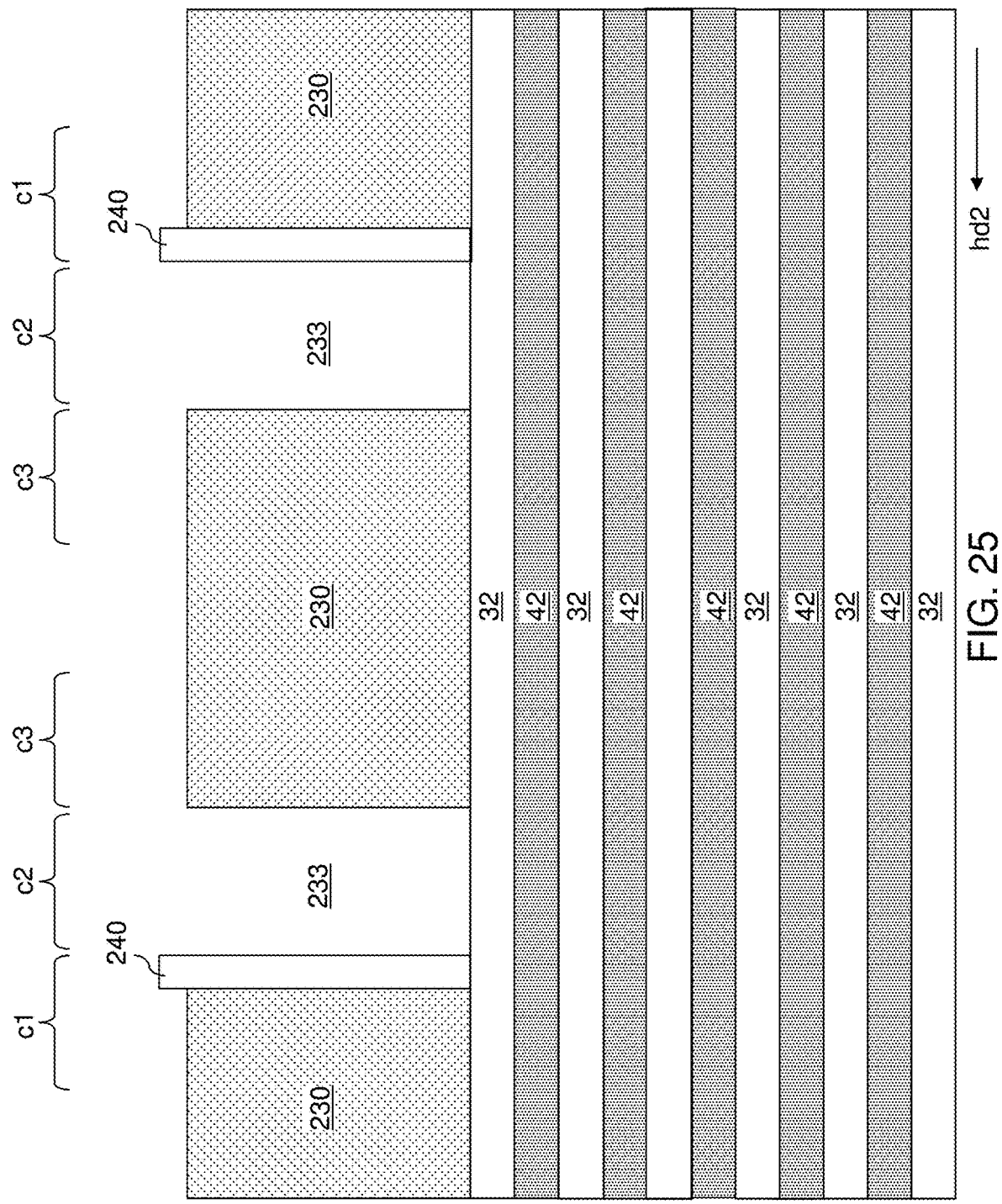
FIG. 25 is a vertical cross-sectional view of the exemplary structure after a first trimming etch process according to an embodiment of the present disclosure.

Referring to FIG. 25, a first trimming etch process can be performed to trim the patterned trimmable etch mask layer 230. The first trimming etch process can isotropically recess the material of the patterned trimmable etch mask layer 230 without recessing the dielectric rail structures 240. Remaining portions of the patterned trimmable etch mask layer 230 include first trimmable etch mask layer portions laterally abutted by a respective pair of dielectric rail structures 240 and second trimmable etch mask layer portions spaced from a respective neighboring pair of dielectric rail structures 240 by gaps 233.

Figure 26:
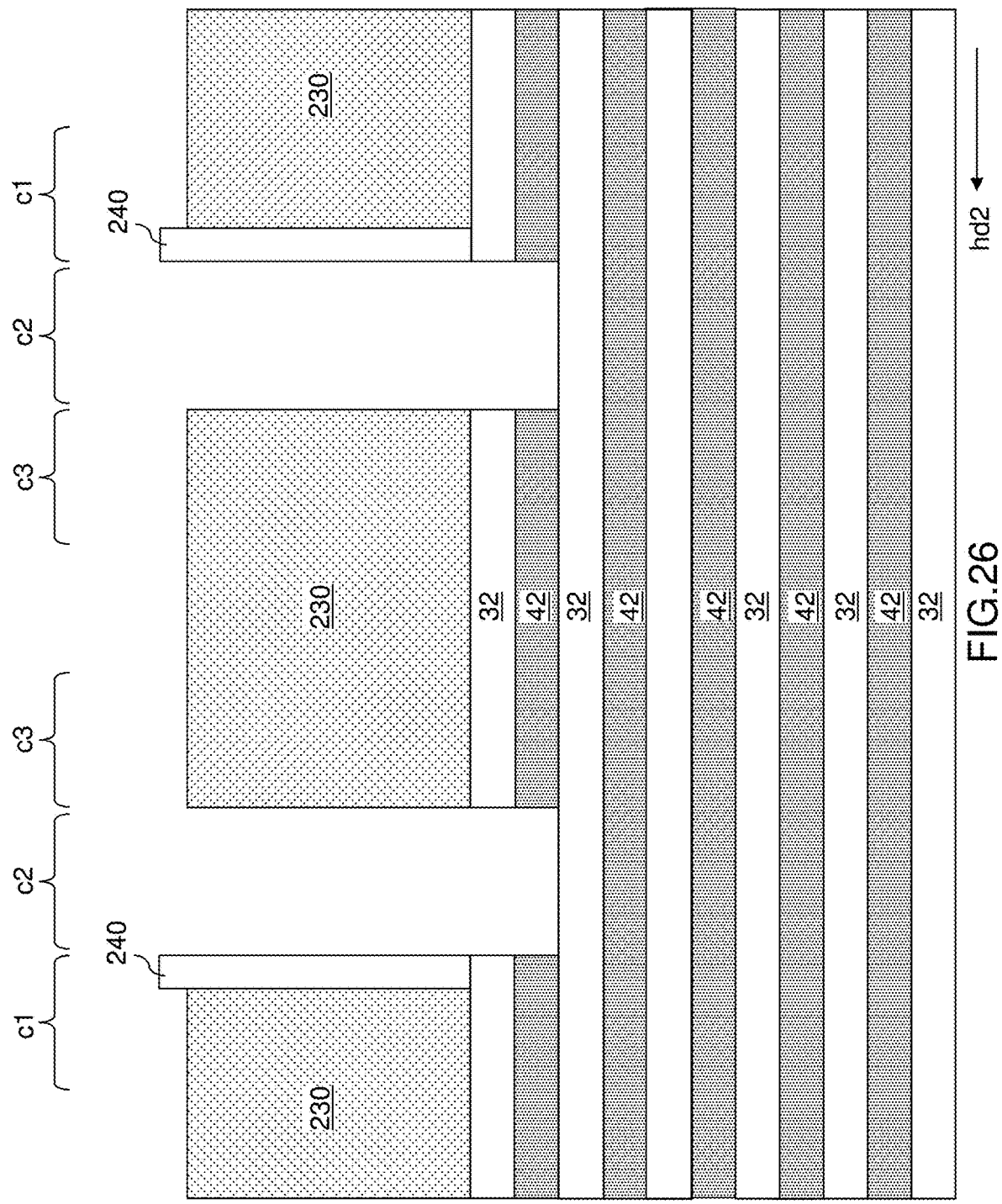
FIG. 26 is a vertical cross-sectional view of the exemplary structure after a first anisotropic etch process according to an embodiment of the present disclosure.

Referring to FIG. 26, a first anisotropic etch process is performed to etch physically exposed portion of the vertically alternating sequence (32, 42) through a topmost continuous insulating layer 32 and through a topmost continuous sacrificial material layer 42. The combination of the patterned trimmable etch mask layer 230 and the dielectric rail structures 240 is employed as an etch mask.

Figure 27:
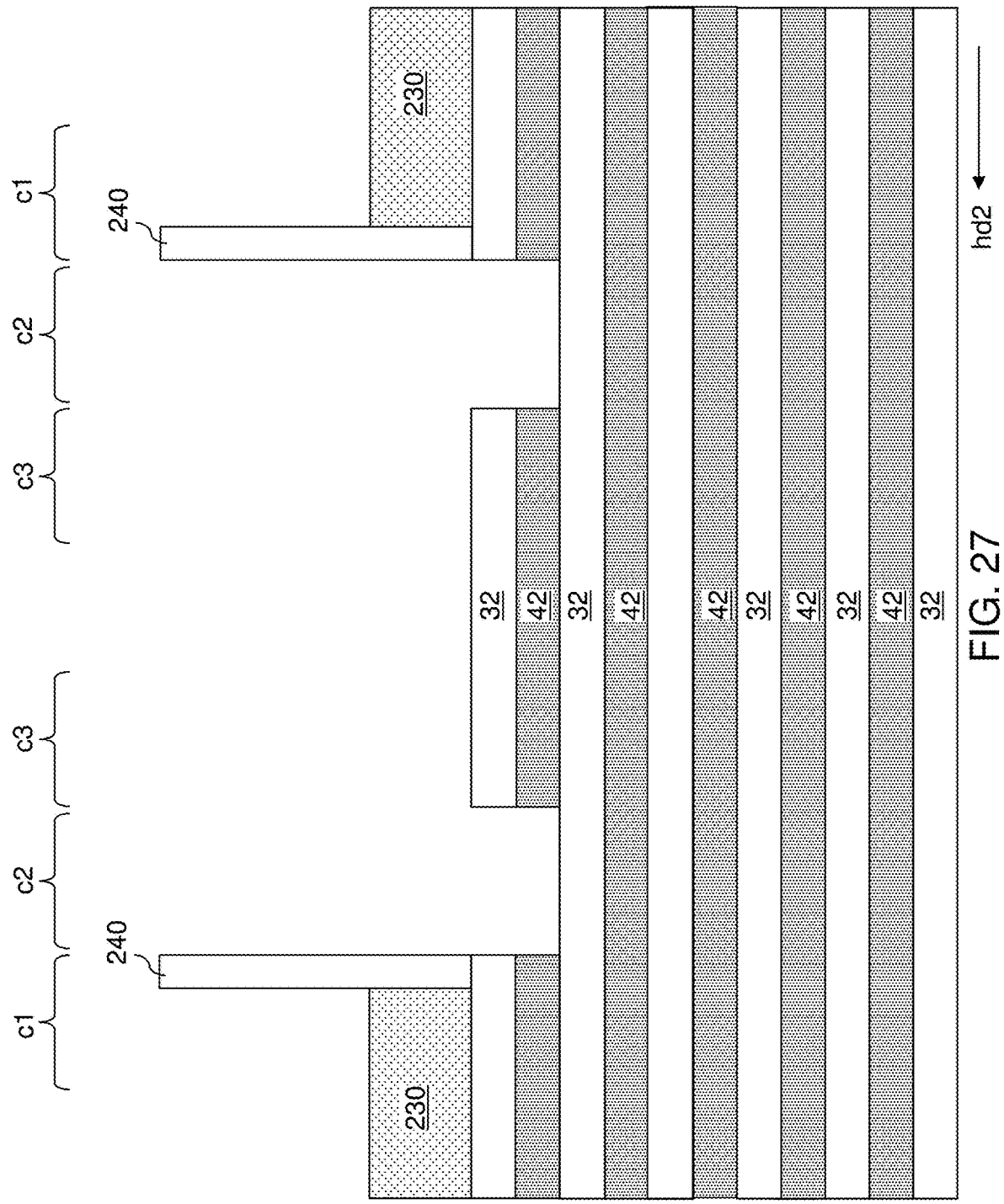
FIG. 27 is a vertical cross-sectional view of the exemplary structure after a second trimming etch process according to an embodiment of the present disclosure.

Referring to FIG. 27, a second trimming etch process is performed to trim the patterned trimmable etch mask layer 230, i.e., the first trimmable etch mask layer portions and the second trimmable etch mask layer portions. The first trimmable etch mask layer portions are vertically trimmed while the dielectric rail structures 240 prevent lateral trimming of the first trimmable etch mask layer portions, and the second trimmable etch mask layer portions are vertically and laterally trimmed. In one embodiment, the width of the second trimmable etch mask layer portions can be less than twice the trimming distance. In this case, the second trimmable etch mask layer portions can be removed by the second trimming etch process.

Figure 28:
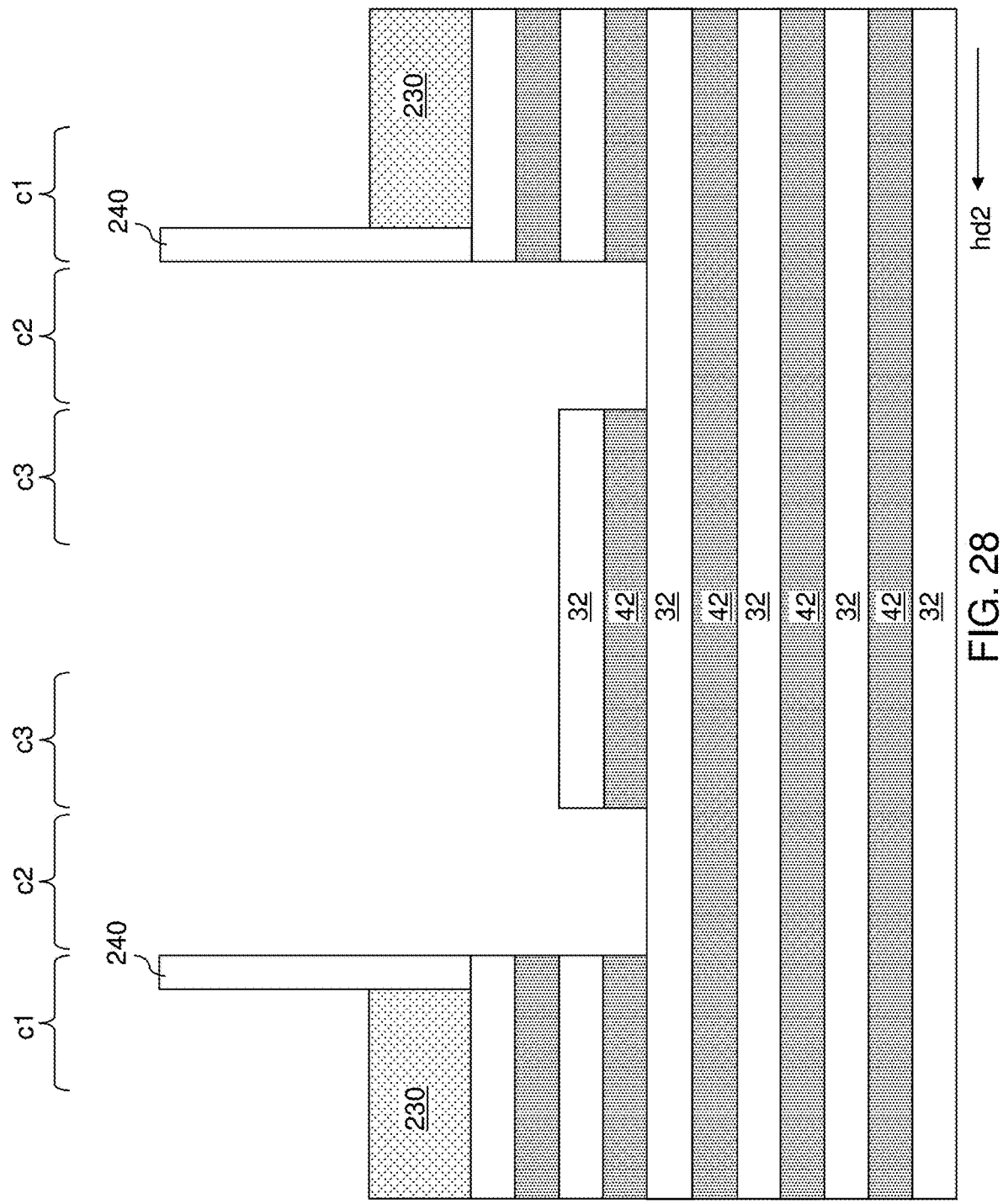
FIG. 28 is a vertical cross-sectional view of the exemplary structure after a second anisotropic etch process according to an embodiment of the present disclosure.

Referring to FIG. 28, a second anisotropic etch process can be performed to etch physically exposed portions of the vertically alternating sequence (32, 42) through a local topmost continuous insulating layer 32 and through a local topmost continuous sacrificial material layer 42. A top surface of a second topmost insulating layer 32 can be physically exposed within each third column stair region c3, and a top surface of a third topmost insulating layer 32 can be physically exposed within each second column stair region c2. The patterned trimmable etch mask layer 230 and the dielectric rail structures 240 may be removed, or may be employed as masking structures after further trimming.

Referring to FIG. 29, subsequently processing steps described above can be performed, and a retro-stepped dielectric material portion 65 can be formed.

Referring to FIG. 30, an alternative configuration of the exemplary structure is illustrated after formation of the retro-stepped dielectric material portion 65. If a second trimmable etch mask layer portion of the patterned trimmable etch mask layer 230 is present between a pair of column stair regions (c1-c3), such as between a pair of third column stair regions c3 after the processing steps of FIG. 27, then a portion of the topmost insulating layer 32 may be present between the pair of third column stair regions c3 at the processing steps of FIG. 29.

Referring to all drawings of the instant application and according to various embodiments of the present disclosure, a three-dimensional memory device comprises trenches 79 that laterally extend along a first horizontal direction hd1, alternating stacks (32, 46) of insulating layers 32 and electrically conductive layers 46 located over a substrate (9, 10) and laterally spaced among one another by the trenches 79, and groups of memory stack structures 55, wherein each group of memory stack structures 55 vertically extends through a respective one of the alternating stacks (32, 46) between a respective neighboring pair of trenches 79, and each of the memory stack structures 55 includes a memory film 50 and a vertical semiconductor channel 60 laterally surrounded by the memory film 50. Each alternating stack (32, 46) includes a group of N column stairs (c1 to c5), N being an integer greater than two. Each column stair within each group of N column stairs has a respective set of intra-column stepped surfaces that continuously extend from a bottommost layer to a topmost layer within each alternating stack (32, 42) with stepwise height increases along the first horizontal direction hd1. Column stairs within each group of N column stairs of a respective alternating stack (32, 42) are located between the respective neighboring pair of trenches 79 including a respective first trench and a respective second trench that border the respective alternating stack (32, 46). Top surfaces of each group of N column stairs have vertical cross-sectional profiles along vertical cross-sectional planes that are perpendicular to the first horizontal direction, each of the vertical cross-sectional profiles include both a stepwise decreasing profile and a stepwise increasing profile.

In one embodiment, each alternating stack (32, 46) comprises a NAND memory string 400 containing the group of N column stairs (c1 to c5) located on one side of a memory array region 100 containing one group of the groups of memory stack structures 55.

In one embodiment, the stepwise decreasing profile continuously extends from the respective first trench 79 to the stepwise increasing profile and the stepwise increasing profile continuously extends to the respective second trench 79 within the vertical cross-sectional profile for each of the vertical cross-sectional profiles.

In one embodiment, each vertical cross-sectional view that is perpendicular to the first horizontal direction hd1 and cuts through each column stair within a group of N column stairs includes both a respective stepwise decreasing profile and a respective stepwise increasing profile between the respective first trench 79 and the respective second trench 79. In one embodiment, each of vertical cross-sectional profiles has N different top surfaces of each alternating stack (32, 42).

In one embodiment, the N different top surfaces of each alternating stack can be top surfaces of N vertically consecutive insulating layers 32 within each alternating stack (32, 46); top surfaces of N vertically consecutive electrically conductive layers 46 within each alternating stack (32, 46), or top surfaces of N vertically consecutive backside blocking dielectric layers 44 enclosing N vertically consecutive electrically conductive layers 46. Each of the vertical cross-sectional profiles can have (N−1) inter-column vertical steps between neighboring column stairs for each alternating stack (32, 46).

In one embodiment, the (N−1) inter-column vertical steps comprises one single level inter-column vertical step at which a height of top surfaces of a respective alternating stack (32, 46) changes by a vertical distance between vertically neighboring top surfaces of insulating layers 32 of the respective alternating stack (32, 46); and (N−2) double level inter-column vertical steps at which a height of top surfaces of the respective alternating stack (32, 46) changes by twice the vertical distance between vertically neighboring top surfaces of the insulating layers 32 within the respective alternating stack (32, 36).

In one embodiment, N is three, one of the stepwise decreasing profile and the stepwise increasing profile has a single level inter-column vertical step, and another of the stepwise decreasing profile and the stepwise increasing profile has a double level inter-column vertical step.

In one embodiment, N is four, one of the stepwise decreasing profile and the stepwise increasing profile has a combination of a single level inter-column vertical step and a dual level inter-column vertical step, and another of the stepwise decreasing profile and the stepwise increasing profile has a double level inter-column vertical step.

In one embodiment, N is five, one of the stepwise decreasing profile and the stepwise increasing profile has a single level inter-column vertical step and a double level inter-column vertical step, and another of the stepwise decreasing profile and the stepwise increasing profile has two double level inter-column vertical steps.

In one embodiment, each set of intra-column stepped surfaces includes M intra-column stepped surfaces at which a height of top surfaces of a respective column stair changes by N times a vertical distance between vertically neighboring top surfaces of insulating layers of the respective column stair, wherein M is an integer greater than 2. In one embodiment, a total number of electrically conductive layers 46 within each alternating stack is in a range from M×N to (M+2)×N.

Retro-stepped dielectric material portions 65 can contact, and overlie, a respective group of N column stairs. The retro-stepped dielectric material portions 65 can have top surfaces within a same horizontal plane, and can be laterally bounded by a respective neighboring pair of trenches 79 among the trenches 79.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the at least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The monolithic three-dimensional memory device can comprise: a plurality of semiconductor channels (59, 60), wherein at least one end portion 60 of each of the plurality of semiconductor channels (59, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 60).

In another embodiment, a three-dimensional memory device includes an alternating stack of insulating layers 32 and electrically conductive layers (e.g., word line layers) 46 extending in a word line direction hd1. A memory array region 100 in the alternating stack contains memory stack structures 55 each comprising a memory film 50 and a vertical semiconductor channel 60. The alternating stack containing the memory array region 100 comprises a NAND memory string 400. A group of N column stairs (e.g., c1-c5) is located in the alternating stack (32, 46) and extends in the word line direction hd1 from one side of the memory array region. N is an integer greater than 2. Bit lines 98 electrically contact the vertical semiconductor channels 60 via the drain regions 63 and drain contact structure 88. The bit lines 98 extend in a bit line direction hd2 which is perpendicular to the word line direction hd1. Each column stair of the group of N column stairs has a respective step in a first vertical plane (e.g., plane C-C' shown in FIGS. 21B and 21C) which extends in the bit line direction hd2. The respective steps in the first vertical plane C-C' decrease and then increase from one end column stair c1 to another end column stair c5.

The group of N column stairs contains at least one middle column stair (e.g., c2, c3 and/or c4) located between the first end column stair c1 and the second end column stair c5. A lowest step in the first vertical plane C-C' is located in the at least one middle column stairs (e.g., c3) and is not located in the first or the second end column stairs (c1, c5).

In one embodiment, the column stairs are arranged in the "tick-tock" configuration in which a height of each step in the first vertical plane C-C' decreases by one unit from the first end column stair c1 to a second end column stair c5, and decreases by one unit from the second end column stair c5 to the at least one middle column stair (e.g., c2).

In one embodiment, N is greater than 3, and the group of N column stairs contains a plurality of middle column stairs comprising first, second and third middle column stairs (c2, c3, c4). The height of each step in the first vertical plane C-C' decreases by one unit from the second end column stair c5 to the first middle column stair c2 located closest to the first end column stair c1. The height of each step in first vertical plane C-C' decreases by one unit from the first middle column stair c2 to the second middle column stair c4 located adjacent to the second end column stair c5, and decreases by one unit from the second middle column stair c4 to the third middle column stair c3 located adjacent to the first middle column stair c2. In one embodiment, the one unit comprises a height of a pair of adjacent insulating layer 32 and word line layer 46.

In one embodiment, steps in each column stair step downward from the memory array region 100 to a peripheral device region 200 through a contact region 300. Word line contact via structures 86 contact the word line layers 46 located in the steps in the contact region 300.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
trenches that extend in a first horizontal direction;
alternating stacks of insulating layers and electrically conductive layers located over a substrate, wherein the alternating stacks are laterally spaced among one another by the trenches; and
groups of memory stack structures, wherein each group of memory stack structures vertically extends through a respective one of the alternating stacks between a respective neighboring pair of trenches, and each of the memory stack structures includes a memory film and a vertical semiconductor channel laterally surrounded by the memory film,
wherein:
each alternating stack includes a group of N column stairs, N being an integer greater than two;
each column stair within each group of N column stairs has a respective set of intra-column stepped surfaces that continuously extend from a bottommost layer to a topmost layer within each alternating stack with stepwise height increases along the first horizontal direction;
column stairs within each group of N column stairs of a respective alternating stack are located between the respective neighboring pair of trenches including a respective first trench and a respective second trench that border the respective alternating stack; and
top surfaces of each group of N column stairs have vertical cross-sectional profiles along vertical cross-sectional planes that are perpendicular to the first horizontal direction, each of the vertical cross-sectional profiles include both a stepwise decreasing profile and a stepwise increasing profile.

2. The three-dimensional memory device of claim 1, wherein each alternating stack comprises a NAND memory string containing the group of N column stairs located on one side of a memory array region containing one group of the groups of memory stack structures.

3. The three-dimensional memory device of claim 1, wherein the stepwise decreasing profile continuously extends from the respective first trench to the stepwise increasing profile and the stepwise increasing profile continuously extends to the respective second trench within the vertical cross-sectional profile for each of the vertical cross-sectional profiles.

4. The three-dimensional memory device of claim 1, wherein:
each of vertical cross-sectional profiles has N different top surfaces of each alternating stack; and
the N different top surfaces of each alternating stack comprise one of:
top surfaces of N vertically consecutive insulating layers within each alternating stack;
top surfaces of N vertically consecutive electrically conductive layers within each alternating stack; or
top surfaces of N vertically consecutive backside blocking dielectric layers enclosing N vertically consecutive electrically conductive layers.

5. The three-dimensional memory device of claim 1, wherein:
each vertical cross-sectional view that is perpendicular to the first horizontal direction and cuts through each column stair within a group of N column stairs includes both a respective stepwise decreasing profile and a respective stepwise increasing profile between the respective first trench and the respective second trench; and
each of the vertical cross-sectional profiles has (N−1) inter-column vertical steps between neighboring column stairs for each alternating stack.

6. The three-dimensional memory device of claim 5, wherein the (N−1) inter-column vertical steps comprises:
one single level inter-column vertical step at which a height of top surfaces of a respective alternating stack changes by a vertical distance between vertically neighboring top surfaces of insulating layers of the respective alternating stack; and
(N−2) double level inter-column vertical steps at which a height of top surfaces of the respective alternating stack changes by twice the vertical distance between vertically neighboring top surfaces of the insulating layers within the respective alternating stack.

7. The three-dimensional memory device of claim 1, wherein:
each set of intra-column stepped surfaces includes M intra-column stepped surfaces at which a height of top surfaces of a respective column stair changes by N times a vertical distance between vertically neighboring top surfaces of insulating layers of the respective column stair, wherein M is an integer greater than 2; and
a total number of electrically conductive layers within each alternating stack is in a range from M×N to (M+2)×N.

8. The three-dimensional memory device of claim 1, further comprising retro-stepped dielectric material portions contacting, and overlying, a respective group of N column stairs, wherein the retro-stepped dielectric material portions have top surfaces within a same horizontal plane, and is laterally bounded by a respective neighboring pair of trenches among the trenches.

9. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the silicon substrate contains an integrated circuit comprising a driver circuit for the memory device located thereon; and
the monolithic three-dimensional NAND memory device comprises:
a plurality of vertical semiconductor channels located within a respective memory stack structure, and
a three-dimensional array of charge storage elements, each charge storage element located adjacent to a respective one of the plurality of vertical semiconductor channels.

10. A three-dimensional memory device, comprising:
an alternating stack of insulating layers and word line layers extending in a word line direction;
a memory array region in the alternating stack containing memory stack structures, wherein each of the memory stack structures comprises a memory film and a vertical semiconductor channel;
a group of N column stairs located in the alternating stack and extending in the word line direction from one side of the memory array region, wherein N is an integer greater than 2; and
bit lines electrically contacting the vertical semiconductor channels and extending in a bit line direction which is perpendicular to the word line direction,
wherein:
the alternating stack containing the memory array region comprises a NAND memory string;
each column stair of the group of N column stairs has a respective step in a first vertical plane which extends in the bit line direction; and
the respective steps in the first vertical plane decrease and then increase from a first end column stair to a second end column stair.

11. The three-dimensional memory device of claim 10, wherein:
the group of N column stairs contains at least one middle column stair located between the first end column stair and the second end column stair; and
a lowest step in the first vertical plane is located in the at least one middle column stairs and is not located in the first or the second end column stairs.

12. The three-dimensional memory device of claim 11, wherein a height of each step in the first vertical plane decreases by one unit from the first end column stair to the second end column stair, and decreases by one unit from the second end column stair to the at least one middle column stair.

13. The three-dimensional memory device of claim 12, wherein:
the group of N column stairs contains a plurality of the middle column stairs comprising first, second and third middle column stairs;
the height of each step in the first vertical plane decreases by one unit from the second end column stair to the first middle column stair located closest to the first end column stair;
the height of each step in first vertical plane decreases by one unit from the first middle column stair to the second middle column stair located adjacent to the second end column stair, and decreases by one unit from the second middle column stair to the third middle column stair located adjacent to the first middle column stair; and
the one unit comprises a height of a pair of adjacent insulating layer and word line layer.

14. The three-dimensional memory device of claim 11, wherein:
steps in each column stair step downward from the memory array region to a peripheral device region through a contact region; and
word line contact via structures contact the word line layers located in the steps in the contact region.

* * * * *